(12) United States Patent
Shimizu et al.

(10) Patent No.: US 8,294,040 B2
(45) Date of Patent: Oct. 23, 2012

(54) POROUS FILM AND MULTILAYER ASSEMBLY USING THE SAME

(75) Inventors: Kiyoshi Shimizu, Himeji (JP); Yo Yamato, Himeji (JP)

(73) Assignee: Daicel Chemical Industries, Ltd., Osaka-shi (JP)

( * ) Notice: Subject to any disclaimer, the term of this patent is extended or adjusted under 35 U.S.C. 154(b) by 971 days.

(21) Appl. No.: 12/224,180

(22) PCT Filed: Feb. 16, 2007

(86) PCT No.: PCT/JP2007/052818
§ 371 (c)(1),
(2), (4) Date: Aug. 20, 2008

(87) PCT Pub. No.: WO2007/097249
PCT Pub. Date: Aug. 30, 2007

(65) Prior Publication Data
US 2009/0008142 A1 Jan. 8, 2009

(30) Foreign Application Priority Data

| Feb. 20, 2006 | (JP) | 2006-042862 |
|---|---|---|
| Feb. 20, 2006 | (JP) | 2006-042863 |
| Aug. 31, 2006 | (JP) | 2006-234779 |
| Sep. 4, 2006 | (JP) | 2006-238942 |
| Sep. 4, 2006 | (JP) | 2006-238943 |
| Sep. 11, 2006 | (JP) | 2006-246165 |
| Oct. 6, 2006 | (JP) | 2006-275246 |
| Oct. 6, 2006 | (JP) | 2006-275247 |
| Oct. 19, 2006 | (JP) | 2006-285562 |
| Oct. 26, 2006 | (JP) | 2006-291560 |
| Jan. 18, 2007 | (JP) | 2007-009539 |

(51) Int. Cl.
*H05K 1/11* (2006.01)

(52) U.S. Cl. .................................................. 174/261
(58) Field of Classification Search .............. 174/255, 174/256, 261
See application file for complete search history.

(56) References Cited

U.S. PATENT DOCUMENTS 6,177,181 B1 1/2001 Hamada et al.
(Continued)

FOREIGN PATENT DOCUMENTS

EP 0 485 699 A2 9/1992
(Continued)

OTHER PUBLICATIONS

EPO communication dated Nov. 26, 2010 including Supplemental European Search report issued in counterpart European patent application No. 07714348.5.

(Continued)

*Primary Examiner* — Chau Nguyen
(74) *Attorney, Agent, or Firm* — Birch, Stewart, Kolasch & Birch, LLP

(57) ABSTRACT

[Object] To provide a multilayer assembly that excels in pore properties, is flexible, and is satisfactorily handled and processed; and a method of producing the multilayer assembly. [Solving Means] A multilayer assembly includes a base and, arranged on at least one side thereof, a porous layer and has a large number of continuous micropores with an average pore diameter of 0.01 to 10 μm. The multilayer assembly suffers from no interfacial delamination between the base and the porous layer when examined in a tape peeling test according to the following procedure:

Tape Peeling Test

A 24-mm wide masking tape [Film Masking Tape No. 603 (#25)] supplied by Teraoka Seisakusho Co., Ltd. is applied to a surface of the porous layer of the multilayer assembly and press-bonded thereto with a roller having a diameter of 30 mm and a load of 200 gf to give a sample; and the sample is subjected to a T-peel test with a tensile tester at a peel rate of 50 mm/min.

10 Claims, 8 Drawing Sheets

U.S. PATENT DOCUMENTS

| | | |
|---|---|---|
| 2003/0213614 A1 | 11/2003 | Furusawa et al. |
| 2004/0005443 A1* | 1/2004 | Suzuki et al. ............... 428/209 |
| 2005/0189628 A1 | 9/2005 | Tamemasa et al. |
| 2006/0113284 A1 | 6/2006 | Umetsu |
| 2006/0121267 A1 | 6/2006 | Tsuyumoto et al. |
| 2007/0036959 A1 | 2/2007 | Yamato et al. |

FOREIGN PATENT DOCUMENTS

| | | |
|---|---|---|
| EP | 0 889 080 A1 | 1/1999 |
| EP | 1 085 352 A2 | 3/2001 |
| EP | 1 583 108 A1 | 10/2005 |
| JP | 61-048440 B2 | 10/1986 |
| JP | 5-085815 A | 4/1993 |
| JP | 6-157807 A | 6/1994 |
| JP | 10-324758 A | 12/1998 |
| JP | 2000-143848 A | 5/2000 |
| JP | 2000-158798 A | 6/2000 |
| JP | 2001-298253 A | 10/2001 |
| JP | 2002-120247 A | 4/2002 |
| JP | 2002-201304 A | 7/2002 |
| JP | 2002-355938 A | 12/2002 |
| JP | 2003-201364 A | 7/2003 |
| JP | 2003-243799 A | 8/2003 |
| JP | 2004-063575 A | 2/2004 |
| JP | 2004-175104 A | 6/2004 |
| JP | 2005-116660 A | 4/2005 |
| JP | 2005-162885 A | 6/2005 |
| JP | 2005-281668 A | 10/2005 |
| JP | 2006-135090 A | 5/2006 |
| JP | 2006-160795 A | 6/2006 |
| WO | WO-98-25997 A1 | 6/1998 |
| WO | WO-2005/030849 A1 | 4/2005 |
| WO | WO 2005/087979 A2 | 5/2005 |

OTHER PUBLICATIONS

Notification dated Sep. 26, 2011 which issued in corresponding Japanese Application No. 2008-501688.

EPO communication dated Dec. 19, 2011 including the partial European Search Report for counterpart European patent application No. 11005266.9.

* cited by examiner

[Fig. 1]
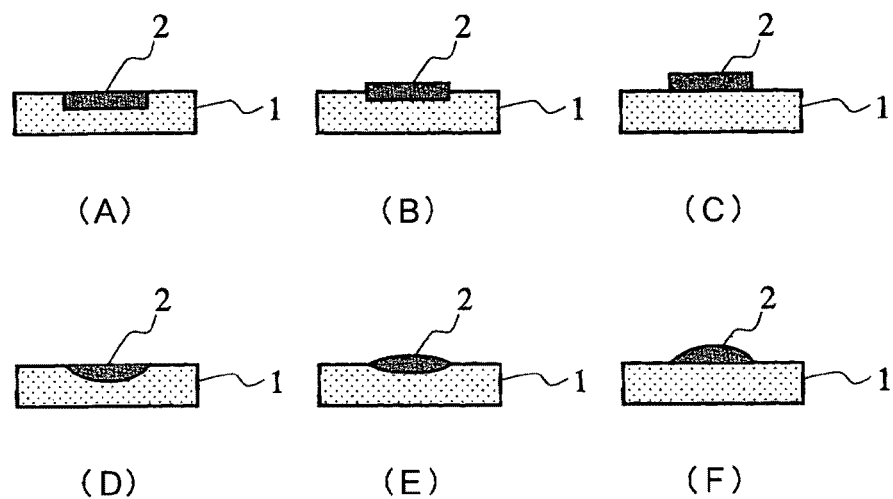
(A)  (B)  (C)
(D)  (E)  (F)
[Fig. 2]
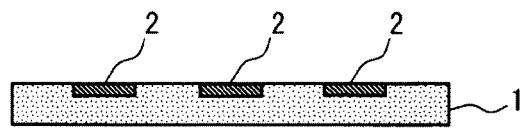
[Fig. 3]
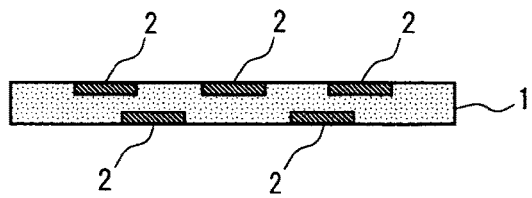
[Fig. 4]
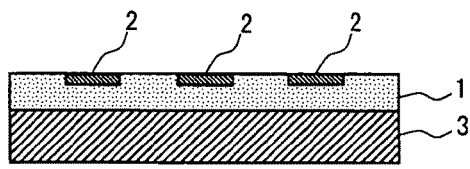
[Fig. 5]
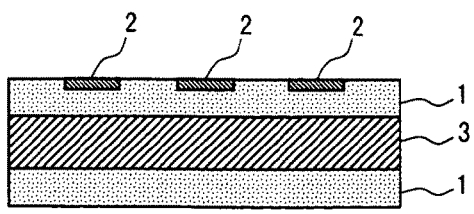

[Fig. 6]
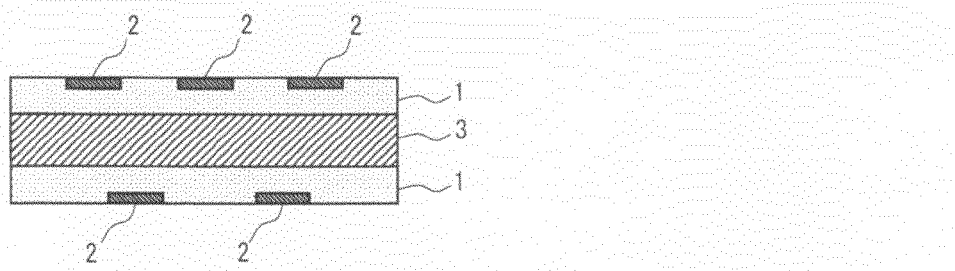
[Fig. 7]
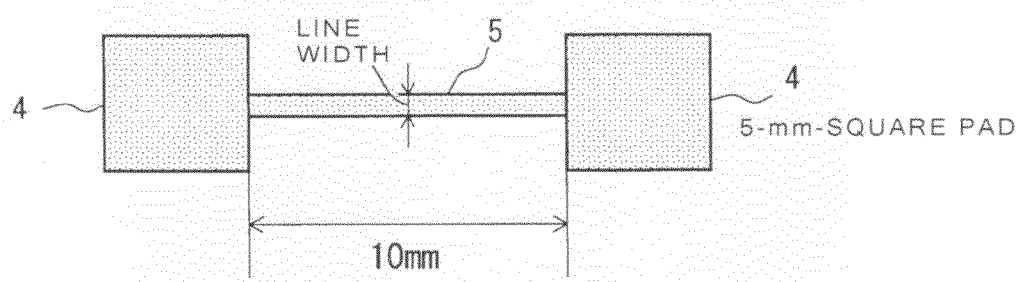
[Fig. 8]
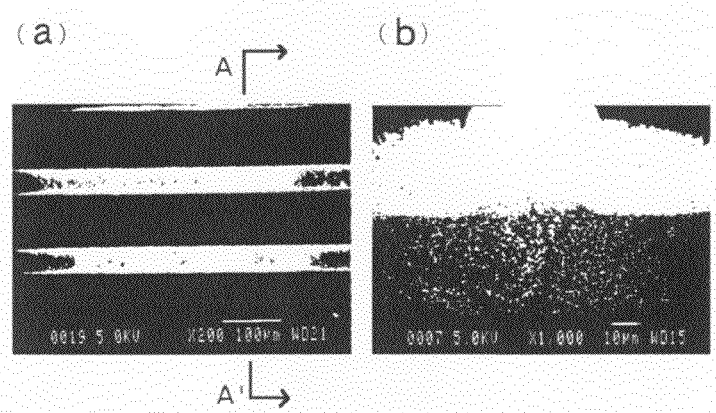
[Fig. 9]
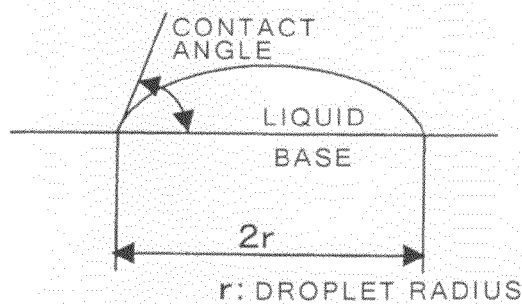

[Fig. 10]
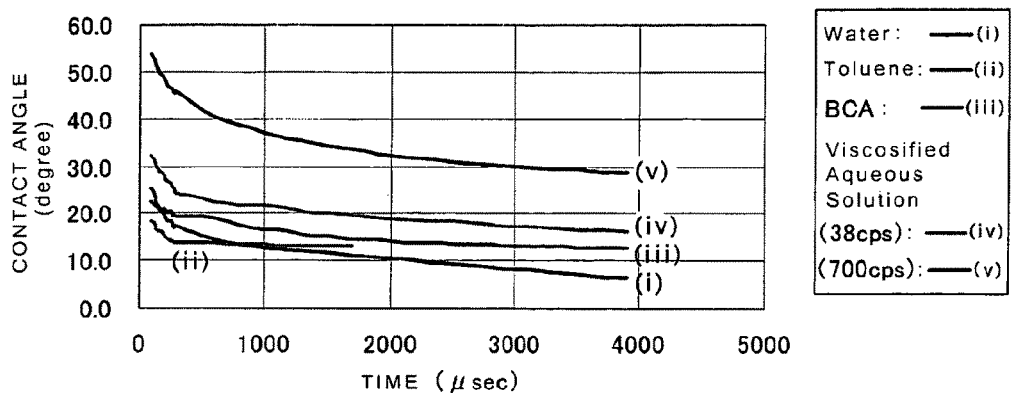
[Fig. 11]
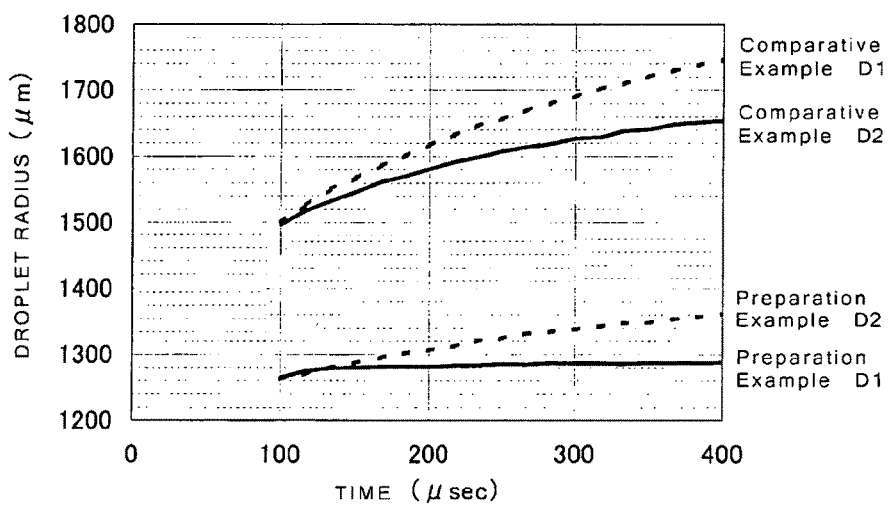
[Fig. 12]
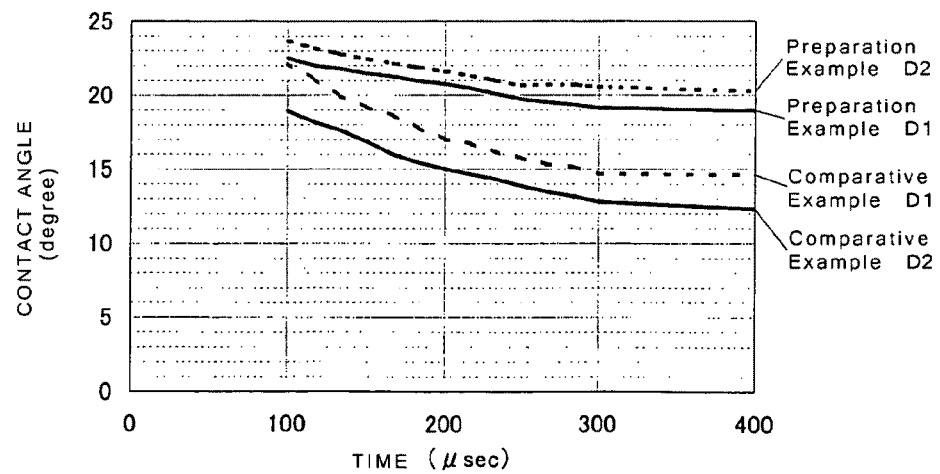

[Fig. 13]
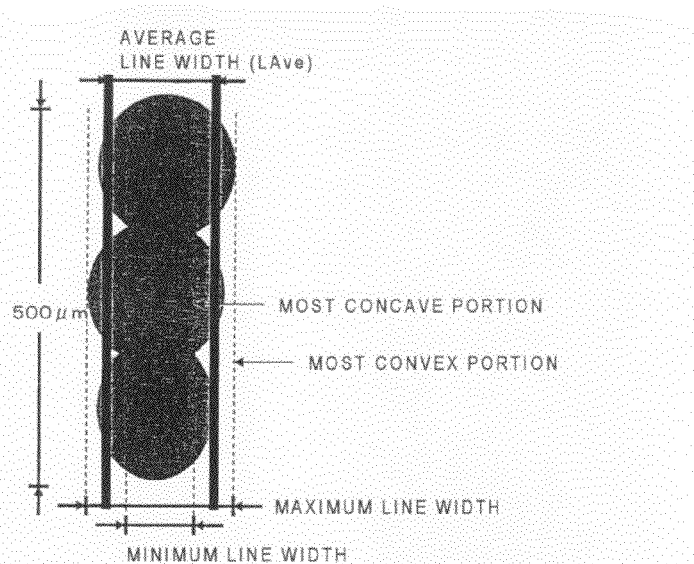
[Fig. 14]
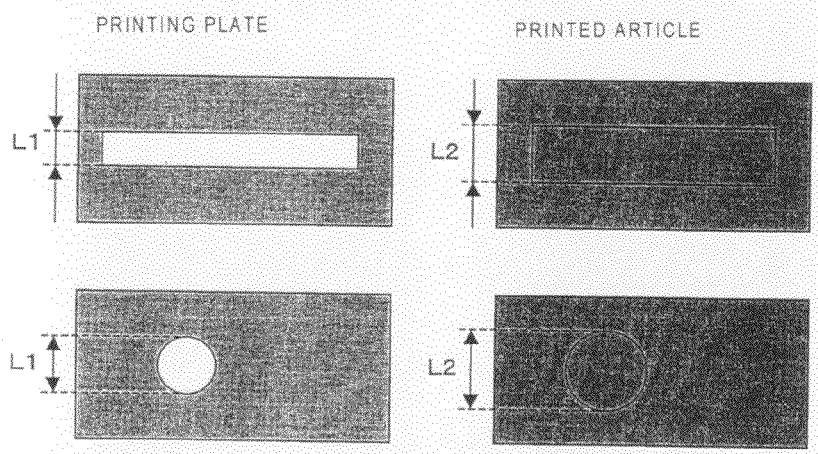
[Fig. 15]

[Fig. 16]
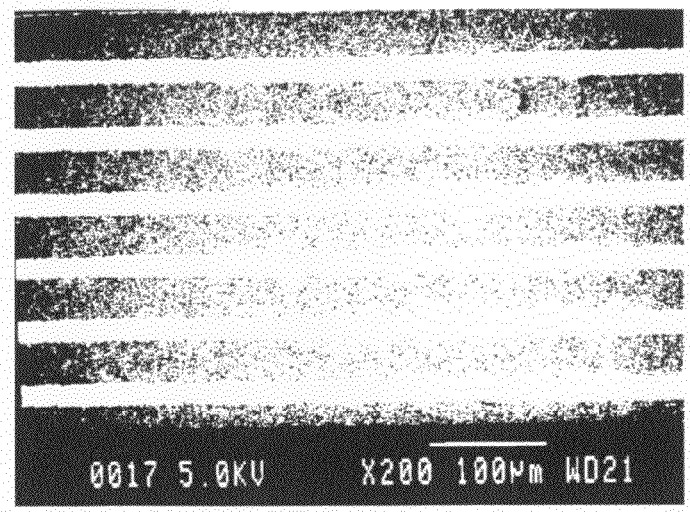
[Fig. 17]
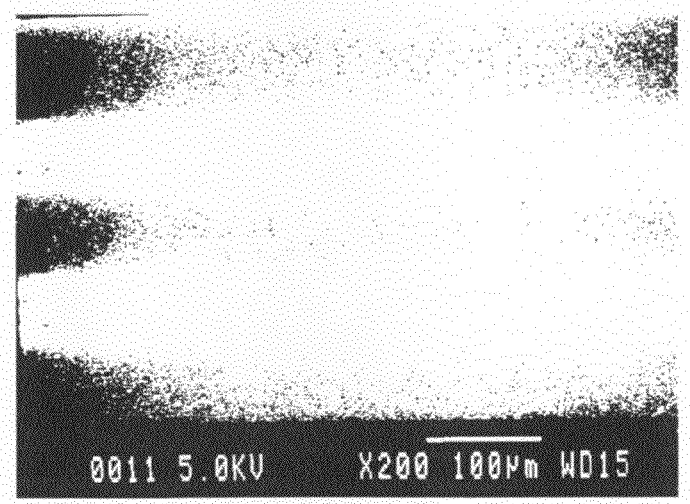
[Fig. 18]
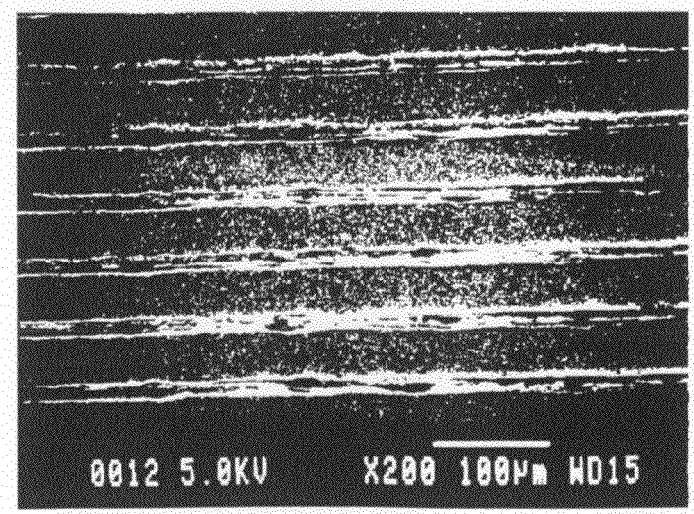

[Fig. 19]
[Fig. 20]
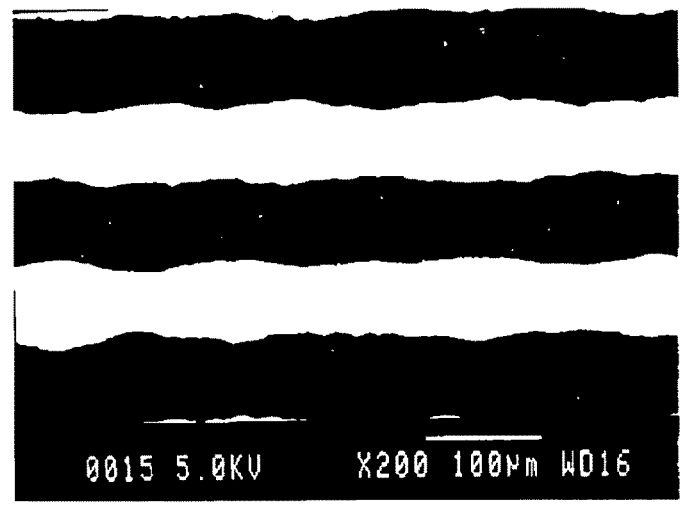
[Fig. 21]

[Fig. 22]
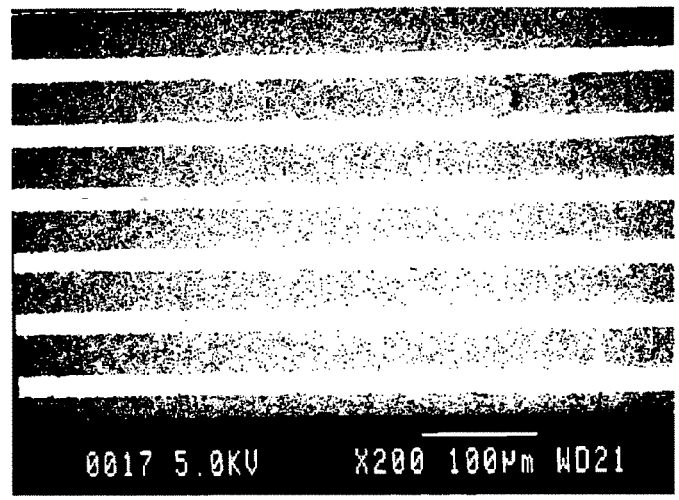
[Fig. 23]
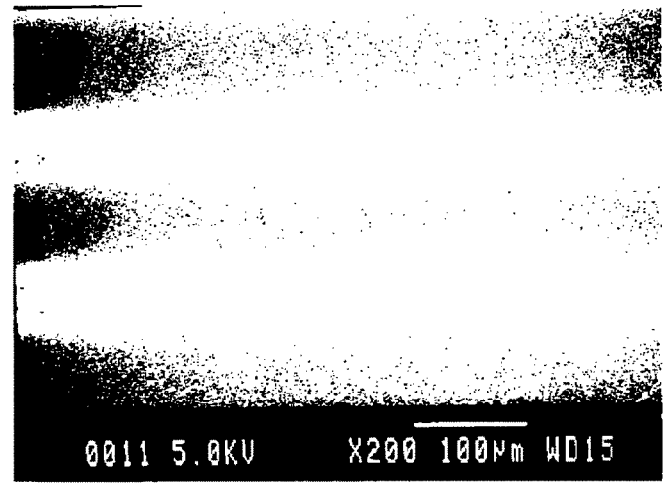
[Fig. 24]
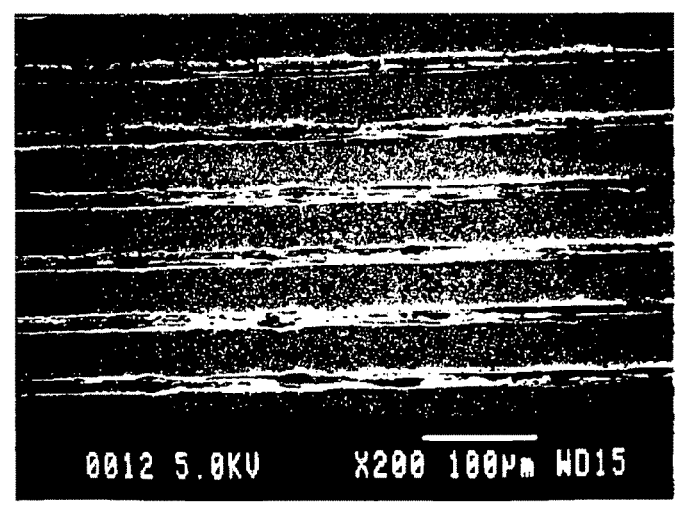

[Fig. 25]
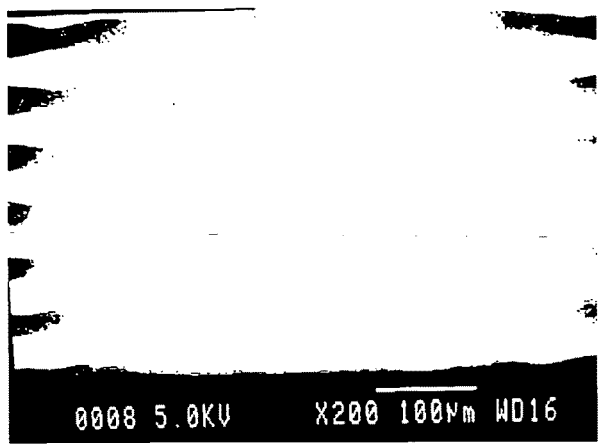
[Fig. 26]
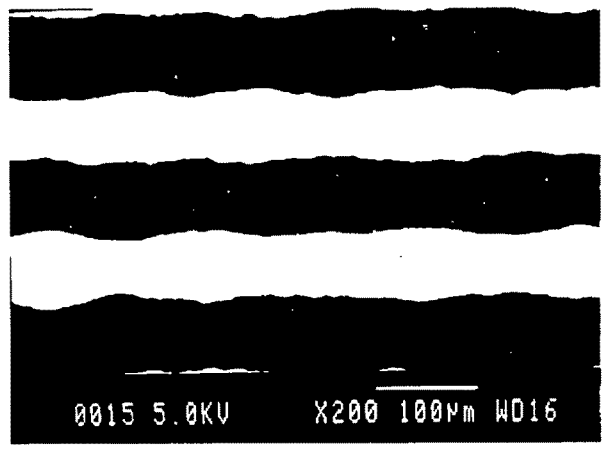
[Fig. 27]
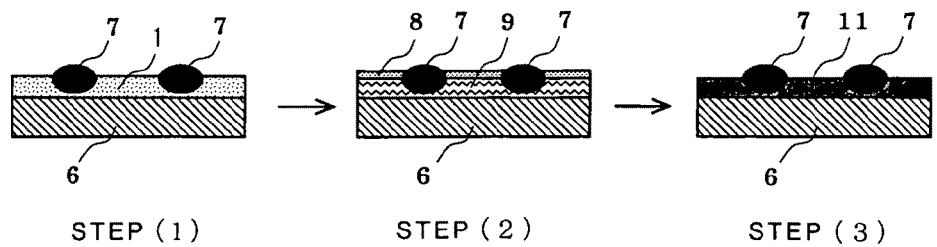
STEP (1)   STEP (2)   STEP (3)
[Fig. 28]
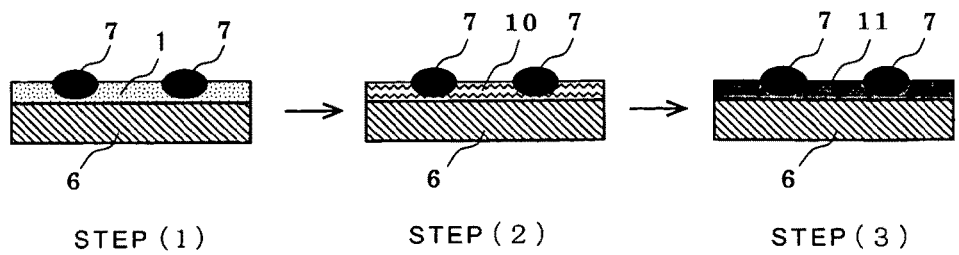
STEP (1)   STEP (2)   STEP (3)

POROUS FILM AND MULTILAYER ASSEMBLY USING THE SAME

TECHNICAL FIELD

The present invention relates to multilayer assemblies each including a base and a porous layer. The porous layer is arranged on at least one side of the base, and has a number of continuous micropores. The present invention further relates to production methods of the multilayer assemblies; composite materials using these multilayer assemblies; and production methods of the composite materials. By directly utilizing properties of pores in their porous layer or by filling the pores with a functional material and utilizing properties of the functional material, the multilayer assemblies are usable as a wide variety of base materials (base materials) typically for circuit substrates (circuit boards); radiators (heat sinks and radiator plates); electromagnetic regulators such as electromagnetic shielding materials and electromagnetic absorbing materials; battery separators; capacitors such as paper capacitors, plastic film capacitors, ceramic capacitors, mica capacitors, and electrolytic capacitors; low dielectric constant materials; separators; cushioning materials; ink receiving sheets; test papers (indicator papers); insulating materials (electrical insulating materials); thermal insulating materials; cell-culture base materials; and catalyst bases (catalyst carriers).

The present invention also relates to circuit boards (wiring boards or wiring substrates) used typically in electric, electronic, and communication fields; and production methods of the circuit boards. More specifically, it relates to circuit boards whose interconnections have excellent adhesion and can be depicted satisfactorily; production methods of the circuit boards; methods of producing printed patters useful for the production of printed articles such as printed circuit boards for use in the above fields; and printed articles produced by the methods.

BACKGROUND ART

As exemplary assemblies composed of a base and a porous film, Japanese Unexamined Patent Application Publication (JP-A) No. 2000-143848 and JP-A No. 2000-158798 disclose ink receiving sheets prepared by forming a coat containing a resin, and good and poor solvents for the resin, subjecting the coat to dry phase inversion to form a porous layer. The dry layer transition technique induces microphase separation by evaporating the solvents from the coat, and the resin (polymeric compound) constituting the porous layer is limited to those soluble in low-boiling-point good solvents. Accordingly, it is difficult to use, in this technique, polymeric compounds that have large molecular weights and are inherently sparingly soluble in such solvents.

In addition, this technique preferably employs a low-viscosity coating composition so as to dissolve the polymeric compound satisfactorily and to evaporate the solvent rapidly after the formation of the coat. This, however, results in disadvantages. Typically, it is difficult to give a coat with a sufficient thickness; of components of the coat, a component that has not been removed upon evaporation of the solvents remains in the resulting porous layer, and this impedes the use of nonvolatile additives; the structure of the porous layer is significantly affected by heating conditions and environmental conditions during production processes, and this impedes stable production and tends to result in variation in properties of the film (film quality), such as pore diameter, rate of open area, porosity, and thickness.

On the other hand, PCT International Publication Number WO 98/25997 discloses an assembly including a base and a porous layer and prepared by another production technique than above. This production technique produces the assembly by forming a coat on a base by casting (flow casting), and drying the coat through wet phase inversion at high humidity in two steps. This technique helps to stabilize the environmental conditions during production, but it fails to solve the above problems related to the dry phase inversion technique, because even the wet phase inversion fundamentally employs the procedure of drying by heating.

Recently, with increasing packaging densities and decreasing sizes of electric/electronic components such as semiconductor devices, there have been made demands to give finer patterns and finer pitches of conductive interconnections so as to provide higher-density and highly functional packaging of printed circuit boards.

According to a subtractive technique, a representative process for producing printed circuit boards, a circuit board is produced generally by depositing copper foil on an insulator, applying a resist to the copper foil to give a resist film, exposing the resist film to light through a mask for depicting, carrying out developing and then etching, and stripping the resist film (see Patent Documents 1 and 2). In this technique, a side of the copper foil to be in contact with the insulator is generally subjected to surface roughening, so as to increase the adhesion between the insulator and the copper foil. However, when pitches between conductive interconnections are made finer, the surface roughening of the copper foil causes cutting or peeling (delamination) of interconnections upon etching, due to roughness of the copper foil. In contrast, when copper foil without surface roughening is used, etching is conducted satisfactorily, but the adhesion between the insulator and the copper foil is insufficient, and thereby the overall interconnections are likely to delaminate.

When the copper foil has a large thickness, a center part of the copper foil in a thickness direction is overetched in a direction perpendicular to the thickness direction, and the formed interconnections fail to have rectangular profiles. This will cause cutting or delamination of the interconnections when the pitches between interconnections are made finer. Accordingly, copper foil should have a smaller thickness so as to make pitches finer, but it is difficult to produce and handle such thin copper foil. It is therefore believed that the current subtractive technique has limits on reduction of pitches.

In common production methods of circuit boards, interconnections have been formed by printing a paste onto a resinous film such as a PET (poly(ethylene terephthalate)) film or PI (polyimide) film. When fine interconnections are formed, however, this technique causes, for example, linkage between interconnections due typically to print feathering.

JP-A No. Hei 05-85815 discloses a method of producing a glass ceramic base by kneading an alumina powder, a quartz glass (silica glass) powder, and a calcium borosilicate glass powder to give a green sheet, printing a conductive paste onto the green sheet, and firing the resulting article. Although the green sheet of the powder mixture excels in printability of fine interconnections, this method requires a firing process at temperatures near to 1000° C., resulting in increased cost. In addition, the product lacks flexibility and is brittle.

JP-A No. 2006-135090 discloses a method of producing fine interconnections by applying a laser beam to a surface of a base to form a trench pattern, and placing an ink containing a conductive material into the trench pattern. This method, however, requires a laser beam irradiation process, and thereby suffer from low productivity and increased cost. In addition, it requires a sophisticated technique for placing the ink into the trench pattern and is not suitable for mass production.

JP-A No. 2001-298253 discloses a technique of forming a primary layer for printing, by forming a film on copper foil, which film is made of a porous material containing an amine compound including a group of particles having specific particle diameters, in order to carry out fine printing. According to this technique, however, the resulting primary layer has low strength and is not usable as an interconnection material, because the layer is formed by the application of particles.

[Patent Document 1] JP-A No. 2000-143848
[Patent Document 2] JP-A No. 2000-158798
[Patent Document 3] PCT International Publication Number WO 98/25997
[Patent Document 4] JP-A No. 2003-243799
[Patent Document 5] JP-A No. 2004-63575
[Patent Document 6] JP-A No. Hei 05-85815
[Patent Document 7] JP-A No. 2006-135090
[Patent Document 8] JP-A No. 2001-298253

DISCLOSURE OF INVENTION

Problems to be Solved by the Invention

Accordingly, an object of the present invention is to provide a multilayer assembly that excels in pore properties, is flexible, and is satisfactorily handled and processed; and a method of producing the multilayer assembly.

Another object of the present invention is to provide a composite material using the multilayer assembly having such characteristic properties; and a method of producing the composite material.

Yet another object of the present invention is to provide a circuit board whose interconnections have excellent adhesion and can be depicted satisfactorily.

Still another object of the present invention is to provide a method of easily and efficiently producing a circuit board whose interconnections have excellent adhesion and can be depicted satisfactorily.

Another object of the present invention is to provide a printed article that excels in fine-line depictability.

Yet another object of the present invention is to provide a printed article that can be produced easily and inexpensively with good productivity, is highly strong and resistant to breakage, and excels in fine-line depictability.

Still another object of the present invention is to provide a printed article that excels in printing/depicting reproducibility in addition to the above characteristic properties.

Another object of the present invention is to provide a method of easily producing a printed pattern with good productivity, which printed pattern excels in fine-line depictability, has excellent strength of its printed portion and excellent adhesion of its print, and is resistant to breakage; and a printed article produced by the method.

Means for Solving the Problems

After intensive investigations to achieve the above objects, the present inventors obtained the following findings. The present invention has been made based on these findings. Specifically:

(1) Simultaneously carrying out film-formation and lamination (deposition) of a porous film on a surface of a base gives a multilayer assembly that has excellent pore properties, is flexible, has a sufficient strength, and is thereby satisfactorily handled and processed;

(2) particularly, simultaneously carrying out film-formation and lamination of a porous layer on a surface of a base having a large number of through holes gives a multilayer assembly that has excellent pore properties, is flexible, has a sufficient strength, and is thereby satisfactorily handled and processed, and simultaneously carrying out film-formation and lamination of a porous layer on a surface of a metallic foil base gives a multilayer assembly that has excellent pore properties, is flexible, has a sufficient strength, and is thereby satisfactorily handled and processed;

(3) a porous film layer having uniform pores with a very small average pore diameter are obtained by casting a solution of a resin in a polar solvent onto a base to give a cast film, holding the cast film under predetermined conditions, and immersing the resulting film in a coagulation bath; formation of conductive interconnections on a surface of this porous film layer by printing gives conductive interconnections that have very small widths and pitches and excel in adhesion; and printing a print onto a surface of the porous film layer easily gives a printed article that excels in fine-line depictability and printing/depicting reproducibility and is satisfactorily strong and resistant to breakage; and (4) a printed pattern that excels in fine-line depictability and has high strength of a printed portion and a high adhesion of a print is produced easily with good productivity by printing onto a porous film layer, melting (or dissolving) the printed porous film layer by the action of a solvent with or without heating, and removing the solvent to form a densified layer.

Specifically, the present invention provides a multilayer assembly having a base and a porous layer arranged on at least one side of the base. The porous layer has a large number of continuous micropores with an average pore diameter of 0.01 to 10 μm. The multilayer assembly suffers from no interfacial delamination between the base and the porous layer when the multilayer assembly is examined in a tape peeling test according to the following procedure:

Tape Peeling Test

A 24-mm wide masking tape [Film Masking Tape No. 603 (#25)] supplied by Teraoka Seisakusho Co., Ltd. is applied to a surface of the porous layer and press-bonded to the porous layer with a roller having a diameter of 30 mm and a load of 200 gf to give a sample; and the sample is subjected to a T-peel test with a tensile tester at a peel rate of 50 mm/min.

The base may be a base having a large number of through holes or a metallic foil base. Preferably, a material of the base having a large number of through holes is at least one selected from a group consisting of woven fabrics, mesh clothes, punched films, woven wires, perforated metals, expanded metals, and etched metals. Preferably, a material of the metallic foil base is at least one selected from a group consisting of copper foil, aluminum foil, iron foil, nickel foil, gold foil, silver foil, tin foil, zinc foil, and stainless steel foil.

The multilayer assemblies according to the present invention may be one arranged on at least one surface of the base by casting a polymer solution onto the base, introducing the casted base into a coagulation bath, and drying. An exemplary polymer solution is a solution mixture containing 8 to 25 percent by weight of a polymer component, 5 to 50 percent by weight of a water-soluble polymer, 0 to 10 percent by weight of water, and 30 to 82 percent by weight of a water-miscible (water-soluble) polar solvent.

In the multilayer assemblies according to the present invention, the polymer component may be at least one selected from a group consisting of polyimide resins, polyamideimide resins, poly(ether sulfone) resins, poly(ether imide) resins, polycarbonate resins, poly(phenylene sulfide)

resins, liquid crystalline polyester resins, aromatic polyamide resins, polyamide resins, polybenzoxazole resins, polybenzimidazole resins, polybenzothiazole resins, polysulfone resins, cellulosic resins, and acrylic resins. The base may contain at least one material selected from the group consisting of polyimide resins, polyamideimide resins, poly(ether sulfone) resins, poly(ether imide) resins, polycarbonate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, acrylic resins, poly(ethylene terephthalate) resins, poly(ethylene naphthalate) resins, poly(butylene terephthalate) resins, poly(ether ether ketone) resins, fluorocarbon resins, olefinic resins, and polyarylate resins.

In the multilayer assemblies according to the present invention, the polymer component may be at least one selected from a group consisting of polyimide resins, polyamideimide resins, poly(ether imide) resins, aromatic polyamide resins, and polyamide resins, and the base contains at least one material selected from polyimide resins, polyamideimide resins, poly(ether imide) resins, liquid crystalline polyester resins, aromatic polyamide resins, poly(ethylene terephthalate) resins, and poly(ethylene naphthalate) resins.

Additionally, in the multilayer assemblies according to the present invention, the polymer component may be at least one selected from a group consisting of polyimide resins, polyamideimide resins, poly(ether imide) resins, aromatic polyamide resins, and polyamide resins; and the base having a large number of through holes may contain at least one material selected from woven fabrics, nonwoven fabrics, mesh clothes, punched films, woven wires, perforated metals, expanded metals, and etched metals.

Further, in the multilayer assemblies according to the present invention, the polymer component may be at least one selected from a group consisting of polyimide resins, polyamideimide resins, poly(ether imide) resins, aromatic polyamide resins, and polyamide resins; and the metallic foil base may contain at least one material selected from copper foil, aluminum foil, iron foil, nickel foil, gold foil, silver foil, tin foil, zinc foil, and stainless steel foil.

In the multilayer assembly according to the present invention, the porous layer has a thickness of, for example, about 0.1 to 100 µm and a porosity of, for example, about 30% to 80%, and the base has a thickness of, for example, about 1 to 300 µm.

In the present invention, the multilayer assembly containing, for example, a base having a large number of through holes is preferably used as a filter, a battery separator (cell separator), an electrolyte membrane for fuel cells, or a catalyst carrier; and the multilayer assembly containing a metallic foil base is preferably used as an electromagnetic regulator, a circuit board, or a radiator plate.

Additionally, the present invention provides a method of producing any of the multilayer assemblies according to the present invention. This method comprises the steps of casting a polymer solution onto a base, introducing the base with a cast polymer solution into a coagulation bath, and drying the resulting article, to form a porous layer on at least one side of the base. An exemplary polymer solution is a solution mixture comprising 8 to 25 percent by weight of a polymer component, 5 to 50 percent by weight of a water-soluble polymer, 0 to 10 percent by weight of water, and 30 to 82 percent by weight of a water-miscible polar solvent.

Additionally, the present invention provides a composite material which comprises any of the multilayer assemblies according to the present invention; and a metallic deposit and/or a magnetic deposit arranged on a surface of at least one porous layer constituting the multilayer assembly. The composite material according to the present invention may be used typically in or as a circuit board, a radiator, or an electromagnetic regulator.

The present invention further provides, a method of producing a composite material via deposition of a metallic deposit on a surface of at least one porous layer constituting any of the multilayer assemblies according to the present invention. The method comprises the step of applying a photosensitive composition to the surface of the porous layer to form a photosensitive layer, the photosensitive composition containing a compound capable of forming a reactive group upon photoirradiation; the step of exposing the photosensitive layer to light through a mask to form reactive groups in exposed portions; and the step of allowing the reactive groups in the exposed portions to react and combine with a metal to form a conductor pattern.

Additionally, the present invention provides another method of producing a composite material via deposition of a metallic deposit on a surface of at least one porous layer constituting any of the multilayer assemblies according to the present invention. The method comprises the step of applying a photosensitive composition to the surface of the porous film constituting the multilayer assembly to form a photosensitive layer thereon, the photosensitive composition containing a compound capable of loosing its reactive group upon photoirradiation; the step of exposing the photosensitive layer to light through a mask to allow the compound to lose its reactive group in exposed portions; and the step of allowing reactive groups remained in unexposed portions to react and combine with a metal to give a conductor pattern.

The method of producing a composite material, according to the present invention, may produce a composite material used typically in or as a circuit board, a radiator, or an electromagnetic regulator.

Further, the present invention provides a composite material which comprises any of the multilayer assemblies according to the present invention. The composite material further comprises a conductor formed by a printing technique and arranged on a surface of at least one porous layer constituting the multilayer assembly. Exemplary composite materials include circuit boards, radiators, electromagnetic regulators, cell (battery) members, and capacitor members. The printing technique may be one selected from a group consisting of ink-jet printing, screen printing, dispenser printing, relief printing (flexographic printing), sublimation printing, offset printing, laser-beam printing (printing with toner), intaglio printing (gravure printing), contact printing, and microcontact printing. Exemplary conductors include at least one selected from a group consisting of silver, gold, copper, nickel, indium tin oxide (ITO), carbon, and a carbon nanotube.

In a preferred embodiment of the composite materials according to the present invention, the conductor is formed by the printing technique with an ink containing conductor particles. The porous layer has an average micropore diameter of $R1$ in the layer's surface, the conductor particles have an average particle diameter of $R2$, and $R1$ and $R2$ satisfy the following condition: $0.0001 \leq R2/R1 \leq 1000$. The composite material may be further comprises a layer of a metallic deposit or an insulating material covering the conductor. In a preferred embodiment, the conductor is silver and comprises a layer of a metallic deposit or an insulating material covering the conductor. Preferably, the metallic deposit is at least one selected from a group consisting of copper plating, gold plating, and nickel plating.

Exemplary composite materials according to the present invention include one in which the micropores of the porous layer remain intact; one in which the micropores of the porous layer are filled with a resin; and one in which the porous layer loses a structure having the micropores as a result of treatment with a solvent. Preferably, the resin to be filled in the micropores of the porous layer is at least one selected from a group consisting of epoxy resins, oxetane resins, acrylic resins, vinyl ether resins, polyimide resins, polyester resins, and polyamideimide resins. The composite materials may further include a cover lay arranged on the porous layer.

In another embodiment, the present invention provides a circuit board which includes a porous film layer having a large number of continuous micropores; and conductive interconnections arranged on at least one side of the porous film layer, in which the circuit board suffers from no loss of interconnections when examined in a peeling test (180-degree peeling, at a peel rate of 50 mm/min) with a cellophane pressure-sensitive adhesive tape [supplied by Nichiban Co., Ltd. under the trade name of "Cellotape (registered trademark) No. 405," 24 mm wide].

In yet another embodiment, the present invention provides another circuit board which includes a porous film layer having a large number of continuous micropores; and conductive interconnections arranged on at least one side of the porous film layer, in which the circuit board suffers from no loss of interconnections when examined in a peeling test (180-degree peeling, at a peel rate of 50 mm/min) with a paper pressure-sensitive adhesive tape [supplied by Nichiban Co., Ltd. under the trade name of "Paper Pressure-sensitive Adhesive Tape No. 208," 24 mm wide].

In these circuit boards, the porous film layer has an average pore diameter of, for example, 0.01 to 10 μm.

In still another embodiment, the present invention provides another circuit board which includes a porous film layer having a large number of continuous micropores; and conductive interconnections arranged on at least one side of the porous film layer, in which the porous film layer has an average pore diameter of 0.01 to 10 μm, and the conductive interconnections are printed conductive interconnections.

In these circuit boards, the porous film layer has a porosity of, for example, 30% to 80% and a thickness of, for example, 0.1 to 100 μm. In a preferred embodiment, the porous film layer is a resinous layer. Exemplary porous film layers include a layer made from a material mainly containing at lest one resin selected from polyamideimide resins, poly(ether imide) resins, polycarbonate resins, poly(ether sulfone) resins, and polyimide resins. Exemplary porous film layers also include a porous resinous phase inversion film layer.

In a preferred embodiment, the porous film layer is a layer of a porous film formed by preparing a solution of a water-soluble polymer and a material for constituting the porous film layer in a polar solvent; casting the solution onto a base to give a cast film; holding the cast film in an atmosphere at relative humidity of 70% to 100% for 0.2 to 15 minutes; thereafter immersing the cast film in a coagulation bath containing a nonsolvent for the material; and drying and desolvating the coagulated film.

The porous film layer may be arranged on one or both sides of a dense layer having substantially no pore. The conductive interconnections may be printed conductive interconnections.

In still another embodiment, the present invention provides a method of producing any of the circuit boards. The method includes the step of forming conductive interconnections on at least one side of a porous film layer having a large number of continuous micropores with an average pore diameter of 0.01 to 10 μm.

In this production method, the porous film layer may be formed as a resinous layer according to phase inversion. The conductive interconnections may be formed on a surface of a porous film layer having an average pore diameter of 0.01 to 10 μm formed on at least one side of a dense layer having substantially no pore. The conductive interconnections may be formed on the surface of the porous film layer according to a printing technique. Typically, the conductive interconnections may be formed (1) by applying a conductive ink to the surface of the porous film layer through ink-jet printing; (2) by applying a conductive ink to a printing plate with relief and/or intaglio corresponding to a pattern of interconnections, and transferring this to the surface of the porous film layer; (3) by extruding, from a syringe, a conductive paste into a pattern of interconnections onto the surface of the porous film layer; or (4) by applying a conductive paste in a pattern of interconnections to the surface of the porous film layer through screen printing. The formed conductive interconnections may further be plated.

The conductive interconnections may also be formed typically (5) by applying a catalyzer to the surface of the porous film layer through ink-jet printing to form a pattern of interconnections, and thereafter carrying out plating; (6) by applying a catalyzer to a printing plate with relief and/or intaglio corresponding to a pattern of interconnections, transferring this to the surface of the porous film layer, and thereafter carrying out plating; (7) by extruding, from a syringe, a catalyzer into a pattern of interconnections onto the surface of the porous film layer, and thereafter carrying out plating; or (8) by applying a catalyzer in a pattern of interconnections to the surface of the porous film layer through screen printing, and thereafter carrying out plating.

In yet another embodiment, the present invention provides a printed article which includes a porous film layer and a print arranged on a surface of the porous film layer, the print containing at least a straight-line portion having an average line width of 10 to 1000 μm and a length of 500 μm or more, in which the printed article has a fluctuation F in line width of 30% or less, which fluctuation F is expressed by following Expression (1):

$$F = (L\text{Max} - L\text{Min})/L\text{Ave} \times 100 \quad (1)$$

wherein LAve represents an average line width of a straight-line portion in a length of 500 μm; LMax represents a maximum line width of the straight-line portion in a length of 500 μm; and LMin represents a minimum line width of the straight-line portion in a length of 500 μm (this printed article is hereinafter also referred to as "printed article 1 according to the present invention").

In still another embodiment, the present invention provides a printed article which includes a porous film layer and a print arranged on a surface of the porous film layer, the print containing at least a straight-line portion having an average line width of 10 to 1000 μm and a length of 500 μm or more, in which the printed article has a standard deviation Σ in line width of 7 or less, and the standard deviation Σ is expressed by following Expression (2):

$$\Sigma = \sqrt{(((L\text{Ave} - L\text{Max})^2 + (L\text{Ave} - L\text{Min})^2)/2)} \quad (2)$$

wherein LAve represents an average line width of a straight-line portion in a length of 500 μm; LMax represents a maximum line width of the straight-line portion in a length of 500 μm; and LMin represents a minimum line width of the straight-line portion in a length of 500 µm (this printed article is hereinafter also referred to as "printed article 2 according to the present invention").

In another embodiment, the present invention provides a printed article which includes a porous film layer; and a print printed on a surface of the porous film from a printing plate, in which the printing plate has an opening width L1, the print has a corresponding printed width L2, and the ratio of L2 to L1 (L2/L1) is 0.8 to 1.2 (this printed article is hereinafter also referred to as "printed article 3 according to the present invention").

Exemplary printed articles include (i) a printed article in which the print is derived from a printing ink or paste containing, as a main solvent, such a liquid that whose contact angle with a surface of the porous film layer becomes 60 degrees or less within 300 msec after dropping a droplet (1 µl) of the liquid onto the surface of the porous film layer; (ii) a printed article in which the print is derived from a printing ink or paste containing, as a main solvent, such a liquid that whose contact angle with a surface of the porous film layer becomes 60 degrees or less within 300 msec after dropping a droplet (1 µl) of the liquid onto the surface of the porous film layer, and that the droplet has a radius of 1600 µm or less upon a lapse of 300 msec after the dropping, and (iii) a printed article in which the print is derived from a printing ink or paste having a viscosity of 0.05 to 1 Pa·s. In these printed articles, the print may be made from a paste extruded through a screen mesh or metal mask.

The porous film layer has an average pore diameter of, for example, 0.01 to 10 µm and a porosity of, for example, 30% to 80%. The porous film layer has a thickness of, for example, 0.1 to 100 µm.

The porous film layer may be a resinous layer. In a preferred embodiment, the porous film layer contains a thermally stable resin. Exemplary thermally stable resins include polyamideimide resins, poly(ether imide) resins, polycarbonate resins, and poly(ether sulfone) resins.

In a preferred embodiment, the porous film layer is a porous resinous phase inversion film layer. Typically, the porous film layer may be a layer of a porous film formed by preparing a solution of a water-soluble polymer and a material for constituting the porous film layer in a polar solvent; casting the solution onto a base to give a cast film; holding the cast film in an atmosphere at relative humidity of 70% to 100% for 0.2 to 15 minutes; thereafter immersing the cast film in a coagulation bath containing a nonsolvent for the material; and drying and desolvating the coagulated film.

Exemplary printed articles include printed circuit boards.

According to another embodiment, the present invention provides a method of producing a printed pattern. The method includes the steps of (1) carrying out printing on a porous film layer; (2A) bringing the printed porous film layer into contact with a solvent; and (3A) evaporating the solvent, to form a densified layer (this method is hereinafter also referred to as "method 1 of producing a printed pattern, according to the present invention").

According to yet another embodiment, the present invention provides another method of producing a printed pattern. This method includes the steps of (1) carrying out printing on a porous film layer; (2B) thermally melting the printed porous film layer; and (3B) cooling and solidifying the molten layer, to form a densified layer (this method is hereinafter also referred to as "method 2 of producing a printed pattern, according to the present invention"). In a preferred embodiment, when the porous film layer used in Step (1) has a tensile strength F1 and the densified layer after cooling and solidifying in Step (3B) has a tensile strength F2, the ratio of F2 to F1 (F2/F1) is more than 1.

In a preferred embodiment of these production methods, when the porous film layer used in Step (1) has a contact angle with water of $\Theta A_{1000}$ upon a lapse of 1000 msec after dropping the water onto a surface of the porous film layer and the densified layer obtained through desolvation in Step (3A) or the densified layer obtained through cooling and solidifying in Step (3B) has a contact angle with water of $\Theta B_{1000}$ upon a lapse of 1000 msec after dropping the water onto a surface of the densified layer, the ratio of $\Theta A_{1000}$ to $\Theta B_{1000}$ ($\Theta A_{1000}/\Theta B_{1000}$) is less than 1.

In another preferred embodiment, when the porous film layer used in Step (1) has contact angles with water of $\Theta A_{1000}$ and $\Theta A_{100}$ as measured upon lapses of 1000 msec and 100 msec, respectively, after dropping the water onto a surface of the porous film layer, the ratio of $\Theta A_{1000}$ to $\Theta A_{100}$ ($\Theta A_{1000}/\Theta A_{100}$) is less than 0.6; and when the densified layer obtained through desolvation in Step (3A) or the densified layer obtained through cooling and solidifying in Step (3B) has contact angles with water of $\Theta B_{1000}$ and $\Theta B_{100}$ as measured upon lapses of 1000 msec and 100 msec, respectively, after dropping the water onto a surface of the densified layer, the ratio of $\Theta_{1000}$ to $\Theta B_{100}$ ($\Theta B_{1000}/\Theta B_{100}$) is more than 0.6.

Exemplary printing techniques include ink-jet printing, screen printing, offset printing, sublimation printing, thermal printing, gravure printing, laser beam printing, paste printing, and nanocontact printing.

The porous film layer has an average pore diameter of, for example, 0.01 to 10 µm, a porosity of, for example, 30% to 80%, and a thickness of, for example, 0.1 to 100 µm.

The porous film layer may contain a resin. In a preferred embodiment, the resin constituting the porous film layer is a thermally stable resin. Exemplary thermally stable resins include polyamideimide resins, poly(ether imide) resins, polycarbonate resins, and poly(ether sulfone) resins.

In a preferred embodiment, the porous film layer is a porous resinous phase inversion film layer. Typically, the porous film layer may be a layer of a porous film formed by preparing a solution of a water-soluble polymer and a material for constituting the porous film layer in a polar solvent; casting the solution onto a base to give a cast film; holding the cast film in an atmosphere at relative humidity of 70% to 100% for 0.2 to 15 minutes; thereafter immersing the cast film in a coagulation bath containing a nonsolvent for the material; and drying and desolvating the coagulated film.

In addition and advantageously, the present invention provides a printed article which includes a printed pattern formed by any of the methods of producing a printed pattern.

Exemplary printed articles include printed circuit boards.

Advantages

The multilayer assemblies according to the present invention each include a porous layer having a large number of micropores, are thereby satisfactorily flexible, and have excellent pore properties. In addition, they exhibit a sufficient strength even when having a porosity and much excel in folding endurance and handleability, because the porous layer is lined by the base. According to the present invention, multilayer assemblies having these characteristic properties and having homogeneous film quality can be easily and stably produced. The resulting multilayer assemblies have the characteristic properties and are usable typically as low dielectric constant materials, filters, separators, electrolyte membranes for fuel cells, catalyst bases (catalyst carriers), cushioning materials, ink receiving sheets, test papers (indicator papers), electric insulating materials, and thermal insulating materials. In addition, when pores of the porous layer are filled with a functional material, they are also widely usable as circuit substrates (circuit boards), radiators (heat sinks, radiator plates), electromagnetic regulators including electromagnetic shielding materials and electromagnetic absorbing materials, battery separators (separators for cells), capacitors (e.g., paper capacitors, plastic film capacitors, ceramic capacitors, mica capacitors, and electrolytic capacitors), cell-culture base materials, and catalyst bases (catalyst carriers).

The circuit boards according to the present invention include a porous film layer having a large number of uniformly dispersed continuous micropores (communicating micropores); and conductive interconnections arranged on at least one side of the porous film layer, and have such characteristic properties that the circuit boards suffer from no loss of interconnections when examined in a peeling test (180-degree peeling, at a peel rate of 50 mm/min) with a cellophane pressure-sensitive adhesive tape [supplied by Nichiban Co., Ltd. under the trade name of "Cellotape (registered trademark) No. 405," 24 mm wide], with respect typically to conductive interconnections 50 to 200 μm wide. The tape peeling test may employ, instead of the "Cellotape (registered trademark) No. 405," a cellophane pressure-sensitive adhesive tape having an adhesive strength (adhesion) equivalent thereto (4.00 N/10 mm), as the cellophane pressure-sensitive adhesive tape.

By a method according to an embodiment of the present invention, printing can be carried out with excellent fine-line depictability, because the printing is carried out on a porous film layer whose pores immediately absorb a solvent in a printing ink or paste, thereby the ink has an increasing viscosity and loses fluidity. In embodiments of the present invention, the printed porous film layer is once dissolved (melted) by the action of a solvent with or without heating, and the solvent is removed. The porous film layer is thereby densified, and this improves the strength of a printed portion and adhesion of the resulting print and prevents absorption of water or another liquid. Thus, printed patterns having fine prints and being resistant to breakage are easily produced with good productivity. The densification of the porous film layer may also help to improve gas barrier properties and abrasion resistance (wear resistance). This helps printed articles such as circuit boards to have higher reliability.

BEST MODE FOR CARRYING OUT THE INVENTION

Multilayer assemblies according to embodiments of the present invention each include a base and a porous layer arranged on at least one side of the base and have such a configuration that the base and the porous layer suffer from no interfacial delamination when examined in a tape peeling test, in which a 24-mm wide masking tape [Film Masking Tape No. 603 (#25)] supplied by Teraoka Seisakusho Co., Ltd. is applied to a surface of the porous layer of the multilayer assembly and press-bonded thereto with a roller having a diameter of 30 mm and a load of 200 gf to give a sample; and the sample is subjected to a T-peel test with a tensile tester at a peel rate of 50 mm/min. This means that the base and the porous layer are laminated with such an interlayer adhesion as to suffer from no interfacial delamination between them in the tape peeling test.

The multilayer assemblies according to the present invention have a configuration in which the base and the porous layer are directly laminated with a specific interlayer adhesion as mentioned above, thereby have flexibility and excellent pore properties and further have moderate rigidity to show improved handleability. In addition, they can select a polymer component for constituting the porous layer from a wide variety of polymer components and are thereby applicable as materials in various fields. The interlayer adhesion between the base and the porous layer may be adjusted by suitably setting the types of materials constituting the respective layers and the physical properties at the interface between the layers.

A material constituting the base is not particularly limited, as long as it gives a base that suffers from no interfacial delamination with the porous layer when examined in the tape peeling test, and it can be selected as appropriate according to the material constituting the porous layer. Exemplary materials for constituting the base include plastics such as polyimide resins, polyamideimide resins, poly(ether sulfone) resins, poly(ether imide) resins, polycarbonate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, acrylic resins, poly(ethylene terephthalate) resins, poly(ethylene naphthalate) resins, poly(butylene terephthalate) resins, poly(ether ether ketone) resins, fluorocarbon resins, olefinic resins (including cyclic olefinic resins), and polyarylate resins. Each of these materials may be used alone or in combination; and in addition or alternatively, each of copolymers of these resins, such as graft polymers, block copolymers, and random copolymers, may also be used alone or in combination. Furthermore, polymers containing, in their principal chain or side chain, a skeleton (polymer chain) of any of the resins are also usable herein. Exemplary polymers of this type include polysiloxane-containing polyimides that contain both polysiloxane and polyimide skeletons in their principal chain.

Exemplary bases for use herein also include commercially available films as exemplified below. Exemplary commercially available polyimide resinous films include "Kapton" supplied by DuPont-Toray Co., Ltd.; "APICAL" supplied by Kaneka Corporation; and "UPILEX" supplied by Ube Industries, Ltd. Exemplary commercially available poly(ethylene terephthalate) resinous films include "Teijin Tetron Film," "Melinex," and "Mylar" each supplied by Teijin DuPont Films Japan Limited. Exemplary commercially available poly(ethylene naphthalate) resinous films include "Teonex" supplied by Teijin DuPont Films Japan Limited.

In addition, films prepared from commercially available resins are also usable herein. Exemplary commercially available liquid crystalline polyester resins include "VECTRA" supplied by Polyplastics Co., Ltd.; "SIVERAS" supplied by Toray Industries, Inc.; and "SUMIKA SUPER LCP" supplied by Sumitomo Chemical Co., Ltd.

Exemplary films most generally used as olefinic resinous films include polypropylene films and they are easily available as commercial products. In addition, films made from cyclic olefinic resins having a cyclic structure are also usable. Typically, usable films include those prepared from commercially available resins such as "TPX" supplied by Mitsui Chemicals, Inc.; "ZEONOR" supplied by Zeon Corporation; and "TOPAS" supplied by Polyplastics Co., Ltd.

As has been described, bases bearing a pressure-sensitive adhesive layer on one side thereof are also usable. Exemplary bases of this type include commercially available electrical and electronic equipment tapes supplied by Teraoka Seisakusho Co., Ltd., such as "Kapton Pressure-sensitive Adhesive Tape," "PPS Film Pressure-sensitive Adhesive Tape," "PEI Film Pressure-sensitive Adhesive Tape," "PEN Film Pressure-sensitive Adhesive Tape," and "Polyester Film Pressure-sensitive Adhesive Tape."

Exemplary bases for use herein further include bases having a large number of through holes and metallic foil bases.

As used herein the term "base having through holes" means a base having pores or holes penetrating the base in a direction substantially perpendicular to the base plane. The "base having a large number of through holes" is not particularly limited, as long as it has many through holes (open holes) and suffers from no interfacial delamination from the porous layer as examined in the tape peeling test. Exemplary materials for constituting the base having a large number of through holes include woven fabrics, nonwoven fabrics, mesh clothes, punched films and other plastic films or sheets; woven wires, perforated metals, expanded metals, etched metals, and other metallic foil or sheets. They may be selected suitably according typically to characteristic properties such as water resistance, thermal stability, and chemical resistance. Among them, mesh clothes having fine and regular structures are preferably used. In addition, nonwoven fabrics are also preferred for their relatively low cost.

Exemplary usable woven fabrics include woven fabrics made from one or two types of fibers selected typically from natural fibers such as cotton fibers and silk fibers; glass fibers, poly(ether ether ketone) (PEEK) fibers, aromatic polyamide fibers, polybenzoxazole fibers (e.g., "ZYLON") and other resinous fibers, and carbon fibers.

Exemplary usable nonwoven fabrics include nonwoven fabrics made from one or more types of materials selected typically from natural fibers such as cotton, wool, hemp, pulp, silk, and mineral fibers; synthetic fibers such as rayon, nylon (polyamide), polyester, polypropylene, acrylic fibers, vinylon, aramid fibers, and liquid crystalline polyester (LCP) fibers; and glass fibers. The type of a resin or resins constituting such a nonwoven fabric base may be selected according typically to the thermal stability, chemical-resistant, strength, and cost.

There are a variety of article numbers (types) in mesh clothes, depending typically on the opening (size of space between yarns in microns), yarn diameter (thickness (diameter) of yarn in microns), mesh (number of yarns per one inch), open area (ratio of open area to the overall mesh), and thickness (thickness of the mesh in microns). In addition, there are various weave techniques of mesh clothes, such as those according to ASTM (American Society for Testing and Materials), DIN (Deutsche Industrie Norm), HD, XX, GG, HC&P, and Schillinger. A mesh cloth having suitable properties according to the purpose may be selected from these mesh clothes.

Exemplary punched films include those prepared typically by punching a film such as a PET or polyimide film to form, for example, circular, square, rectangular, or elliptic holes.

Exemplary woven wires usable herein include commercially available plain woven wires, twilled woven wires, plain Dutch woven wires, and twilled Dutch woven wires. Exemplary materials of such woven wires include iron, stainless steel, copper, and nickel.

Exemplary perforated metals include perforated metals prepared typically by punching (die cutting) metallic foil or sheets to form, for example, circular, square, rectangular, or elliptic holes. Exemplary materials of perforated metals include iron, aluminum, stainless steel, copper, and titanium.

Exemplary expanded metals include those having shapes according to Japanese Industrial Standards (JIS), such as XS63 and XS42 FLAT. Exemplary materials thereof include iron, aluminum, and stainless steel.

The base having a large number of through holes may be produced according to a common procedure selected depending on the material, such as etching, punching, or laser beam irradiation. Such a base having a large number of through holes is advantageous in that a porous layer can be arranged thereon with excellent interlayer adhesion by applying a polymer solution to the surface thereof. The base also has flexibility and excellent pore properties and, in addition, has moderate rigidity to thereby help to effectively improve the handleability.

When the base having a large number of through holes is a mesh cloth, the base has an average pore diameter in surface (opening: the size of space between strands) of, for example, about 30 to 1000 μm, and preferably about 40 to 200 μm and a rate of open area in surface (open area: the ratio of open area to the overall mesh) of, for example, about 20% to 70%, and preferably about 25% to 60%. A mesh cloth having an excessively low opening and/or an excessively low open area, if used as the base, may often have an insufficient interlayer adhesion or low flexibility; and a mesh cloth having an excessively high opening and/or an excessively high open area may have low mechanical strength and rigidity and tend to have poor handleability, thus being undesirable.

A punched film or perforated metal, if used as the base having a large number of through holes, may have a rate of open area in surface of about 20% to 80%, and preferably about 30% to 70%. An excessively low rate of open area in surface may often impede permeation of gases and liquids; and an excessively high rate of open area in surface may often reduce the strength and impede handleability, thus each being undesirable.

A woven wire, if used as the base having a large number of through holes, may have a rate of open area in surface of about 20% to 80%, and preferably about 25% to 70%. An excessively low rate of open area in surface may often impede permeation of gases and liquids; and an excessively high rate of open area in surface may often reduce the strength and impede the handleability, thus each being undesirable.

An expanded metal, if used as the base having a large number of through holes, may have a rate of open area in surface of about 20% to 80%, and preferably about 25% to 70%. An excessively low rate of open area in surface may often impede permeation of gases and liquids; and an excessively high rate of open area in surface may often reduce the strength and impede the handleability, thus each being undesirable.

The base may be a single layer or a composite film including two or more layers composed of identical or different materials. The composite film may be a multilayered film prepared by stacking two or more films typically with an adhesive according to necessity; or a composite film formed as a result of a processing such as coating, vapor deposition, or sputtering.

When a porous layer is arranged on one side of the base, a pressure-sensitive adhesive layer may be arranged on the other side of the base. In this case, a protective film (release film) may further be arranged on the pressure-sensitive adhesive layer, for better handleability. The pressure-sensitive adhesive layer may be arranged on the other side of the base after the arrangement of the porous layer. Alternatively, the porous layer may be arranged on the other side of the base after the arrangement of the pressure-sensitive adhesive layer on one side. The pressure-sensitive adhesive layer may be formed by coating, by the affixation of a pressure-sensitive adhesive film, or by the affixation of a double-sided adhesive tape.

In a preferred embodiment, the base is such a base as to suffer from no or very little change in film quality, such as dissolution and remarkable deformation, when a polymer solution (coating composition) for the formation of the porous layer is applied thereto.

Exemplary bases having a large number of through holes for use herein include commercially available products. Typically, exemplary commercially available nonwoven fabrics include polypropylene nonwoven fabrics (under the trade name of "FC-310") and polyester nonwoven fabrics (under the trade name of "MF-80K") supplied by Japan Vilene Co., Ltd.; aramid nonwoven fabrics (under the trade names of "NOMEX Paper" Type 410, Type 411, Type 414, and Type 418) supplied by DuPont Teijin Advanced Papers Limited; and liquid crystalline polyester (LCP) nonwoven fabrics (under the trade names typically of "VECRUS" MBBK-CKJ Type and MBBK-KJ Type) supplied by Kuraray Co., Ltd. In addition, SEFAR supplies various types of commercially available mesh clothes according to material resins, such as polyester mesh clothes (under the trade name of "PETEX"), nylon mesh clothes (under the trade name of "NYTAL"), carbon mesh clothes (under the trade name of "CARBO-TEX"), Teflon (registered trademark) mesh clothes (under the trade name of "FLUORTEX"), polypropylene mesh clothes (under the trade name of "PROPYLTEX"), silk mesh clothes (under the trade name of "SILK"), and polyethylene mesh clothes. The type of the resin constituting the base, such as a mesh cloth, may be selected according typically to the thermal stability and chemical resistance.

The base may have been subjected to a surface treatment such as roughening, adhesion promoting treatment, antistatic treatment, sandblasting (sand matting), corona discharge treatment, plasma treatment, chemical etching, water matting, flame treatment, acid treatment, alkali treatment (treatment with a base), oxidation, ultraviolet irradiation, and treatment with a silane coupling agent. Commercially available surface-treated products are also usable herein. Examples of such surface-treated bases include carbon-coated nylon or polyester mesh clothes.

The base may have been subjected to two or more surface treatments in combination. Typically, in an embodiment, the base is first subjected to a treatment selected typically from corona discharge treatment, plasma treatment, flame treatment, acid treatment, alkali treatment, oxidation, and ultraviolet irradiation, and is then subjected to a treatment with a silane coupling agent. The combination treatments may exhibit higher effects as compared to a single treatment with a silane coupling agent in some types of the base; and high effects are expected particularly typically in polyimide bases. Exemplary silane coupling agents include commercial products supplied by Shin-Etsu Chemical Co., Ltd. and those supplied by Japan Energy Corporation.

A material for constituting the metallic foil base is not particularly limited, as long as it can give such a base that suffers from no interfacial delamination with the porous layer when examined in the tape peeling test, and can be suitably selected according to the material constituting the porous layer. Exemplary materials for constituting the metallic foil base include copper foil, aluminum foil, iron foil, nickel foil, gold foil, silver foil, tin foil, zinc foil, and stainless steel foil. Each of these materials may be used alone or in combination.

The metallic foil base may be a single layer or a composite film including two or more layers composed of identical or different materials. The composite metallic foil may be a multilayered film prepared by stacking two or more plies of metallic foil typically with an adhesive, where necessary; or one formed as a result of a processing such as coating, vapor deposition, or sputtering. When a porous layer is arranged on one side of the metallic foil base, a pressure-sensitive adhesive layer may be arranged on the other side of the metallic foil base. In this case, a protective film (release film) may further be arranged on the pressure-sensitive adhesive layer, for better handleability.

In a preferred embodiment, the metallic foil base is such a base as to suffer from no or very little change in film quality, such as dissolution and remarkable deformation, when a polymer solution (coating composition) for the formation of the porous layer is applied thereto.

Exemplary metallic foil bases for use herein also include commercially available, film-like metallic foil as exemplified below.

Exemplary commercially available copper foil products include electrodeposited copper foil (grade: HTE, VP, HS, and SV) and rolled copper foil (grade: RCF and RCF-AN) supplied by Fukuda Metal Foil & Powder Co., Ltd.; electrodeposited copper foil (grade: HTE and VLP) supplied by MITSUI MINING & SMELTING CO., LTD; and rolled copper foil supplied by Nippon Foil Mfg. Co., Ltd.

Exemplary commercially available aluminum foil products include those supplied by Fukuda Metal Foil & Powder Co., Ltd., those supplied by Nippon Foil Mfg. Co., Ltd., and those supplied by SUMIKEI ALUMINUM FOIL Co., Ltd.

Exemplary commercially available iron foil products include those supplied by TOHO ZINC CO., LTD.

Exemplary metallic foil bases usable herein further include articles composed of metallic foil and a pressure-sensitive adhesive applied on one side of the metallic foil. Exemplary commercially available products having this configuration include copper foil pressure-sensitive adhesive tapes, aluminum foil pressure-sensitive adhesive tapes, stainless steel foil pressure-sensitive adhesive tapes, conductive (electroconductive) copper foil pressure-sensitive adhesive tapes, conductive aluminum foil pressure-sensitive adhesive tapes, and shielding pressure-sensitive adhesive tapes (conductive fabric pressure-sensitive adhesive tapes) each supplied by Teraoka Seisakusho Co., Ltd. In addition, other commercially available products such as stainless steel tapes supplied by NITOMS Inc. are also usable herein.

The metallic foil base may have been subjected to one or more surface treatments such as roughening, adhesion promoting treatment, antistatic treatment, sandblasting (sand matting), corona discharge treatment, plasma treatment, chemical etching, water matting, flame treatment, acid treatment, alkali treatment, and oxidation; and such surface-treated commercially available products are also usable herein. Examples of metallic foil bases of this type include roughened copper foil.

The thickness of the metallic foil base is, for example, to 300 μm, preferably 5 to 200 μm, and more preferably 5 to 100 μm. A metallic foil base having an excessively small thickness may have poor handleability, and one having an excessively large thickness may have insufficient flexibility. The above-exemplified commercially available bases include those having thicknesses typically of 9 μm, 12 μm, 18 μm, 35 μm, and 70 μm, and any of them is usable herein.

The porous layer typically contains a polymer component as a main component. The polymer component constituting the porous layer is not particularly limited, as long as it may form a metallic foil base that suffers from no interfacial delamination with the porous layer when examined in the tape peeling test, and can be selected suitably according to the material constituting the metallic foil base. Exemplary polymer components include plastics such as polyimide resins, polyamideimide resins, poly(ether sulfone) resins, poly(ether imide) resins, polycarbonate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, and acrylic resins. Each of these polymer components may be used alone or in combination; and in addition or alternatively, each of copolymers of these resins, such as graft polymers, block copolymers, and random copolymers may be used alone or in combination. Furthermore, polymers containing, in their principal chain or side chain, a skeleton (polymer chain) of any of the resins are also usable herein. Exemplary polymers of this type include polysiloxane-containing polyimides that contain both polysiloxane and polyimide skeletons in principal chain.

Exemplary preferred polymer components for constituting the porous layer include those mainly containing any of polyamide resins, polyamideimide resins, and polyimide resins, because these are thermally stable, are capable of undergoing thermoforming, and excel in mechanical strength, chemical resistance, and electric properties. The polyamideimide resins are generally prepared by carrying out polymerization through a reaction between trimellitic anhydride and a diisocyanate or a reaction between trimellitic anhydride chloride and a diamine; and carrying out imidation (formation of an imine). The polyimide resins may be prepared, for example, by reacting a tetracarboxylic acid component and a diamine component to give a polyamic acid; and carrying out imidation of the polyamic acid. A porous layer, if made from a polyimide resin, is often prepared by forming a porous film from a polyamic acid; and then carrying out imidation (e.g., thermal imidation or chemical imidation) of the porous film of polyamic acid, because the imidation may impair the solubility of the imidated product.

The base may be a single layer or composite film including two or more layers composed of identical or different materials. The composite film may be a multilayered film prepared by laminating two or more films, where necessary, typically with an adhesive or one formed as a result of a processing such as coating, vapor deposition, or sputtering.

In a preferred embodiment, the base for use herein is such a base as to suffer from no or very little change in film quality, such as dissolution and remarkable deformation, when a polymer solution (coating composition) for the formation of the porous layer is applied thereto.

The base may have been subjected to a surface treatment such as adhesion promoting treatment, antistatic treatment, sandblasting (sand matting), corona discharge treatment, plasma treatment, chemical etching, water matting, flame treatment, acid treatment, alkali treatment, oxidation, ultraviolet irradiation, and/or treatment with a silane coupling agent. Commercially available surface-treated products are also usable herein. Examples of such surface-treated bases include PET (poly(ethylene terephthalate)) films undergone an adhesion promoting treatment and/or antistatic treatment; and polyimide films undergone a plasma treatment.

The base may have been subjected to two or more surface treatments in combination. Typically, in an embodiment, the base is first subjected to a treatment selected typically from corona discharge treatment, plasma treatment, flame treatment, acid treatment, alkali treatment, oxidation, and ultraviolet irradiation, and is then subjected to a treatment with a silane coupling agent. The combination treatments may exhibit higher effects as compared to a single treatment with a silane coupling agent in some types of the base; and high effects are expected particularly typically in polyimide bases. Exemplary silane coupling agents include commercial products supplied by Shin-Etsu Chemical Co., Ltd. and those supplied by Japan Energy Corporation.

The thickness of the base is, for example, 1 to 300 µm, preferably 5 to 200 µm, and more preferably 5 to 100 µm. A base having an excessively small thickness may have poor handleability, and one having an excessively large thickness may have insufficient flexibility. The above-exemplified commercially available bases include those having thicknesses typically of 12 µm, 12.5 µm, 25 µm, 50 µm, 75 µm, and 125 µm, and any of them is usable herein.

Particularly, the thickness of a base having a large number of through holes, if used, is, for example, 1 to 1000 µm, preferably 5 to 200 µm, and more preferably 5 to 100 µm. A base having a large number of through holes and having an excessively small thickness may have poor handleability, and one having an excessively large thickness may have insufficient flexibility.

The porous layer typically contains a polymer component as a main component. The polymer component constituting the porous layer is not particularly limited, as long as it may form a base that suffers from no interfacial delamination with the porous layer when examined in the tape peeling test, and can be selected suitably according to the material constituting the base. Exemplary polymer components include plastics such as polyimide resins, polyamideimide resins, poly(ether sulfone) resins, poly(ether imide) resins, polycarbonate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, and acrylic resins. Each of these polymer components may be used alone or in combination; and in addition or alternatively, each of copolymers of these resins, such as graft polymers, block copolymers, and random copolymers may be used alone or in combination. Furthermore, polymers containing, in their principal chain or side chain, a skeleton (polymer chain) of any of the resins are also usable herein. Exemplary polymers of this type include polysiloxane-containing polyimides that contain both polysiloxane and polyimide skeletons in their principal chain.

Exemplary preferred polymer components for constituting the porous layer include those mainly containing any of polyamideimide resins and polyimide resins, because these are thermally stable, are capable of undergoing thermoforming, and excel in mechanical strength, chemical resistance, and electric properties. The polyamideimide resins are generally prepared by carrying out polymerization through a reaction between trimellitic anhydride and a diisocyanate or a reaction between trimellitic anhydride chloride and a diamine; and carrying out imidation (formation of an imine). The polyimide resins may be prepared, for example, by reacting a tetracarboxylic acid component and a diamine component to give a polyamic acid; and carrying out imidation of the polyamic acid. A porous layer, if made from a polyimide resin, is often prepared by forming a porous film from the polyamic acid; and then carrying out imidation (e.g., thermal imidation or chemical imidation) of the porous film of polyamic acid, because the imidation impairs the solubility of the imidated product.

The thickness of the porous layer is, for example, 0.1 to 100 µm, preferably 0.5 to 70 µm, and more preferably 1 to 50 µm. A porous layer having an excessively small thickness may be difficult to produce stably, and one having an excessively large thickness may be difficult to have pores with uniform diameter distribution.

Particularly, when a base having a large number of through holes is used as the base, the thickness of the porous layer is, for example, 0.1 to 1000 μm, preferably 0.5 to 500 μm, and more preferably 1 to 200 μm. A porous layer having an excessively small thickness may be difficult to produce stably, and one having an excessively large thickness may be difficult to have pores with uniform diameter distribution.

In the multilayer assemblies according to the present invention, the base and the porous layer are directly laminated without the interposition of another layer, with such an interlayer adhesion as to suffer from no interfacial delamination when examined in the tape peeling test. The adhesion between the base and the porous layer may be improved, for example, by applying a suitable surface treatment to a side of the base on which the porous layer will be laminated; or by constituting the base and the porous layer from material components in such a combination as to exhibit good adhesion (good affinity or miscibility). Exemplary surface treatments include sandblasting (sand matting), corona discharge treatment, acid treatment, alkali treatment, oxidation, ultraviolet irradiation, plasma treatment, chemical etching, water matting, flame treatment, and treatment with a silane coupling agent. Exemplary silane coupling agents are as above. Each of these surface treatments may be applied in combination. In some types of bases, a treatment with a silane coupling agent with another treatment are preferably applied in combination.

In a preferred embodiment from the viewpoint of adhesion between a base and a porous layer, the porous layer is composed of at least one polymer component selected from polyimide resins, polyamideimide resins, poly(ether imide) resins, aromatic polyamide resins, and polyamide resins; and the base is composed of at least one material selected from polyimide resins, polyamideimide resins, poly(ether imide) resins, liquid crystalline polyester resins, aromatic polyamide resins, poly(ethylene terephthalate) resins, and poly(ethylene naphthalate) resins, in the multilayer assemblies according to the present invention. In another preferred embodiment from the same viewpoint, multilayer assemblies have such a configuration in which part or all of components constituting the base and the porous layer are identical; for example, polymeric compounds constituting the two layers at least partially have common monomer unit(s). Exemplary multilayer assemblies of this type include those in which materials constituting the base/(porous layer) are in a combination of polyimide/polyimide, polyamideimide/polyimide, polyimide/polyamideimide, poly(ether imide)/polyimide, polyimide/poly(ether imide), polyamideimide/poly(ether imide), or poly(ether imide)/polyamideimide.

In a preferred embodiment from the viewpoint of adhesion between a base having a large number of through holes and a porous layer, the porous layer is composed of at least one polymer component selected from polyimide resins, polyamideimide resins, poly(ether imide) resins, aromatic polyamide resins, and polyamide resins; and the base having a large number of through holes is composed of at least one material selected from woven fabrics, nonwoven fabrics, mesh clothes, punched films, woven wires, perforated metals, expanded metals, and etched metals, in the multilayer assemblies according to the present invention.

In another preferred embodiment from the viewpoint of adhesion between a metallic foil base and a porous layer, the porous layer is composed of at least one polymer component selected from polyimide resins, polyamideimide resins, poly(ether imide) resins, aromatic polyamide resins, and polyamide resins; and the metallic foil base is composed of at least one material selected from copper foil, aluminum foil, iron foil, nickel foil, gold foil, silver foil, tin foil, zinc foil, and stainless steel foil, in the multilayer assemblies according to the present invention.

A porous layer for use in an embodiment of the present invention has a large number of continuous micropores with an average pore diameter (i.e., average pore diameter inside the porous layer) of 0.01 to 10 μm. The average pore diameter of the micropores is preferably 0.05 to 5 μm. If the average pore diameter is out of the above-specified range, it may be difficult to give desired effects according to the purpose, and the pore properties may be poor. For example, pores having excessively small sizes may cause reduction typically in cushioning properties, ink permeability, electric insulating properties, and/or thermal insulating properties; and those having excessively large sizes may cause ink scattering and/or may impede formation of fine interconnections.

The average rate of open area inside the porous film (porosity) is, for example, 30% to 80%, preferably 40% to 80%, and more preferably 45% to 80%. If the porosity is out of the above-specified range, it may be difficult to give desired pore properties according to the purpose. For example, a porous layer having an excessively low porosity may cause an increased dielectric constant, reduced cushioning properties, reduced ink permeability, and/or reduced thermal insulating properties, and may fail to provide desired effects when pores are filed with a functional material; and one having an excessively high porosity may be poor in strength and/or folding endurance. The rate of open area in surface of the porous film is, for example, about 48% or more (e.g., about 48% to 80%), and preferably about 60% to 80%. A porous layer having an excessively low rate of open area in surface may show insufficient permeation performance, and a functional material, if charged into the pores, may not sufficiently exhibit its function. In contrast, a porous layer having an excessively high rate of open area in surface may be likely to be insufficient in strength and/or folding endurance.

The porous layer has only to be arranged on at least one side of the base, but it may be arranged on both sides thereof. Arrangement of porous layers on both sides of the base makes full use of pore properties to give a multilayer assembly that exhibit imparted properties on both sides. Exemplary properties are low dielectric constant, cushioning properties, ink receiving properties, and thermal insulating properties. In addition, filling of pores of porous layers on both sides with a functional material gives porous layer assemblies usable as a wide variety of base materials (base materials) such as circuit substrates (circuit boards), radiators (heat sinks, radiator plates), electromagnetic regulators such as electromagnetic shielding materials and electromagnetic absorbing materials, battery separators, capacitors (e.g., paper capacitors, plastic film capacitors, ceramic capacitors, mica capacitors, and electrolytic capacitors), low dielectric constant materials, separators, cushioning materials, ink receiving sheets, test papers (indicator papers), electric insulating materials, thermal insulating materials, cell-culture base materials, and catalyst bases (catalyst carriers). Filling of different functional materials into pores of porous layers on both sides, respectively, imparts different functions thereto. It is naturally acceptable that pores of one porous layer remain intact (without filling) and pores of the other porous layer are filled with a functional material.

In an embodiment of the present invention, a multilayer assembly has a porous layer imparted with chemical resistance. Impartment of chemical resistance to the multilayer assembly may help to avoid disadvantages such as delamination, swelling, dissolution, and deterioration when the multilayer assembly comes into contact typically with a solvent, an acid, or an alkali (base) upon wide variety of uses. Exemplary imparting treatments of chemical resistance include physical treatments typically by heat, ultraviolet rays, visible rays, electron beams, or radiation; and chemical treatments such as coating of the porous layer typically with a chemical-resistant polymer.

In an embodiment of multilayer assemblies according to the present invention, the porous layer may be coated with a chemical-resistant polymer. The multilayer assembly according to this embodiment may give an assembly in which a chemical-resistant coat is arranged typically on a surface of the porous layer and on surfaces of inner micropores, and thereby the assembly exhibits chemical resistance. As used herein the term "chemical(s)" refers to those known as to make resins constituting known porous films dissolve, swell, shrink, or decompose to thereby reduce functions as porous films. The "chemicals" may vary depending the types of resins constituting the porous layer and the base and may not automatically be defined. Exemplary chemicals include highly polar solvents such as dimethyl sulfoxide (DMSO), N,N-dimethylformamide (DMF), N,N-dimethylacetamide (DMAc), N-methyl-2-pyrrolidone (NMP), 2-pyrrolidone, cyclohexanone, acetone, methyl acetate, ethyl acetate, ethyl lactate, acetonitrile, methylene chloride, chloroform, tetrachloroethane, and tetrahydrofuran (THF); inorganic salts such as sodium hydroxide, potassium hydroxide, calcium hydroxide, sodium carbonate, and potassium carbonate; amines such as triethylamine; basic solutions including solutions of bases such as ammonia in water or organic solvents; inorganic acids such as hydrochloric acid, sulfuric acid, and nitric acid; acidic solutions of acids such as organic acids including carboxylic acids such as acetic acid and phthalic acid in water or organic solvents; and mixtures of these.

Chemical-resistant polymeric compounds for use herein are not particularly limited, as long as they have excellent resistance to chemicals such as highly polar solvents, bases, and acids. Examples thereof include thermosetting resins or photo-curable resins, such as phenolic resins, xylene resins, urea resins, melamine resins, benzoguanamine resins, benzoxazine resins, alkyd resins, triazine resins, furan resins, unsaturated polyesters, epoxy resins, silicone resins, polyurethane resins, and polyimide resins; and thermoplastic resins such as poly(vinyl alcohol)s, cellulose acetate resins, polypropylene resins, fluorocarbon resins, phthalic acid resins, maleic acid resins, saturated polyesters, ethylene-vinyl alcohol copolymers, chitins, and chitosans. Each of these polymeric compounds may be used alone or in combination. Such polymeric compounds may be copolymers or graft polymers.

The multilayer assembly including a porous layer covered by such a chemical-resistant polymer suffers from no or little deterioration that adversely affects the purpose and use, even when comes in contact with the chemicals such as highly polar solvents, bases, and acids. The deterioration herein includes dissolution of the porous layer and deformation of the porous layer caused by swelling. Typically, when the multilayer assembly is used in such a manner that it comes into contact with a chemical only within a short period, the assembly may be imparted with such chemical resistance as to avoid deterioration within the period.

In this connection, most of the chemical-resistant polymeric compounds are also thermally stable, and this eliminates the risk of reduction in thermal stability of the porous film as compared to a porous layer before coated with a chemical-resistant polymeric compound.

In another embodiment, micropores constituting the porous layer may be filled with a functional material. Exemplary functional materials include ferrite fine particles, metal fine particles (inclusive of metal-containing fine particles such as metal oxide fine particles), carbon blacks, carbon nanotubes, fullerenes, titanium oxide, and barium titanate. Charging or filling conditions of the functional material are not particularly limited, but charging with a resolution on the order of submicrons to microns may suppress loss or deterioration in original pore properties of the porous layer and improve handleability and operability, such as easy control of the amount of the functional material, thus being preferred. Upon charging of a functional material, if the micropores of the porous layer have excessively small sizes, it may be difficult to fill the micropores with the functional material; and if the micropores of the porous layer have excessively large sizes, it may be difficult to control the filling of the functional material with a resolution on the order of submicrons to microns. Accordingly, the average pore diameter of the micropores is preferably within the above-specified range, and the maximum pore diameter in the film surface is preferably 15 µm or less.

In some multilayer assemblies, the porous layer, if having an increased porosity or a reduced pore diameter, may have weakened strength or reduced adhesion with the base, because of their porous structure. In this case, the porous layer can be improved in its strength and/or adhesion with the base by eliminating the porous structure according to a procedure mentioned below. In addition, elimination of the porous structure suppresses irregular reflection of visible rays to make multilayer assemblies optically transparent, and the resulting multilayer assemblies are usable in a wide variety of applications.

The multilayer assemblies according to the present invention have a configuration in which a flexible porous film and a base are laminated. They therefore have excellent pore properties as mentioned above and simultaneously have sufficient folding endurance. With respect to the "folding endurance," a test piece is evaluated as having folding endurance when the test piece endures ten or more repeated bending procedures (folding procedures) before it breaks in a bending test under the following conditions. A test piece (sample) is evaluated as having higher folding endurance with an increasing number of bending procedures before it breaks. Typically, when a multilayer assembly is employed in applications where it undergoes repeated bending procedures typically in electronic materials, the multilayer assembly preferably has such a folding endurance as to endure hundred or more bending procedures before it breaks. The bending test may be carried out according to the folding endurance test specified in Japanese Industrial Standards (JIS) C 5016, with the MIT Type Folding Endurance Tester MIT-D supplied by Toyo Seiki Seisaku-Sho, Ltd. under the conditions of a sample size of 15 mm wide and 110 mm long, a bending angle of 135 degrees, a curvature radius (R) of the bending face of 0.38 mm, a bending rate of 175 cpm, and a tension of 4.9 N.

Multilayer assemblies according to embodiments of the present invention include those having such very excellent folding endurance as to endure even 20000 bending procedures or more before they break. These multilayer assemblies can exhibit excellent processability and formability and are applicable in a wide variety of forms to various uses.

Multilayer assemblies including a base having a large number of through holes have a structure, in which the base having a large number of through holes and a porous polymeric layer are integrated with excellent adhesion. They thereby have high mechanical strength and advantageously exhibit sufficient strength even when the total thickness of the multilayer assembly is as small as, for example, less than about 100 µm.

A multilayer assembly according to a preferred embodiment of the present invention includes a base and a porous layer covering one or both sides of the base, in which the porous layer has a large number of continuous micropores with an average pore diameter of 0.01 to 10 μm, the porous layer has a thickness of 0.1 to 100 μm and a porosity of 30% to 80%, and the base has a thickness of 1 to 300 μm. The multilayer assembly according to this embodiment may be produced by suitably setting or selecting materials constituting the porous layer and the base, thicknesses of these layers, and production conditions.

According to another preferred embodiment employing a base having a large number of through holes as the base, a multilayer assembly includes a base and a porous layer covering one or both sides of the base, in which the porous layer has a large number of continuous micropores with an average pore diameter of 0.01 to 10 μm, the porous layer has a thickness of 0.1 to 1000 μm and a porosity of 30% to 80%, and the base has a thickness of 1 to 1000 μm. The multilayer assembly according to this embodiment may be produced by suitably setting or selecting materials constituting the porous layer and the base, thicknesses of these layers, and production conditions.

These multilayer assemblies may be produced, for example, by a method of casting a polymer solution onto a base to give a cast film, bringing the cast film into contact with a coagulation bath to convert the film into a porous film, and drying the porous film as intact to give an assembly of the base and the porous layer; or by a method of transferring the converted porous film as above to a surface typically of a support, and drying the transferred film to give an assembly of the porous film arranged on the support. In a preferred embodiment of the present invention, the former method is employed. Exemplary processes for bringing the film into contact with a coagulation bath to give a porous film include known processes such as a process of forming a film through wet phase inversion (typically see JP-A No. 2001-145826), a process of forming a film through dry phase inversion (typically see PCT International Publication Number WO 98/25997), and a process using a solvent-replacing-rate regulator (typically see JP-A No. 2000-319442 and JP-A No. 2001-67643).

A method of producing a multilayer assembly according to an embodiment of the present invention includes the steps of casting a polymer solution onto a base, introducing the base with a cast polymer solution into a coagulation bath, and drying the resulting article, to form a porous layer on at least one side of the base. According to this method, a porous layer is formed on a base through wet phase inversion, and the formed porous layer is dried without further processing. This enables simultaneous formation and lamination of the porous layer on the base with good adhesion and thereby improves the production efficiency. Such a porous layer having a large number of micropores is flexible, and a film constituting the porous layer alone is difficult to handle and to laminate on another layer. However, the production method according to the present invention enables simultaneous film-formation and lamination, thereby avoids these problems, and easily gives a multilayer assembly composed of a base, and a porous layer having excellent pore properties and directly arranged on the base.

The base is preferably one that is resistant to deterioration when brought into contact with a coagulation bath. Examples thereof include the above-listed materials as materials constituting the base of the multilayer assembly.

In the method, the porous layer is preferably formed on a plane when the base is a base having a large number of through holes and including any of nonwoven fabrics, punched films, perforated metals, and etched metals, because the surface of the base has a plane structure other than the through holes. On the other hand, the porous layer may often cover and be integrated with the base when the base having a large number of through holes is composed of any of woven fabrics, mesh clothes, woven wires, and expanded metals, because the base surface has a fibrous, entangled structure including little plane portion, and the polymer solution readily enters cavities in the fibrous structure.

The base having a large number of through holes is preferably one that is resistant to deterioration when brought into contact with a coagulation bath. Examples thereof include the above-listed materials as materials constituting the base of the multilayer assembly.

Exemplary polymer solutions to be cast (flow-cast) include solution mixtures each containing a polymer component as a material constituting the porous layer; a water-soluble polymer; a water-miscible (water-soluble) polar solvent; and, if necessary, water.

The polymer component as a material constituting the porous layer is preferably one that is soluble in the water-miscible polar solvent and capable of forming a film through phase inversion; and each of the above-exemplified polymer components can be used alone or in combination. Instead of a polymer component constituting the porous layer, any of precursors of the polymer component, such as monomer components (starting materials) and oligomers thereof before imidation and/or cyclization may also be used.

Addition of a water-soluble polymer and water onto the polymer solution to be cast is effective to make the film structure spongy. Exemplary water-soluble polymers include polyethylene glycols, polyvinylpyrrolidones, poly(ethylene oxide)s, poly(vinyl alcohol)s, poly(acrylic acid)s, polysaccharides, derivatives of these, and mixtures of them. Among them, polyvinylpyrrolidones are preferred, because they may help to suppress void formation within the film and to increase the mechanical strength of the film. Each of these water-soluble polymers may be used alone or in combination. From the viewpoint of satisfactory pore formation, the molecular weight of the water-soluble polymer is desirably about 200 or more, preferably about 300 or more, particularly preferably about 400 or more (e.g., about 400 to $20 \times 10^4$), and especially preferably about 1000 or more. Addition of water helps to control the diameters of voids. Typically, increasing void diameters may be obtained by increasing the amount of water.

The water-soluble polymer very effectively helps to make the film structure spongy, and setting of the type and amount of the water-soluble polymer gives a wide variety of structures. Accordingly, the water-soluble polymer is very preferably used as an additive for the formation of the porous layer so as to impart desired pore properties. On the other hand, the water-soluble polymer is a component that does not constitute the target porous layer and ultimately becomes unnecessary and to be removed. In the method according to the present invention utilizing wet phase inversion, the water-soluble polymer is rinsed and removed in the step of immersing the film in a coagulation bath such as water to carry out phase inversion. In contrast, it is very difficult to use water-soluble polymers as additives in dry phase inversion, because components not constituting a porous layer (unnecessary components) are removed by heating, and the water-soluble polymers are generally unsuitable for the removal by heating. Thus, the production method according to the present invention can advantageously easily produce multilayer assemblies having desired pore properties, in contrast to dry layer transition that hardly produces a wide variety of pore structures.

Exemplary water-miscible polar solvents include dimethyl sulfoxide, N,N-dimethylformamide, N,N-dimethylacetamide (DMAc), N-methyl-2-pyrrolidone (NMP), 2-pyrrolidone, and mixtures of these; and among such solvents, one having solubility with respect to the polymer component (i.e., a good solvent for the polymer component) in accordance with the chemical skeleton of a resin to be used as the polymer component may be selected and used herein.

Exemplary preferred polymer solutions to be cast include solution mixtures each containing 8 to 25 percent by weight of a polymer component as a material constituting the porous film, 5 to 50 percent by weight of a water-soluble polymer, 0 to 10 percent by weight of water, and 30 to 82 percent by weight of a water-miscible polar solvent. If the concentration of the polymer component is excessively low, the porous layer may have an insufficient thickness or may be difficult to have desired pore properties. If it is excessively high, the porous layer may tend to have a low porosity. The water-soluble polymer is added so as to allow the inside of the film to have a homogeneous spongy porous structure. If the concentration of the water-soluble polymer is excessively low, huge voids of exceeding about 10 µm may occur in the film to reduce the homogeneity. If it is excessively high, the solubility may deteriorate; and in addition, if it exceeds 50 percent by weight, problems such as low film strength may often occur. The amount of water may be used to control the void diameter, and increasing void diameters may be obtained by increasing the amount of water.

In a preferred embodiment of the flow casting of the polymer solution into a film, the film is held in an atmosphere at a temperature of 15° C. to 90° C. and relative humidity of 70% to 100% for 0.2 to 15 minutes before being introduced into a coagulation bath containing a nonsolvent for the polymer component. Holding the cast film under the above conditions may help to give a homogeneous and highly continuous (communicating) porous layer. This is probably because holding the cast film under humidified conditions helps the water to migrate from the surface to the inside of the film to thereby promote phase separation of the polymer solution efficiently. Particularly preferred conditions include conditions at a temperature of 30° C. to 80° C. and relative humidity of 90% to 100%, of which more preferred are conditions at a temperature of 40° C. to 70° C. and relative humidity of about 100% (e.g., 95% to 100%). If the water content (moisture content) in atmosphere is lower than the above ranges, the porous layer may disadvantageously have an insufficient rate of open area in surface.

This method according to a preferred embodiment may easily produce or form, for example, a porous layer having a large number of continuous micropores with an average pore diameter of 0.01 to 10 µm. A porous layer constituting a multilayer assembly according to an embodiment of the present invention may have desired micropore diameter, porosity, and rate of open area, by selecting parameters such as the types and amounts of components, and the amount of water in the polymer solution, as well as the humidity, temperature, and time period upon flow casting, as described above.

The coagulation bath for use in the phase inversion process may be any solvent that coagulate the polymer component and is suitably selected according to the type of polymer used as the polymer component. It may for example be a solvent that coagulate polyamideimide resins or polyamic acids. Exemplary coagulation baths include water-miscible or -soluble coagulation baths including water; alcohols including monohydric alcohols such as methanol and ethanol, and polyhydric alcohols such as glycerol; water-soluble polymers such as polyethylene glycols; and mixtures of these.

The production method according to the present invention produces a multilayer assembly structurally including a base and a porous layer directly arranged on a surface of the base, by introducing the cast solution (cast film) into a coagulation bath to form a porous layer on the base surface and drying the porous layer as intact. The drying process is not particularly limited, as long as solvent components such as coagulation baths (coagulation liquids) are removable, and it may be carried out with heating or as air drying at room temperature. The heat treatment is not particularly limited, as long as the multilayer assembly can be controlled at a predetermined temperature. Exemplary heat treatments include hot-air heating, hot-roll heating, and placement typically in a thermostat or oven. The heating temperature may be selected from a wide range of, for example, from room temperature to about 600° C. The atmosphere in the heat treatment may be air or an inert gas such as nitrogen gas. Use of air is most inexpensive, but it may invite an oxidation reaction. To avoid this, nitrogen gas or another inert gas is preferably used, of which nitrogen gas is more preferred from the viewpoint of cost. The heating conditions may be suitably set in consideration typically of the productivity and properties of the porous layer and base. Drying gives a multilayer assembly including a base and a porous layer directly formed on a surface of the base.

The resulting multilayer assembly may be further subjected to a cross-linking process typically with heat, visible rays, ultraviolet rays, electron beams, or radiations. The cross-linking process helps polymerization, cross-linking, and/or curing of a precursor for constituting the porous layer to proceed to thereby form a polymeric compound. When the porous polymeric layer is composed of a polymeric compound, the cross-linking process helps cross-linking and/or curing of the polymeric compound to proceed to give a multilayer assembly including a porous layer having further improved characteristic properties such as rigidity and chemical resistance. Typically, a porous layer made from a polyimide precursor may further be subjected to thermal imidation or chemical imidation to give a porous polyimide layer. A porous layer made from a polyamideimide resin may be subjected to thermal cross-linking. The thermal cross-linking may be carried out simultaneously with the heat treatment for drying after introduction into the coagulation bath.

The cross-linking process may further cause a cross-linking reaction between the porous polymeric layer and the base film (base film). This helps to improve the adhesion between the base film and the porous layer. Typically, a heat treatment of a polyimide film bearing a porous layer of a polyimide precursor helps to convert the precursor into a polyimide and simultaneously bring the converted polyimide into intimate contact with the polyimide film. A heat treatment of a polyimide film bearing a porous layer of a polyamideimide resin helps to bring the porous layer into intimate contact with the polyimide film.

A production method according to an embodiment of the present invention easily produces a film composed of a base film and a porous polymeric layer covering one or both sides of the base film, in which the porous polymeric layer is a porous layer having a large number of continuous micropores with an average pore diameter of 0.01 to 10 µm.

The multilayer assemblies according to embodiments the present invention have only to include a porous layer arranged on at least on one side of a base, and they may include porous layers arranged on both sides of the base. The porous layer may be filled with a functional material; and when a multilayer assembly includes two or more porous layers, these porous layers may be filled with functional materials of identical or different types. The multilayer assemblies may have been subjected to a heat treatment and/or a coating treatment so as to impart desired characteristic properties.

The multilayer assemblies according to the present invention have the configurations and are thereby applicable to various uses in a wide variety of fields. More specifically, by utilizing original pore properties of the porous layer, the multilayer assemblies are usable typically as low dielectric constant materials, separators, cushioning materials, ink receiving sheets, test papers (indicator papers), electric insulating materials, and thermal insulating materials. In addition, by laminating another layer, such as a metallic deposit or magnetic deposit, to the multilayer assembly to give a composite material, or by filling pores of the porous layer with a functional material, the multilayer assemblies are usable typically as circuit substrates (circuit boards), radiators (e.g., radiator plates), electromagnetic regulators such as electromagnetic shielding materials and electromagnetic absorbing materials, battery separators, capacitors (e.g., paper capacitors, plastic film capacitors, ceramic capacitors, mica capacitors, and electrolytic capacitors), cell-culture base materials, and catalyst bases (catalyst carriers).

The multilayer assemblies according to the present invention may also be used as test papers (indicator papers). Such test papers are widely used typically for experiments and medical uses. Exemplary test papers include pH indicator papers (for example litmus papers), water quality test papers (e.g., ion test papers), oil test papers, moisture test papers, ozone papers, urine test papers, and blood test papers. The ion test papers help to conduct qualitative or quantitative determination of metal ions or anions. The urine test papers help to conduct quantitative determination typically of urinary sugars, urinary proteins, or occult blood. The blood test papers help to conduct quantitative determination typically of blood glucose. Usages of these test papers are increasing more and more, because measuring procedures of them are easy and convenient.

The multilayer assemblies according to the present invention surely have a sufficient strength to be handled, because the porous layer is in intimate contact with the base. The porous layer is capable of adsorbing an indicator used for the determination and is thereby a preferable medium. In addition, the porous layer is also capable of holding a solvent, such as water, and a sample, such as urine or blood, and is advantageous in these uses.

Among them, multilayer assemblies including a base having a large number of through holes are preferably used as filters. In these assemblies, a porous layer is arranged on the base having a large number of through holes, and the base helps to provide a sufficient strength. There are possibilities of applying these assemblies to such uses that a porous film alone may fail to have sufficient strength because of its high porosity. Exemplary filters using the multilayer assemblies according to the present invention include barrier filters for aqueous solutions such as water, or gases such as air; filters for waste water treatment to remove foreign substances on the order of submicrons or more; barrier filters typically for blood to separate red blood cells; and filters for air conditioners to separate, for example, dust, pollen, molds (fungi), and dead mites from air. The multilayer assemblies according to the present invention are also usable as bases (bases) for oxygen enrichment films used in air conditioners.

The multilayer assemblies according to the present invention are also advantageously usable as separators for batteries or cells. Such battery separators act to separate positive and negative electrodes from each other and should be excellent in retention of an electrolyte and good in ion conductivity. They are also required to have various characteristic properties such as thermal stability, flexibility, and strength. The multilayer assemblies according to the present invention may exhibit these characteristic properties in good balance and are very useful as battery separators of various types.

The multilayer assemblies according to the present invention are also usable as bases of electrolyte membranes for fuel cells. Recently, direct-methanol fuel cells (DMFCs) have been developed as power sources for mobile devices. DMFCs are fuel cells that use, as a fuel, methanol directly introduced into cells. Attempts have been mainly made to apply polyperfluoroalkylsulfonic acid electrolyte membranes (fluorine-containing electrolyte membranes), typified by "Nafion" supplied by DuPont, to DMFCs. However, these membranes have high affinity for methanol, swell by the action of methanol, and thereby cause methanol crossover (permeation of methanol into the electrolyte membrane), and the resulting energy loss is coming to the fore. The porous assemblies according to the present invention can provide electrolyte membranes for fuel cells to solve these problems.

In addition, the multilayer assemblies according to the present invention are usable as skeletons (backbones) of electrolyte membranes. The multilayer assemblies can employ mesh clothes resistant to solvents such as methanol (e.g., mesh clothes made typically of nylons, polyesters, polypropylenes, and tetrafluoroethylene resins) as bases and thereby prevent swelling of the bases. In addition, their porous layer excels in communication (continuity) and has fine pores; and filling the pores with an electrolyte gives electrolyte membranes for fuel cells.

Exemplary fuel cells further include polymer electrolyte fuel cells (proton-exchange fuel cells; PEFCs) used typically as automobile batteries. These are fuel cells employing hydrogen gas as a fuel. The fluorine-containing electrolyte membranes, if used in polymer electrolyte fuel cells, also cause hydrogen gas cross-over. Specifically, electrolyte membranes for use herein should be wetted with water so as to ensure proton conductivity, and the fluorine-containing electrolyte membranes also suffer swelling with water, thus causing hydrogen gas cross-over.

In contrast, the multilayer assemblies according to the present invention can employ mesh clothes resistant to water (e.g., mesh clothes made of nylons, polyesters, polypropylenes, and tetrafluoroethylene resins) as bases to prevent swelling of the bases. In addition, their porous layer excels in communication (continuity) and has fine pores; and filling the pores with an electrolyte gives electrolyte membranes for PEFCs.

Composite materials according to the present invention each include any of the multilayer assemblies according to the present invention; and a metallic deposit and/or a magnetic deposit arranged on a surface of at least one porous layer constituting the multilayer assembly.

The metallic deposit may be arranged as a thin metallic coat (plating) on the porous layer surface and on surfaces of inner micropores or may be arranged as a metal charged in pores. Exemplary metals constituting the metallic deposit include copper, nickel, silver, gold, tin, bismuth, zinc, aluminum, lead, chromium, iron, indium, cobalt, rhodium, platinum, palladium, and alloys of these metals. Exemplary metallic deposits further include coats or films of alloys containing one or more elements of every kind other than metals, such as nickel-phosphorus, nickel-copper-phosphorus, nickel-iron-phosphorus, nickel-tungsten-phosphorus, nickel-molybdenum-phosphorus, nickel-chromium-phosphorus, and nickel-boron-phosphorus. The metallic deposit may contain each of the metals alone or in combination, and may be a single layer or a multilayer composed of two or more layers.

A material constituting the magnetic deposit is not particularly limited, as long as it is a compound having magnetism. It may be either of a ferromagnetic material or paramagnetic material. Exemplary materials herein include alloys such as nickel-cobalt, cobalt-iron-phosphorus, cobalt-tungsten-phosphorus, and cobalt-nickel-manganese; and organic magnetic materials composed of compounds. Exemplary compounds include compounds having a moiety capable of generating free radicals, such as methoxyacetonitrile polymers; metal complex compounds such as charge-transfer complexes of decamethylferrocene; and polyacrylonitriles as a carbon material in the course of graphitization.

These composite materials may be produced by forming a layer from a metal or an organic compound on a surface of the porous layer of any of the multilayer assemblies according to the present invention, by a known procedure.

The deposition (plating) of the metallic deposit may be carried out according to a known procedure such as electroless plating and electroplating. The multilayer assemblies according to the present invention preferably employ aftermentioned electroless plating, because the porous layer includes a polymer component, in combination with or without electroplating.

There are known plating baths having a variety of compositions for the deposition of metallic deposits, and such plating baths are also commercially available from manufacturers. The composition of a plating bath for use herein is not particularly limited and may be selected according to desired properties such as beauty, hardness, abrasion resistance, color fastness, corrosion resistance, electroconductivity, thermal conductivity, thermal stability, sliding properties, water repellency, wettability, solder wettability, sealability, electromagnetic shielding properties, and reflection properties.

A composite material according to an embodiment of the present invention is produced by a method which includes the steps of applying a photosensitive composition to the surface of the porous film constituting any of the multilayer assemblies according to the present invention, to form a photosensitive layer thereon, the photosensitive composition containing a compound capable of forming a reactive group upon photoirradiation; exposing the photosensitive layer to light through a mask to form reactive groups in exposed portions; and allowing the reactive groups in the exposed portions to react and combine with a metal to form a conductor pattern. In another embodiment, a composite material is produced by a method corresponding to the method just mentioned above, except for using a compound capable of loosing its reactive group upon photoirradiation instead of the compound capable of forming a reactive group upon photoirradiation, and for including the steps of exposing the photosensitive layer to light through a mask to allow the compound to lose its reactive group in exposed portions; and allowing reactive groups remained in unexposed portions to react and combine with a metal to give a conductor pattern.

The compound capable of forming a reactive group upon photoirradiation is not particularly limited, as long as it is a compound capable of forming one or more reactive groups that combine with a metal (inclusive of metal ion) per molecule. Examples of such compounds include photosensitive compounds containing at least one derivative selected from onium salt derivatives, sulfonium ester derivatives, carboxylic acid derivatives, and naphthoquinone diazide derivatives. These photosensitive compounds help to give finely patterned conductive portions with good precision, because they excel in general versatility and are capable of easily forming, upon photoirradiation, reactive groups that combine with metals.

Exemplary compounds that lose their reactive group upon photoirradiation include a compound having a reactive group which is capable of combining with a metal (inclusive of a metal ion) and forms a hydrophobic functional group upon photoirradiation to make the compound resistant to dissolution in or swelling with water.

The reactive groups that are formed or lost upon photoirradiation are not particularly limited, as long as they are capable of combining with the metal (inclusive of a metal ion). Exemplary reactive groups include functional groups that can undergo ion exchange with a metal ion, of which cation-exchangeable groups are preferred. Exemplary cation-exchangeable groups include acidic groups such as —COOX group, —SO$_3$X group, and —PO$_3$X$_2$ group, wherein X represents a hydrogen atom, a typical metal element belonging to Groups I and II of the Periodic Table of Elements, such as an alkali metal or alkaline earth metal, or an ammonium group. Among them, cation-exchangeable groups having a pKa of 7.2 or less are preferred, because they can form sufficient bonds with a metal per unit area to easily give a desired conductivity. Such reactive groups are exchanged with metal ions in the subsequent step, and this contributes to stable adsorptivity by the action of a reduced metal or metal fine particles.

The light to be applied is not particularly limited, as long as it accelerates the formation or losing of the reactive group, and includes, for example, light with a wavelength of 280 nm or more. For avoiding deterioration of the multilayer assembly by exposure to light, light with a wavelength of about 300 nm or more (e.g., about 300 to 600 nm) is preferred, of which light with a wavelength of about 350 nm or more is more preferred.

Photoirradiation through a mask and, where necessary, subsequent rinsing gives a pattern composed of the reactive group in exposed portions or unexposed portions. The reactive group thus arranged on the porous layer surface combines with a metal according to the process mentioned below, to yield a conductor pattern.

In a preferred embodiment, the combining of the reactive group with a metal is carried out through electroless plating. The electroless plating is generally known to be useful as a process of depositing a metal on a resinous layer made typically of a plastic. The porous film surface of the multilayer assembly may have been subjected to a process or treatment such as degreasing, washing, neutralization, or deposit of catalyst, so as to increase adhesion with the metal. Exemplary catalyst formation treatments include catalytic metal nucleation (formation of catalytic metal nuclei) processes in which a catalytic metal capable of accelerating the deposition of a metal is applied to a side to be treated. Exemplary catalytic metal nucleation processes include a catalyzer-accelerator process of bringing the porous layer surface into contact with a colloidal solution containing a catalytic metal (salt) and then bringing the surface into contact with an acid or base solution or a reducing agent to accelerate chemical plating; a process of using metal fine particles, bringing the porous layer surface into contact with a colloidal solution containing fine catalytic metal particles, and then removing, for example, the solvent and additives typically by heating, to form catalytic metal nuclei; and a sensitizing-activating process of bringing the porous layer surface with an acid or base solution containing a reducing agent, then into contact with an acid or base solution of a catalytic metal, and then into contact with an activating composition, to deposit the catalytic metal.

Exemplary catalytic metal (salt)-containing solutions for use in the catalyzer-accelerator process include tin-palladium mixture solutions and solutions containing metals (or salts) such as copper sulfate. The catalyzer-accelerator process may be carried out typically by immersing the multilayer assembly in an aqueous copper sulfate solution, where necessary removing excess copper sulfate by washing, and then immersing the multilayer assembly in an aqueous sodium borohydride solution, to thereby form catalyst nuclei of fine copper particles on a porous layer surface of the multilayer assembly. The process using metal fine particles may be carried out typically by bringing the porous layer surface into contact with a colloidal solution containing dispersed silver nanoparticles, and then carrying out heating to remove additives such as a surfactant and a binder, to thereby deposit catalyst nuclei of silver particles on the porous layer surface. The sensitizing-activating process may be carried typically by bringing the multilayer assembly into contact with a solution of tin chloride in hydrochloric acid, and then into contact with a solution of palladium chloride in hydrochloric acid, to thereby deposit catalyst nuclei of palladium. The contact of the multilayer assembly with any of these process liquids (treatment solutions) may be carried out typically by applying the process liquid to the porous layer surface on which a metallic deposit is to be plated; or by immersing the multilayer assembly in the process liquid.

When a multilayer assembly including a base constituting one side of the assembly and a porous layer constituting the other side is immersed in a process liquid in the catalytic metal nucleation process, the base is preferably composed of a homogeneous layer. When the multilayer assembly of this type having a solid (homogeneous) base on one side thereof is immersed in a process liquid, catalyst nuclei are formed not only on the porous layer surface but also on the base surface of the multilayer assembly. In this case, the porous layer surface having a large surface area is likely to adhere to and hold large amounts of catalyst nuclei; and in contrast to this, the solid base has a smooth surface to thereby impede deposition of catalyst nuclei and to facilitate dropping out of deposited catalyst nuclei. Subsequent electroless plating on the porous layer surface bearing sufficient amounts of catalyst nuclei enables selective deposition of a metallic deposit.

Representative exemplary metals for use in electroless plating include copper, nickel, silver, gold, and nickel-phosphorus. A plating bath for use in electroless plating may contain, for example, the metal or a salt thereof and other components. Exemplary other components include reducing agents such as formaldehyde, hydrazine, sodium hypophosphite, sodium borohydride, ascorbic acid, and glyoxylic acid; and complexing agents or masking agents such as sodium acetate, EDTA, tartaric acid, malic acid, citric acid, and glycine. Most of these components are easily available as commercial products. The electroless plating may be carried out by immersing the multilayer assembly after the process in the plating bath. Metal deposition on an undesired portion such as the base may be prevented by affixing a protective sheet to one side of the multilayer assembly and then carrying out electroless plating, to apply electroless plating only to the other side of the assembly.

The thickness of the metallic deposit is not particularly limited, may be selected suitably according to the purpose, and is, for example, about 0.01 to 20 µm, and preferably about 0.1 to 10 µm. In an embodiment, a metallic deposit is formed typically by electroless plating in combination with electroplating, to increase the thickness of the metallic deposit efficiently. Specifically, a porous layer surface bearing a metallic film (metallic deposit) deposited through electroless plating shows conductivity by the action of the metallic film, and subsequent electroplating, which is more efficient, gives a thick metallic deposit within a short time period.

The method according to this embodiment is advantageous typically as a method of producing a composite material for use in or as a circuit board, a radiator, or an electromagnetic regulator.

Circuit boards have been generally manufactured by affixing copper foil to a surface of a base made from a material such as a glass/epoxy resin or a polyimide, and removing unnecessary portions of the copper foil by etching to form interconnections. According to this known technique, however, it is on the way to be difficult to form fine interconnections corresponding to higher-density packaging of circuit boards. To obtain finer interconnections according to this technique, it is necessary to bring a very thin copper foil into highly intimate contact with a base made from a glass/epoxy resin or a polyimide. Such thin copper foil, however, is very difficult to handle and laminate on the base. The thin copper foil alone is also difficult to produce and is expensive. In addition, the copper foil inherently has not so high adhesion with a glass/epoxy resin or a polyimide used as the material for the base, and finer interconnections made of copper foil may suffer from delamination from the base.

Under these circumstances, the composite materials according to the present invention are suitable as materials for circuit boards bearing fine interconnections, because the multilayer assembly has the above configuration and thereby ensures sufficient adhesion with a metallic deposit. In addition, the composite materials may exhibit high adhesion even the metallic deposit constitutes fine interconnections, because the metallic deposit is charged into pores in a surface layer of the porous layer, whereby the metal is entangled with the porous layer. When used as materials for circuit boards, preferred exemplary metals constituting the metallic deposit include copper, nickel, and silver.

The multilayer assemblies according to the present invention are very useful as circuit boards including fine interconnections arranged directly on a porous layer surface. Exemplary methods for producing such circuit boards include a method described as the method of producing a composite material, according to the present invention. This method uses any of the multilayer assemblies according to the present invention, thereby gives fine interconnections strongly entangled with the porous layer and gives such fine interconnections precisely and easily through an exposure technique. Use of a film having a porous layer on one side thereof gives one-sided interconnections, and use of a film having porous layers on both sides thereof gives double-sided interconnections. Via interconnections connecting the both sides, if needed, may be formed by boring with a common drill or by the application of laser beams to form a via hole, and filling the via hole with a conductive paste or plating the via hole. There has been known a technique of forming interconnections on a porous material through electroless plating. Such a known porous material, however, has low strength and shows poor handleability, and this may cause problems, such as breakage, during its production process. In contrast, use of any of the multilayer assemblies according to the present invention helps to ensure sufficient strength to thereby give a circuit board excellent in handleability, because the porous layer is formed in intimate contact with the base.

Radiators such as radiator plates are used as being placed in cabinets of various devices such as laptop computers (notebook computers), optical disk drives, projectors, and cellular mobile phones. Recently, heat generation of components of such devices is increasing more and more and will further increase in future, with the progress of technologies for higher-density packaging and with increasing outputs and operation speeds of the devices. Accordingly, techniques of heat radiation and cooling grow in importance, and radiators (heat sinks, radiator plates) for dissipating or radiating heat are more and more used. The composite materials according to the present invention are usable as excellent radiators, because they have large heat radiation areas, excellent heat radiation efficiencies, and small sizes, due to excellent pore properties of the porous layer as mentioned above, and, in addition, they show excellent thermal conductivities due to the metallic deposit. For exhibiting higher advantages, the metallic deposit constituting the radiators is preferably composed of one or more metals having a high thermal conductivity. Exemplary preferred metals for use herein include copper, silver, gold, cobalt, chromium, nickel, tin, and zinc.

Electromagnetic control materials are used as materials that shield or absorb electromagnetic waves, so as to reduce or suppress influence of a device on a surrounding electromagnetic environment or influence of the surrounding electromagnetic environment on the device. With the proliferation of digitronics such as personal computers and cellular mobile phones, there are many surrounding electromagnetic sources such as electric and electronic devices and radio (wireless) equipment and systems. These sources emit various electromagnetic waves. Electromagnetic waves emitted by these devices may possibly affect the surrounding electromagnetic environment, and the devices themselves may be affected by the surrounding electromagnetic environment. As measures against these, electromagnetic regulators such as electromagnetic shielding materials and electromagnetic absorbing materials increase in importance more and more. The composite materials according to the present invention are very useful as excellent electromagnetic regulators, because they can have conductivity by the action of the metallic deposit and thereby show electromagnetic shielding properties to shield electromagnetic waves; in addition or alternatively, they can have electromagnetic absorptivity by filling pores constituting the porous layer with an electromagnetic-absorbing material.

In a preferred embodiment, a metallic deposit constituting an electromagnetic regulator is one that can impart conductivity to the electromagnetic regulator. Exemplary effective metallic deposits include deposits of nickel, copper, and/or silver. In another embodiment, a composite material has a layer structure in which a magnetic deposit is formed on a porous layer surface through electroless plating. Composite materials according to this embodiment are useful as electromagnetic absorbing materials. Exemplary materials for the deposition of a magnetic deposit through electroless plating include magnetic materials including nickel, and alloys such as nickel-cobalt, cobalt-iron-phosphorus, cobalt-tungsten-phosphorus, and cobalt-nickel-manganese. The composite materials can be formed into very thin composite materials with high flexibility, in which the metallic deposit or magnetic material arranged by plating is entangled with the porous layer, and the plated layer is resistant to delamination. Thus, the composite materials have improved bending resistance (folding endurance). These composite materials may be used by placing in or attaching to any position of electronic devices.

The multilayer assemblies according to the present invention are also useful as low dielectric constant materials. With a migration to broadband, there rises a necessity for transmitting massive information at high speed. Electronic devices become to be used at higher frequencies, and electronic components used in the devices should correspond to higher-frequency signals. Use of known circuit boards (made typically of glass/epoxy resins) in such high-frequency circuits cause various problems. Typically, (1) their high dielectric constants cause delay of transmitted signals; and (2) their high dielectric losses cause occurrence of interference/decay of signals, increase in consumed power, and heat generation in the circuits. It is believed that porous materials are useful as materials for high-frequency circuit boards to solve these problems. This is because such porous materials may achieve low relative dielectric constants due to air having a low relative dielectric constant of 1. Porous base materials (base materials) have been used for this purpose, but this still causes another problem. Specifically, porous base materials, if having higher porosities in order to have lower dielectric constants, have reduced strength as bases. In contrast, the multilayer assemblies according to the present invention are suitable media as low dielectric constant materials, because they each have a porous layer arranged on a base to have low dielectric constants, and, simultaneously, the porous layer is in intimate contact with the base to ensure sufficient strength upon handling.

Ink-image receiving sheets are also called printing media and are frequently used in printing. On the other hand, a wide variety of printing processes have been practically used and utilized. Exemplary printing processes include ink-jet printing, screen printing, dispenser printing, relief printing (flexographic printing), sublimation printing, offset printing, laser-beam printing (printing with toner), intaglio printing (gravure printing), contact printing, and microcontact printing. Components of inks for use herein are not particularly limited and include, for example, conductors, dielectrics, semiconductors, insulators, resistors, and coloring materials.

Production of electronic materials by a printing process gives advantages such as (1) production through a simple process, (2) with less wastes and less loads on the environment, (3) production with low energy consumption within a short period of time, and (4) significant reduction in initial investment. In contrast, it is fact that this requires unprecedentedly high-definition printing and invites technical difficulties. In printing used especially for the production of electronic materials, printing results are significantly affected by not only performance of printing machines but also characteristic properties of inks and ink receiving sheets. The multilayer assemblies according to the present invention enable unprecedentedly high-definition printing and are very advantageously used in the printing, because they each have a porous layer in intimate contact with a base, and they enable absorption and precise (accurate) fixation of inks due to the fine porous structure of the porous layer. In addition, the multilayer assemblies also enable continuous printing typically in a roll-to-roll manner and remarkably improve production efficiency, because the porous layer is in intimate contact with the base to ensure sufficient strength upon handling.

When electronic materials are produced by printing, exemplary printing processes are as above. Exemplary electronic materials to produce by printing include liquid crystal displays, organic electroluminescence (EL) displays, field emission displays (FED), integrated circuit (IC) cards, IC tags, solar cells, light emitting diodes (LEDs), organic transistors, capacitors, electronic papers, flexible cells (flexible batteries), flexible sensors, membrane switches, touch panels, and electromagnetic interference (EMI) shielding materials.

Methods of producing the electronic materials include the step of printing an ink containing an electronic material onto a surface of the porous layer (base). Exemplary electronic materials include conductors, dielectrics, semiconductors, insulators, and resistors. Typically, printing with an ink containing a dielectric onto the porous layer (base) surface gives a capacitor. Exemplary dielectrics include barium titanate and strontium titanate. Printing with an ink containing a semiconductor gives, for example, a transistor. Exemplary semiconductors include pentacene, liquid silicon, fluorene-bithiophene copolymer (F8T2), and poly(3-hexylthiophene) (P3HT).

Printing with an ink containing a conductor gives interconnections to produce, for example, flexible bases, tape automated bonding (TAB) bases, and antennas. Exemplary conductors for use herein include electroconductive inorganic particles typically of silver, gold, copper, nickel, indium tin oxide (ITO), carbon, and carbon nanotubes; and particles of conductive organic polymers such as polyanilines, polythiophenes, polyacetylenes, and polypyrroles. Exemplary polythiophenes include poly(ethylenedioxythiophene)s (PEDOTs). These can be used as inks in the form of solutions or colloids. Among them, conductor particles made of inorganic particles are preferred, of which silver particles and copper particles are more preferred, from the point of balance between electric properties and cost. The particles may be in the form typically of spheres or flakes. The particle size is not particularly limited, but usable particles herein may have an average particle diameter of about several micrometers to about several nanometers. Such particles having an average particle diameter of several nanometers are also called "nanoparticles." Two or more types of these particles may be used in combination. The following description is made by taking a silver ink (silver paste) as an example of a conductive ink because such silver inks are easily available, but inks for use herein are not limited thereto, and inks of other types are also applicable.

Silver inks generally contain silver particles, and other components such as a surfactant, a binder, and a solvent. In an another embodiment, an ink containing particles of silver oxide is printed, and the printed ink is heated and reduced to give silver interconnections. This utilizes that silver oxide is reduced by heating. In yet another embodiment, an ink containing an organic silver compound is printed, and the printed ink is heated and decomposed to give silver interconnections. An organic silver compound that will dissolved in a solvent may also be used herein. Each of such silver particles, silver oxides, and organic silver compounds may be used alone or in combination as particles constituting the silver ink. The silver ink may also contain particles of different diameters. The temperature (firing temperature) for curing the silver ink after printing may be selected according typically to the composition and particle diameter of the ink, but is often generally within the range of about 100° C. to 300° C. The firing temperature is preferably relatively low, because the multilayer assemblies according to the present invention are organic materials and may deteriorate at excessively high temperatures. On the other hand, the firing temperature is generally preferably high from the viewpoint of reducing the electric resistance of interconnections. Accordingly, an ink having an adequate curing temperature should be selected. Exemplary commercially available products as silver inks include products supplied by Daiken Chemical Co., Ltd. under the trade name of "CA-2503," products supplied by Fujikura Kasei Co., Ltd. under the trade name of "NANO DOTITE XA9053," products supplied by Harima Chemicals, Inc. under the trade names of "NPS" and "NPS-J" (average particle diameter of about 5 nm), and products supplied by Nippon Paint Co., Ltd. under the trade name of "Finesphere SVW102" (average particle diameter of about 30 nm).

FIG. 1 depict schematic cross-sectional views of circuit boards (wiring boards) in which an ink containing conductor particles is printed to give an interconnection on a porous layer (base) surface, in which FIGS. 1(A), (B), and (C) depict circuit boards each including a porous layer 1 and an interconnection 2 formed on a surface of the porous layer 1 with a high-viscosity ink; and FIGS. 1(D), (E), and (F) depict circuit boards each including a porous layer 1 and an interconnection 2 formed on a surface of the porous layer 1 with a low-viscosity ink. The formed interconnections have different shapes according typically to opening size (e.g., average opening diameter) of a surface layer of the porous layer; size and distribution thereof (e.g., particle diameter and particle size distribution) of particles, such as conductor particles, contained in the ink; and the ratio of the opening size to the particle diameter.

FIGS. 1(A) and (D) show embodiments of circuit boards each formed with an ink mainly containing particles having particle diameters smaller than the average opening diameter of the surface layer of the porous layer. In these embodiments, the interconnection 2 is mainly formed inside the porous layer 1. The interconnection 2 is thus entangled with the porous layer 1 to have higher adhesion with the porous layer 1, but the interconnection 2 is likely to show a relatively high electric resistance, because the interconnection 2 also contains a resin constituting the porous layer 1.

FIGS. 1(C) and (F) show embodiments of circuit boards each formed with an ink mainly containing particles having particle diameters larger than the average opening diameter of the surface layer of the porous layer. In these embodiments, the interconnection 2 is mainly formed on the porous layer 1. The interconnection 2 thereby shows a low electric resistance but it is likely to show a relatively low adhesion with the porous layer 1, because the interconnection 2 contains substantially no resin constituting the porous layer 1.

FIGS. 1(B) and (E) show embodiments of circuit boards each formed with an ink mainly containing particles having particle diameters near to the average opening diameter of the surface layer of the porous layer. In these embodiments, the interconnection 2 is formed partially inside (embedded in) the porous layer 1 and partially exposed from the porous layer 1. Thus, the interconnection 2 has such a certain adhesion with the base as to be moderate as compared with the above two embodiments, although it shows a somewhat high electric resistance.

It is therefore preferred to set the particle diameters and particle size distribution, and mixing ratio of particles typically of conductors to be added to the ink, from these viewpoints in consideration of balance between electric resistance and adhesion of interconnections to be required for circuit boards.

More specifically, in a preferred embodiment, the porous layer has an average opening diameter in its surface layer of R1 within a range of about 0.01 to 10 μm and the conductor particles have an average particle diameter of R2 within a range of about 0.001 to 10 μm; specifically R1 and R2 satisfy the following condition: $0.0001 \leq R2/R1 \leq 1000$. Particularly in an embodiment of a composite material which includes a conductor arranged on a porous surface and formed by printing with an ink containing conductor particles, the porous layer has an average opening diameter in its surface layer of R1, the conductor particles have an average particle diameter of R2, and R1 and R2 preferably satisfy the following condition: $0.0001 \leq R2/R1 \leq 1000$.

In ink-jet printing, the Ink preferably has a low viscosity and includes particles with small diameters, so as to avoid clogging of nozzles with the ink. Accordingly, R1 is preferably about 0.01 to 5 μm and R2 is preferably about 0.001 to 0.2 μm; namely, R1 and R2 preferably satisfy the following condition: $0.0002 \leq R2/R1 \leq 20$.

In screen printing, an ink having an excessively low viscosity is difficult to be held by a screen, and therefore the ink preferably has a somewhat high viscosity. The ink may contain particles even having large diameters without problems, and when it contains particles having small diameters, the ink preferably contains a smaller amount of a solvent. Accordingly, R1 is preferably about 0.01 to 10 μm and R2 is preferably about 0.001 to 10 μm; namely, R1 and R2 preferably satisfy the following condition: $0.0001 \leq R2/R1 \leq 1000$.

Interconnections may be arranged on one side or on both sides of the porous layer. When interconnections are arranged on both sides of the porous layer, there may be further arranged vias connecting the interconnections on both sides. The via holes may be formed with a drill or with laser beams. A conductor in the via holes may be formed from a conductive paste or by plating.

Surfaces of interconnections formed from a conductive ink may be covered by a metallic deposit (plating) or an insulator before use. Among such interconnections, silver interconnections have been indicated to be susceptible to electromigration and ion migration (NIKKEI ELECTRONICS, Jun. 17, 2002 issue, page 75). It is therefore effective to cover surfaces of interconnections made from a silver ink by plating (metallic deposit) so as to improve the reliability of interconnections. Exemplary platings (metallic deposits) include copper plating, gold plating, and nickel plating. The plating may be conducted according to a known procedure.

In another embodiment, surfaces of interconnections formed from a conductive ink may be covered by a resin. This configuration is advantageously used typically for the purposes of protecting the interconnections, insulation of the interconnections, prevention of the interconnections from oxidation and migration, and improvement in flexibility. Typically, there are possibilities for silver interconnections and copper interconnections to be converted into silver oxide and copper oxide, respectively, and to thereby have reduced conductivity as a result of oxidation. Covering (coating) the surfaces of interconnections with the resin prevents the interconnections from coming into contact with oxygen and water (moisture) and suppresses the reduction in conductivity. Exemplary processes for selectively coating the surfaces of interconnections with a resin include a process with a dropping pipette, a process with a dispenser, screen printing, and an ink-jet process, each using, for example, a curable resin or soluble resin as mentioned below as a resin to be charged into the pores.

Porous portions after the formation of interconnections may remain intact as pores (vacancies) or may be filled typically with a resin, and the configuration may be selected suitably according to the use of the circuit board. A composite material having porous portions remaining as intact as pores is advantageously used as a high-frequency circuit board, because the porous portions help to achieve a low dielectric constant. A composite material having pores filled typically with a resin is advantageous in that its interconnections become resistant to cutting or breakage and show increased reliability upon insulation, because the interconnections are protected by the resin. A porous layer which loses its porous structure may have higher strength and higher adhesion with the base. In addition, losing the porous structure suppresses irregular reflection of visible rays and makes the composite material optically transparent.

In exemplary layer structures of composite materials according to the present invention, pores of the porous layer may remain intact as pores; pores of the porous layer may be filled with a resin; or the porous layer may lose its pore structure as a result of treatment with a solvent.

The resin to be charged into pores of the porous layer is not particularly limited and examples thereof include curable resins used in the absence of solvents; and soluble resins used as solutions in solvents. A soluble resin, if used, should be charged in consideration of volume loss on evaporation of the solvent. Accordingly, when the pores are to be completely filled with a resin, a curable resin usable in the absence of solvents is preferably used, because charging of a soluble resin may cause pores not filled with the resin due to volume loss.

Exemplary curable resins include epoxy resins, oxetane resins, acrylic resins, and vinyl ether resins.

Exemplary epoxy resins include glycidyl ether epoxy resins including bisphenols such as bisphenol-A and bisphenol-F, and novolaks such as phenol novolaks and cresol novolaks; alicyclic epoxy resins; modified resins of these resins; and other various resins. Exemplary epoxy resins as commercially available products include "Araldite" supplied by Huntsman Advanced Materials, "DENACOL" supplied by Nagase Chemtex Corporation, "Celloxide" supplied by Daicel Chemical Industries, Ltd., and "EPOTOHTO" supplied by Tohto Kasei Co., Ltd. A cured article of an epoxy resin is obtained, for example, by mixing the epoxy resin with a curing agent to give a curable resin composition, initiating a curing reaction of the curable resin composition, and accelerating the reaction by heating. Exemplary usable curing agents for epoxy resins include organic polyamines, organic acids, organic acid anhydrides, phenols, polyamide resins, isocyanates, and dicyandiamides.

In another embodiment, a cured article of epoxy resin is obtained by mixing an epoxy resin with a curing catalyst called "latent curing agent" to give a curable resin composition, and initiating a curing reaction of the curable resin composition by application of heat or light such as ultraviolet rays. Exemplary latent curing agents include commercially available products such as "San-Aid SI" supplied by Sanshin Chemical Industry Co., Ltd.

When an epoxy resin that gives a highly flexible cured article is used, the resulting composite material may be used as a flexible article such as a flexible base (flexible board). When thermal stability and/or high dimensional stability is required, a curable resin composition that becomes harder after curing may be used to give a rigid base (hard base).

To fill pores with an epoxy resin, the curable resin composition preferably has a low viscosity upon filling. Exemplary curable resin compositions having such characteristic properties include bisphenol-F-containing compositions and aliphatic polyglycidyl ether-containing compositions.

Exemplary oxetane resins include "ARON OXETANE" supplied by Toagosei Co., Ltd. A cured article of such oxetane resin is obtained by mixing an oxetane resin typically with a cationic photopolymerization initiator "IRGACURE 250" supplied by Ciba Specialty Chemicals Corporation to give a composition, and applying ultraviolet rays to the composition to initiate a curing reaction.

Exemplary soluble resins include commercially available products such as a low-dielectric resin "Oligo-Phenylene Ether" supplied by Mitsubishi Gas Chemical Company, Inc.; a polyamideimide resin "VYLOMAX" supplied by Toyobo Co., Ltd.; a polyimide ink "UPICOAT" supplied by Ube Industries, Ltd.; a polyimide ink "Ever-Rec" supplied by Tohto Chemical Industries, Ltd.; a polyimide ink "ULIN COAT" supplied by NI MATERIAL Co., Ltd.; a polyimide ink "Q-PILON" supplied by PI Research and Development Co., Ltd.; a saturated polyester resin "Nichigo POLYESTER," an acrylic solvent-containing pressure-sensitive adhesive "COPONYL," and an ultraviolet/electron beam-curable resin "SHIKOH" each supplied by Nippon Synthetic Chemical Industry Co., Ltd.

The solvent used in charging for dissolution of a soluble resin can be selected suitably from among known organic solvents according to the type of the resin. Representative examples of resin solutions (soluble resin solutions) of soluble resins in solvents include a resin solution of "Oligo-Phenylene Ether" in a common solvent such as methyl ethyl ketone or toluene; a resin solution (under the trade name of "HR15ET") of "VYLOMAX" in a solvent mixture of ethanol and toluene; and a resin solution of "UPICOAT" in triethylene glycol dimethyl ether (TRIGLYME).

The way how a resin is charged into pores of the porous layer is not particularly limited and includes a process in which the curable resin composition or soluble resin solution is spread (applied) to the porous layer surface by a device or procedure such as a dropping pipette, a spoon, a dispenser, screen printing, or ink-jet process, and where necessary the resin and other components in excess are removed typically with a spatula. Exemplary materials constituting the spatula include polypropylenes, Teflon (registered trademark) and other fluorocarbon resins, silicone rubbers and other rubbers, and poly(phenylene sulfide)s and other resins; and stainless steels and other metals. Among them, resinous spatulas are preferably used, because they are unlikely to damage the interconnections and the porous layer. In another possible process, a suitable amount of the composition or solution is added dropwise onto the porous layer surface using a device or procedure capable of controlling the discharge amount of the composition or solution, such as a dropping pipette, a dispenser, screen printing, or an ink-jet process, instead of using a spatula.

An uncured resin having a low viscosity is preferably used for smoothly charging the resin into pores of the porous layer. When a resin having a high viscosity is used, the resin may be charged more satisfactorily by reducing the viscosity of the resin with the use of a procedure or device such as heating at suitable temperatures. However, heating more than necessary is undesirable when a curable resin is used, because heating increases the curing reaction rate, and heating more than necessary may adversely affect the workability and charging properties.

A heat treatment is preferably conducted after the resin component is spread to the porous layer surface and is charged into pores, in order to accelerate curing of the resin and/or to evaporate the solvent. The heating process is not particularly limited, but a process of gradually or mildly elevating the temperature is preferred, because abrupt heating may cause evaporation of the resin and curing agent or may cause abrupt evaporation of the solvent, and this may cause nonuniformity. The temperature elevation may be conducted continuously or intermittently (stepwise). The temperatures and time periods in curing and drying are preferably adjusted suitably according to the types of the resin and solvent.

In general, porous layers before resin charging are not seen through from one side to the other side, because pores in the porous layer irregularly reflect visible rays, and the porous layers are opaque and have low transparency. In contrast, porous layers whose pores are filled with a resin may often become transparent, because they do not irregularly reflect visible rays. Such transparent porous layers are advantageous in their excellent handleability. Typically, when they are used in circuit boards, inspections on interconnections may be conducted more easily, and when the resulting circuit boards are assembled into devices, the positional relationship between components (parts) is more easily recognized. In another embodiment, multilayer assemblies employ colorless transparent bases made typically of PET or PEN, and other regions than interconnections are very highly transparent. Multilayer assemblies according to this embodiment enable formation of interconnections and circuits on a display screen itself, and this eliminates arrangement of a circuit board and helps to reduce the thickness of the display itself. Such a simplified structure helps to reduce cost.

Charging of a resin into pores of the porous layer to make the porous layer transparent in multilayer assemblies yields possibilities of applications of them to the above uses. To obtain such multilayer assemblies with excellent transparency, it is preferred that the porous layer contains a constitutive resin having a pale or light color; the porous layer has a small thickness; and the resin to be charged into pores has a pale or light color and is highly transparent.

On the other hand, displays such as plasma display panels (PDPs) emit electromagnetic waves which cause adverse effects (noise) of surrounding devices. To avoid or shield such electromagnetic waves, filters arranged on the front of PDPs should have electromagnetic shielding functions. Films bearing, for example, lattice-like or honeycomb (hexagonal) interconnections are used as such filters.

Electromagnetic shielding films for these uses generally structurally include a film having high transparency (highly transparent film) and a metal layer arranged on the film. These films may be prepared, for example, by a process of depositing a metal layer on a highly transparent film through sputtering; or a process of affixing typically copper foil onto a highly transparent film and carrying out etching to form a metal mesh. An exemplary electromagnetic shielding film includes one bearing a lattice-like pattern with a line width of 20 to 30 μm and a pitch (repeating interval) of about 200 to 400 μm.

According to an embodiment of the present invention, an electromagnetic shielding film of the above configuration may be provided by forming, for example, lattice-like or honeycomb (hexagonal) interconnections on the multilayer assembly, and charging a resin into pores. In this process, use of a printing process such as screen printing to provide interconnections may help to enable easy preparation of the film and reduce cost.

In addition, the interconnections can have higher transparency by printing with an indium tin oxide (ITO) ink that is a transparent conductor having a transmittance with respect to visible rays of about 90%. Exemplary indium tin oxide (ITO) inks for use herein include an indium tin oxide (ITO) ink supplied by C.I. Kasei Co., Ltd. and an indium tin oxide (ITO) ink "Nano-metal ink" supplied by ULVAC Materials, Inc. Use of transparent conductors gives possibilities of applying the composite materials to flat panel displays such as liquid crystal panels and organic EL panels; solar cells; and resistive touch panels. In another process for use herein, interconnections are formed by using a zinc oxide ink as another transparent conductor.

A composite material according to the present invention may have a configuration having pores of the porous layer remaining intact. As used herein the "composite material having pores of the porous layer remaining intact" means that the porous layer still has characteristic properties as a porous material, and more specifically, it typically means that the composite material retains a pore structure equivalent to that of the porous layer at the time when a conductor is formed by printing. The composite materials of this configuration may further include one or more other layers laminated, and/or may be subjected to treatments of every kind, within such ranges that the porous layer can retain characteristic properties as a porous material. The composite materials of this configuration include neither composite materials having resin-filled pores in its porous layer nor composite materials having the porous layer losing its pore structure as a result typically of a treatment with a solvent.

Typically, resin charging is not conducted when pores of the porous layer should remain intact typically for providing a low dielectric constant. However, interconnections alone may be coated with a resin according to the above exemplified process, in order to protect the interconnections, to insulate the interconnections, to prevent oxidation of the interconnections, and to improve flexibility thereof.

A composite material according to another embodiment of the present invention may have a configuration in which the porous layer loses its pore structure as a result of treatment with a solvent, instead of the above configuration. Specifically, the porous structure may be lost by wetting the porous layer, after forming a pattern of interconnections thereon, with a solvent to swell or soften with the solvent, and drying.

When the porous layer has an increased porosity or has reduced pore diameters in multilayer assemblies according to the present invention, the porous layer portion may have lower strength or may have reduced adhesion with the base due to its porous structure. Losing of the porous structure according to the above process may help for the porous layer portion to have higher strength and to have increased adhesion with the base. In addition, losing of the porous structure may help to suppress irregular reflection of visible rays and make the resulting material transparent.

Composite materials according to this embodiment can also be applied to uses for facilitating inspections, for enabling easy recognition of positions of components, for forming display interconnections, or for forming electromagnetic shielding films, for the same reasons as in the charging of a resin into porous portions (pores).

The transparent porous layer is realized typically by wetting a multilayer assembly bearing interconnections with a solvent to make the porous layer portion swell and soften with the solvent, and then drying the porous layer to thereby eliminate the porous structure of porous layer portion. The wetting of the multilayer assembly with a solvent may be conducted by dipping or spraying with a spray. The drying after wetting with a solvent may be conducted by air drying or heating. This procedure may be selected in consideration typically of the boiling point of the solvent. For yielding a homogenously transparent porous layer, the drying is preferably conducted slowly or gradually.

A solvent suitable for the elimination of the porous structure may vary depending on the resin constituting the porous layer and may not be automatically defined, but any solvent will do, as long as it makes the resin constituting the porous layer swell or soften. However, solvents that completely dissolve the resin of the porous layer therein and make the porous layer creep (flow) are undesirable and should be avoided. This is because the pattern of interconnections formed on the porous layer will break down. The solvent is not necessary a single type and may be a mixture of solvents of two or more types. Such a solvent mixture is preferable for achieving swelling or softening at an adequate level.

Typically, polyamideimides usable for the porous layer are insoluble in most of solvents but are soluble in some polar solvents such as NMP, DMF, DMSO, and DMAc. If a multilayer assembly is wetted with one of these polar solvents alone, the porous layer dissolves and the pattern of interconnections breaks down. However, the porous layer can swell or soften with a mixture of one of these polar solvents with another solvent that is miscible with these polar solvents and does not dissolve the porous layer (e.g., water, acetone, tetrahydrofuran (THF), methanol, ethanol, IPA, or methyl ethyl ketone).

In such a solvent mixture system, drying can also be conducted in two stages. Typically, in a possible procedure, a low-boiling-point solvent (e.g., water, acetone, THF, methanol, ethanol, IPA, or methyl ethyl ketone) is first dried at room temperature (air drying) or at relatively low temperatures, and a high-boiling-point solvent (e.g., NMP, DMF, DMSO, or DMAc) is then dried typically with a dryer at high temperatures. The conditions of temperature and duration of final drying may be selected so that the high-boiling-point solvent can sufficiently evaporate. In another possible procedure, the temperature is slowly elevated from room temperature. In uses requiring high transparency, such as in displays, it is preferred that the porous layer uses a resin that is more colorless and has higher transparency; the porous layer has a thickness as small as possible; and the base employs a highly transparent material, such as PET or PEN.

When the porous layer swell or soften with a solvent to eliminate the porous structure, the base of a multilayer assembly is preferably made from a material that is insoluble or sparingly soluble in the solvent to be used. This is because, if the base swell or soften with the solvent as with the porous layer, the base may deform to thereby have poor dimensional stability for use in or as a circuit board. Unsuitable solvents with respect to materials for the base may vary depending on the type of the base and may not be automatically defined. However, PETs, PENs, and polyimides are suitable as materials for the base, because they are insoluble or sparingly soluble in most of solvents.

As is described in charging of a resin to the porous layer, formation of interconnections with an ink of indium tin oxide (ITO) or zinc oxide as a transparent conductor helps to give further increased transparency, and the resulting composite material can be applied to uses requiring such characteristic properties (higher transparency). The above process eliminates the porous structure makes the porous layer transparent. In this case, however, interconnections might remain naked (uninsulated); and it is desirable to cover the interconnections with a resin as mentioned above or with an anisotropically conductive material (anisotropically conductive film or anisotropically conductive paste), or to arrange a cover lay on the interconnections, so as to establish reliable insulation.

A circuit board is generally bonded with another component or base typically through a solder or a connector, for the conduction of electricity. The junctions between them should therefore be masked before resin charging or the interconnections should be covered with a resin out of the junctions. Exemplary resins for use herein include the curable resins and soluble resins exemplified as resins to be charged into pores of the porous layer.

The circuit boards may bear interconnections alone, but they may further bear any of other components such as semiconductor chips, capacitors, and resistors, bonded thereto typically through soldering or wire bonding, as in tape automated bonding (TAB) technology or chip on film (COF) technology. In addition, formation of interconnections and packaging of components may be conducted on one or both sides of the multilayer assembly. It is also possible to stack two or more circuit boards to give a multilayer circuit board.

Composite materials according to an embodiment of the present invention may further include a cover lay arranged on the porous layer. Typically, in the case of flexible bases (flexible boards), interconnections are generally frequently covered with a cover lay made of a resinous film such as a polyimide film or PET film, for the purposes of protecting the interconnections, insulating the interconnections, preventing the interconnections from oxidation, and improving the flexibility thereof. Exemplary films for use as cover lays include "NIKAFLEX" supplied by Nikkan Industries Co., Ltd. and a product supplied by Arisawa Manufacturing Co., Ltd.

Exemplary processes for the lamination of a cover lay include a process of covering the porous layer directly with a cover lay such as a polyimide film immediately after resin charging to the porous layer; and a process of carrying out thermal compression bonding of a cover lay film to the porous layer after charging and curing of a resin, which cover lay film is composed of a cover lay of a polyimide film or PET film and an adhesive arranged on one side of the cover lay. The adhesive in the cover lay film can be a known adhesive, and it is often in a state of semi-curing (B-stage) for easy handling.

A cover lay is not always necessary and can be omitted when charging of a resin to the porous layer and/or covering of interconnections with a resin is enough for protecting the interconnections, insulating the interconnections, preventing the interconnections from oxidation, and improving the flexibility thereof.

Reinforcing plates may be attached to circuit boards. Circuit boards according to the present invention have flexibility and are usable as flexible bases (flexible boards). Even in these uses, a reinforcing plate may be attached to a portion where mechanical strength or rigidity is required. Specifically, a reinforcing plate of a suitable material may be preferably attached to a portion to which a component will be mounted or which portion will be inserted into a connector. A material to be used as the reinforcing plate can be any one, as long as it matches the purpose, but a film as with the base of the circuit board or a material for a rigid printed board is generally often used. Exemplary reinforcing plates include polyester films, polyimide films, glass-epoxy substrates, phenol bases, paper-phenol bases, and metal sheets such as aluminum sheets and stainless steel sheets. As polyester films and polyimide films, those having a thickness of about 10 to 300 μm are generally used. As glass-epoxy substrates, phenol bases, and paper phenol bases, those having a thickness of about 0.1 to 3 mm are widely used. In contrast, metal sheets having any thickness will do. The way how the circuit board and a reinforcing plate are bonded to each other is not particularly limited. Typically, they may be bonded through a film-like adhesive. Exemplary adhesives include pressure-sensitive adhesives and thermosetting adhesives. In another way, a reinforcing plate coated with an adhesive is affixed to the circuit board before use.

As is described above, the circuit board can freely employ any combination of a rigid portion and a flex portion (flexible portion) and is usable as a kind of rigid/flexible (rigid/flex) base.

A circuit board according to an embodiment of the present invention includes a porous film layer having a large number of uniformly dispersed continuous micropores; and conductive interconnections arranged on at least one side of the porous film layer. The circuit board suffers from no loss of conductive interconnections having widths of, for example, 50 to 200 μm, when examined in a peeling test (180-degree peeling, at a peel rate of 50 mm/min) with a cellophane pressure-sensitive adhesive tape [supplied by Nichiban Co., Ltd. under the trade name of "Cellotape (registered trademark) No. 405," 24 mm wide]. The peeling test may employ, instead of the "Cellotape (registered trademark) No. 405," a cellophane pressure-sensitive adhesive tape having an adhesive strength (adhesive strength) equivalent thereto (4.00 N/10 mm), as the pressure-sensitive adhesive tape.

In another embodiment, the present invention further provides a circuit board (wiring board) which includes a porous film layer having a large number of continuous micropores; and conductive interconnections arranged on at least one side of the porous film layer, in which the circuit board suffers from no loss of conductive interconnections having widths of, for example, 50 to 200 μm, when examined in a peeling test (180-degree peeling, at a peel rate of 50 mm/min) with a paper pressure-sensitive adhesive tape [supplied by Nichiban Co., Ltd. under the trade name of "Paper Pressure-sensitive Adhesive Tape No. 208," 24 mm wide]. The tape peeling test may employ, instead of the "Paper Pressure-sensitive Adhesive Tape No. 208," a paper pressure-sensitive adhesive tape having an adhesive strength equivalent thereto (1.7 N/10 mm), as the paper pressure-sensitive adhesive tape.

These circuit boards according to the present invention have conductive interconnections arranged on a surface of a porous film layer having a large number of continuous micropores. The multiplicity of micropores help to anchor the conductive interconnections to thereby give high adhesion of interconnections. The multiplicity of micropores further help to prevent dispersion typically of an ink (i.e., to prevent feathering of lines) upon formation of conductive interconnections. This helps to reduce widths of interconnections and provide a fine pattern of interconnections. Specifically, the interconnections have both high adhesion and high depictability simultaneously, to provide finer pitches. Typically, the circuit boards suffer from substantially no loss (deletion) of interconnections when examined in the tape peeling test, and in addition, they show very little changes in electric resistance after the tape peeling test. More specifically, when circuit boards according to the present invention have a resistance before the tape peeling test of $R_1$ and a resistance after the tape peeling test of $R_2$, the ratio of $R_2$ to $R_1$ ($R_2/R_1$) is generally less than 5, preferably less than 3, and more preferably less than 1.5. Additionally, when ink-jet printing is conducted on the circuit boards according to the present invention with 30 pl of a conductive ink, the dot size may generally be 200 μm or less.

The average pore diameter (average pore diameter of film surface) of the porous film layer is preferably 0.01 to 10 μm, more preferably 0.05 to 5 μm, and particularly preferably 0.1 to 2 μm. When conductive interconnections are formed typically by printing, a porous film layer, if having an excessively small pore size, may not provide sufficient permeability with respect typically to an ink and may often cause reduced adhesion of interconnections. When conductive interconnections are formed typically by printing, a porous film layer, if having an excessively large pore size, may anchor an ink, for example, insufficiently to often cause reduced adhesion of interconnections. In addition, it may cause ink diffusion and line feathering, and the resulting interconnections may not be depicted satisfactorily. Such a porous film layer may often show reduced mechanical strength to cause deformation. When a porous film layer has an average pore diameter within the above-specified range, the porous film layer smoothly absorbs and effectively anchors, for example, an ink. This helps to give very high adhesion of interconnections and to suppress dispersion typically of the ink, thus interconnections can be depicted thereon very satisfactorily. Thus, in another embodiment, the present invention further provides a circuit board which includes a porous film layer having a large number of continuous micropores; and conductive interconnections arranged on at least one side of the porous film layer, in which the porous film layer has an average pore diameter of 0.01 to 10 μm, and the conductive interconnections are printed conductive interconnections (conductive interconnections formed by printing).

When conductive interconnections are formed by printing on a base that is not porous but compact (dense), the base does not absorb, for example, an ink, to give low adhesion between the base and the resulting interconnections. Additionally, the ink diffuses on the base surface, and feathering of lines often occurs, and it is difficult to form fine interconnections. When conductive interconnections are formed on a water-repellent base by printing, the base surface repels typically an ink to fail to draw lines.

The porosity of the porous film layer is, for example, 30% to 80%, preferably 40% to 80%, and more preferably 50% to 80%. A porous film layer having an excessively low porosity may show insufficient permeability with respect typically to an ink and may often cause reduced adhesion of interconnections, when conductive interconnections are formed by printing. In contrast, a porous film layer having an excessively high porosity may show poor mechanical strength. The rate of open area of the surface of the porous film layer (rate of open area in surface) is, for example, about 48% or more (e.g., about 48% to 80%), and preferably about 60% to 80%. A porous film layer having an excessively low rate of open area in surface may show insufficient permeability with respect typically to an ink and may often cause reduced adhesion of interconnections, when conductive interconnections are formed by printing. In contrast, a porous film layer having an excessively high rate of open area in surface may often show reduced mechanical strength.

The thickness of the porous film layer is, for example, to 100 μm. When the base (substrate) of the circuit board includes a porous film layer alone, the thickness of the porous film layer is, for example, 5 to 100 μm, and more preferably 25 to 70 μm. When the base of the circuit board is an assembly of a dense layer and a porous film layer, the thickness of the porous film layer is, for example, 0.1 to 100 μm, preferably 0.5 to 70 μm, and more preferably 1 to 50 μm. A porous film layer having an excessively small thickness may be difficult to produce stably. In contrast, a porous film layer having an excessively large thickness may be difficult to have a uniformly controlled distribution of pore diameters. The thickness of the porous film layer is preferably two times or more, and more preferably ten times or more the average pore diameter.

Micropores on both sides of a porous film layer may differ in pore properties such as average pore diameters, because these micropores grow under different conditions upon the formation of the porous film layer. When micropores on one side of the porous film layer have an average pore diameter of A1 and micropores on the other side have an average pore diameter of A2, A1 and A2 preferably satisfy the condition: $0.1 \leq A1/A2 \leq 10$, and more preferably satisfy the condition: $0.2 \leq A1/A2 \leq 5$, from the viewpoint of balance between their pore properties.

Exemplary indexes for expressing the continuity of micropores in the porous film layer include a Gurley permeability indicating gas permeability, and a pure water permeation rate. The Gurley permeability of the porous film layer is, for example, 0.2 to 2000 seconds/100 cc, preferably 1 to 1000 seconds/100 cc, and more preferably 1 to 500 seconds/100 cc. A porous film layer having an excessively high Gurley permeability may show insufficient practical permeation performance or may not be filled with a functional material sufficiently to exhibit its function. In contrast, a porous film layer having an excessively low Gurley permeability may possibly show insufficient mechanical strength.

When one side of the porous film layer bearing conductive interconnections has an average pore diameter of A, and the conductive interconnections have a width of W, the ratio of W to A (W/A) is preferably 5 or more, more preferably 10 or more, and particularly preferably 50 or more. If the ratio W/A is less than 5 and when conductive interconnections are formed typically by printing, an ink, for example, may not be anchored sufficiently to thereby adversely affect adhesion of interconnections, or the ink may diffuse to cause line feathering and the resulting interconnections may be often depicted unsatisfactorily.

The width W of the conductive interconnections is, for example, 200 μm or less (e.g., 10 to 200 μm), preferably 150 μm or less (e.g., 10 to 150 μm), and more preferably 100 μm or less (e.g., 10 to 100 μm). The circuit boards according to the present invention excel in depictability of interconnections and can have a dot size of 200 μm or less when printing is conducted typically with 30 pl of a conductive ink. Thus, they can yield conductive interconnections having narrow widths as described above. Additionally, even when they bear conductive interconnections having such narrow widths, they are resistant to delamination of interconnections, because the interconnections adhere satisfactorily.

A material (raw material) constituting the porous film layer is not particularly limited, as long as it has insulating properties, but is preferably a resin. Exemplary resins include polyimide resins, polyamideimide resins, poly(ether sulfone) resins, poly(ether imide) resins, polycarbonate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, and acrylic resins. From the viewpoints of thermal stability and excellent mechanical strength, chemical resistance, and electric properties, exemplary preferred resins are polyimide resins, polyamideimide resins, poly(ether sulfone) resins, poly(ether imide) resins, polycarbonate resins, aromatic polyamide resins, polyamide resins, polybenzoxazole resins, polybenzimidazole resins, polysulfone resins, and cellulosic resins; of which polyamideimide resins, poly(ether imide) resins, polycarbonate resins, and poly(ether sulfone) resins are more preferred. Such resins may also be copolymers and graft polymers. Each of these materials can be used alone or in combination. The porous film layer may be coated with a chemical-resistant polymeric compound on its layer surface and inner surfaces of pores.

The porous film layer can be used alone as a base (substrate) for conductive interconnections. In another embodiment, the porous film layer is arranged on one or both sides of a dense layer having substantially no pore to form an assembly, and this assembly is used as a base for conductive interconnections. Use of an assembly of this type helps to increase the mechanical strength of the base.

The porous film layer for use herein preferably has specific surface properties to facilitate absorption typically of an ink when conductive interconnections are formed thereon by printing. This is because such facilitated ink absorption may help to provide excellent adhesion of interconnections, to prevent or suppress diffusion of the ink and resulting line feathering on the surface, and to facilitate the formation of fine interconnections. In a preferred embodiment from these viewpoints, the porous film layer is composed of a layer that shows a contact angle θ of 30 degrees or less within 1000 msec after 1μ of a solution having a viscosity of 0.00001 to 1 Pa·s is dropped onto the layer surface. In a more preferred embodiment, the porous film layer is such a layer that after 1μ of a solution having a viscosity of 0.00001 to 1 Pa·s is dropped onto the layer surface, the layer shows a contact angle of $\theta_{100}$ upon a lapse of 100 msec and a contact angle of $\theta_{1000}$ upon a lapse of 1000 msec, and the ratio of $\theta_{1000}$ to $\theta_{100}$ ($\theta_{1000}/\theta_{100}$) is less than 0.9. In a further preferred embodiment, the layer further shows a contact angle $\theta_{1000}$ of 60 degrees or less, in addition to these characteristic properties. Exemplary solutions having a viscosity of 0.00001 to 1 Pa·s include those mentioned as solvents in the after-mentioned printing ink or paste.

Exemplary embodiments of circuit boards according to the present invention include those illustrated in FIGS. 2 to 6. FIGS. 2 to 6 are schematic cross-sectional views illustrating circuit boards as embodiments according to the present invention. In these figures, the reference numeral 1 stands for a porous film layer, 2 stands for conductive interconnections, and 3 depicts a dense layer. FIG. 2 illustrates a circuit board including a porous film layer 1 and conductive interconnections 2 arranged on one side of the porous film layer 1; FIG. 3 illustrates a circuit board including a porous film layer 1 and conductive interconnections 2 arranged on both sides of the porous film layer 1; FIG. 4 illustrates a circuit board including a dense layer 3, a porous film layer 1 arranged on one side of the dense layer 3, and conductive interconnections 2 arranged on a surface of the porous film layer 1; FIG. 5 illustrates a circuit board including a dense layer 3, porous film layers 1 arranged on both sides of the dense layer 3, and conductive interconnections 2 arranged on a surface of one of the two porous film layers 1; and FIG. 6 illustrates a circuit board including a dense layer 3, porous film layers 1 arranged on both sides of the dense layer 3, and conductive interconnections 2 arranged on surfaces of the two porous film layers 1, respectively. The circuit boards according to the present invention may further have vias (via interconnections).

When the conductive interconnections 2 are formed on a surface of the porous film layer 1, how the conductive interconnections 2 and the porous film layer 1 are: the conductive interconnections 2 dent into or penetrate the porous film layer 1, and the conductive interconnections 2 are almost entirely embedded in the porous film layer 1 as illustrated in FIG. 1(A) or 1(D) (embedded state); the conductive interconnections 2 partially dent into the porous film layer 1, and approximately half of the conductive interconnections 2 are embedded in the porous film layer 1 as illustrated in FIG. 1(B) or 1(E) (semi-embedded state); and the conductive interconnections 2 do not dent into the porous film layer 1 and are built-up on a surface of the porous film layer 1 as illustrated in FIG. 1(C) or 1(F) (built-up state). Among these states, the states illustrated in FIG. 1(A) and FIG. 1(B) are preferred from the point of adhesion of interconnections. In contrast, the state illustrated in FIG. 1(C) or 1(F) is preferred when the conductor should have a low electric resistance. The porous film layer for use herein has a large number of continuous micropores, and, when conductive interconnections are formed by printing typically through ink-jet printing, the resulting interconnections are often in the state illustrated in FIG. 1(A) or 1(D). In contrast, when conductive interconnections are formed by printing through screen printing, the resulting interconnections are often in the state illustrated in FIG. 1(B), 1(C), 1(E), or 1(F).

More specifically, when the porous layer has an average opening diameter in surface of R1, and the ink contains particles having an average particle diameter of R2, R1 is preferably within a range of about 0.01 to 10 μm, and R2 is preferably within a range of about 0.001 to 10 μm. Specifically, R1 and R2 preferably satisfy the following condition: $0.0001 \leq R2/R1 \leq 1000$.

In the case of ink-jet printing, the ink preferably has a low viscosity, and particles in the ink preferably have small diameters, so as to avoid clogging of nozzles with the ink. Accordingly, R1 is preferably about 0.01 to 5 μm, and R2 is preferably about 0.001 to 0.2 μm. Specifically, R1 and R2 preferably satisfy the condition: $0.0002 \leq R2/R1 \leq 20$.

In the case of screen printing, if the ink has an excessively low viscosity, it may be difficult to hold the ink on the screen. The ink therefore preferably has a somewhat high viscosity, and there is no problem when the particles in the ink have large particle diameters. When the ink contains particles having small diameters, the ink preferably contains a smaller amount of a solvent. Accordingly, R1 is preferably about 0.01 to 10 μm, and R2 is preferably about 0.001 to 10 μm. Specifically, R1 and R2 preferably satisfy the condition: $0.0001 \leq R2/R1 \leq 1000$.

Materials (raw materials) constituting the dense layer are not particularly limited, as long as they do not dissolve or significantly deform upon the formation of the porous film layer, but are preferably resins having insulating properties. Exemplary resins include polyimide resins, polyamideimide resins, poly(ether sulfone) resins, poly(ether imide) resins, polycarbonate resins, polyarylate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, acrylic resins, poly(ethylene terephthalate) resins, poly(ethylene naphthalate) resins, poly(butylene terephthalate) resins, poly(ether ether ketone) resins, fluorocarbon resins, olefinic resins, styrenic resins, vinyl chloride resins, and other resins. Such resins may also be copolymers and graft polymers. Each of these materials can be used alone or in combination.

The thickness of the dense layer is, for example, 1 to μm, preferably 5 to 100 μm, and more preferably 5 to 50 μm. A dense layer having an excessively small thickness may be difficult to handle. In contrast, a dense layer having an excessively large thickness may have insufficient flexibility.

A porous film layer in circuit boards according to the present invention may be formed through phase inversion. Typically, a porous film layer may be formed through wet phase inversion in which a solution mixture containing a material (resin component) constituting the porous film layer, a water-soluble polymer, a polar solvent, and, where necessary, water is cast onto a solid base (homogeneous base) to form a cast film, and the cast film is introduced into a coagulation bath. The material (resin component) constituting the porous film layer is preferably one that is soluble in a water-miscible polar solvent and is capable of forming a film through phase inversion. Specifically, the resins exemplified as resins constituting the porous film layer are usable herein. Instead of these resins, precursors thereof, such as monomer components (starting materials) of the resins and oligomers thereof, are also usable. Typically, when a porous film layer of a polyimide resin is to be formed, a porous film composed of a desired polyimide resin may be obtained by preparing a porous film layer by the above procedure, except for using a polyamic acid as a precursor of the polyimide resin (polyimide precursor), and carrying out thermal imidation or chemical imidation of the porous film layer.

Addition of a water-soluble polymer and water to a polymer solution to be cast is effective to give a spongy and porous film structure. Exemplary water-soluble polymers include polyethylene glycols, polyvinylpyrrolidones, poly(ethylene oxide)s, poly(vinyl alcohol)s, poly(acrylic acid)s, polysaccharides, derivatives of these, and mixtures of them. Among them, polyvinylpyrrolidones are preferred, because they may help to suppress void formation within the film and to increase the mechanical strength of the film. Each of these water-soluble polymers may be used alone or in combination. From the viewpoint of yielding a porous structure, the molecular weight of the water-soluble polymer is, for example, about 200 or more, preferably about 300 or more, more preferably about 400 or more (e.g., about 400 to $20 \times 10^4$), and particularly preferably about 1000 or more (e.g., about 1000 to $20 \times 10^4$).

Among these components, the water-soluble polymer is very effective to make the film structure spongy and is an important additive, since varying the type and amount of the water-soluble polymer gives a variety of structures. However, the water-soluble polymer becomes an unnecessary component ultimately and will be removed by washing or rinsing when the cast film is immersed typically in water to coagulate the cast film into a porous layer. In contrast, when a porous structure is formed by dry phase inversion, insoluble components should be basically removed by heating, and this may reject the addition of a water-soluble polymer. Consequently, it can be said that it is difficult to form a variety of porous structure by dry phase inversion.

The polar solvent can be selected from those having solubility with respect to the chemical skeleton of the resin to be used (good solvent for the resin). Exemplary good solvents typically for polyamideimide resins, polyamic acids, poly(ether imide) resins, and polycarbonate resins include dimethylacetamide (DMAc), N-methyl-2-pyrrolidone (NMP), N,N-dimethylformamide, NMP/xylene, NMP/xylene/methyl ethyl ketone, ethyl alcohol/toluene, dimethyl sulfoxide, and 2-pyrrolidone. Each of these polar solvents can be used alone or in combination.

Exemplary preferred polymer solutions to be cast include solution mixtures each containing 8 to 25 percent by weight of a polymer component as a material for constituting the porous film layer, 10 to 50 percent by weight of a water-soluble polymer, 0 to 10 percent by weight of water, and 30 to 82 percent by weight of a water-miscible polar solvent.

A polymer solution, if having an excessively low concentration of a polymer (polymer component) mainly constituting the porous film layer, may cause insufficient strength of the resulting film. In contrast, a polymer solution, if having an excessively high concentration thereof, may cause a low porosity of the film. The water-soluble polymer is added to the polymer solution so as to give a film having a homogeneous spongy porous inside structure. If the concentration thereof is excessively low, huge voids of exceeding about 10 μm may occur in the film to reduce homogeneity. If it is excessively high, the water-soluble polymer may not dissolve satisfactorily. The amount of water can be used to adjust the diameters of voids (pore diameter), and the diameters of voids may increase with an increasing amount of water.

Exemplary materials (raw materials) for the solid base used in flow casting of the polymer solution include the resins exemplified as materials (raw materials) for constituting the dense layer; as well as glass. Exemplary solid bases further include composite films or sheets each containing two or more different materials in surface and core thereof, respectively. Such composite films or sheets may be prepared by affixing different films or sheets with each other, or by a surface treatment such as coating, vapor deposition, or sputtering. Exemplary solid bases further include those subjected to a surface treatment such as adhesion promoting treatment, antistatic treatment, sandblasting, and/or corona discharge treatment. When the solid base used herein is used as intact as a dense layer constituting a circuit board, it is preferred to selectively use a material having affinity for the material constituting the porous film layer (e.g., a resin having a monomer unit of similar type), or to use a resinous base which has been subjected to a surface treatment such as adhesion promoting treatment and/or corona discharge treatment.

Conditions for flow casting of the polymer solution into a film are preferably such that relative humidity is 70% to 100% (preferably 90% to 100%) and a temperature is 15° C. to 90° C. (preferably 30° C. to 80° C.); and more preferably such that relative humidity is about 100% (e.g., 95% to 100%) and a temperature is 40° C. to 70° C. If the water content (moisture content) in air is less than the above-specified range, there may occur a low rate of open area in surface. When the polymer solution is cast into a film, the cast film is preferably held in an atmosphere at a temperature of 15° C. to 90° C. and relative humidity of 70% to 100% for 0.2 to 15 minutes before being introduced into a coagulation bath composed of a nonsolvent for the polymer component. Holding the cast film (film-like cast article) under the above conditions helps to make the resulting porous film layer homogeneous and highly continuous. This is probably because holding the cast film under such humidified conditions may help water to migrate from the surface toward inside of the film to thereby accelerate phase separation of the polymer solution efficiently.

The coagulation bath (coagulation liquid) for use in phase inversion can be any solvent that coagulates the polymer component and may be selected suitably according to the type of a resin used as the polymer component. Typically, exemplary coagulation baths as solvents that coagulate polyamideimide resins, polyamic acids, poly(ether imide) resins, and polycarbonate resins include water-miscible or -soluble coagulation baths such as water; alcohols including monohydric alcohols such as methanol and ethanol, and polyhydric alcohols such as glycerol; water-soluble polymers such as polyethylene glycols; and mixtures of these.

When the solid base is used as a dense layer, a porous film deposited or precipitated as a result of introduction into a coagulation bath is subjected to drying as intact, to give an assembly (base for a circuit board) including a dense layer and a porous film layer. An assembly having porous film layers arranged on both sides of a dense layer can be prepared by forming a porous film layer on one side of the dense layer and conducting the same procedure again. In another embodiment, a porous film layer alone may be obtained by transferring a porous film, deposited as a result of introduction into a coagulation bath, from the solid base to a support and drying the transferred porous film. This porous film layer is usable alone as a base for a circuit board. The support is preferably one made of a material being resistance to the coagulation bath and having a large number of micropores in a surface to be in contact with the film, for yielding a higher drying rate. Among such supports, more preferred is one having such a permeability as to allow the coagulation solvent (coagulation bath) to permeate therethrough at an appropriate rate. Exemplary supports may have a gas permeability of less than 1000 seconds/100 cc (preferably less than 100 seconds/100 cc) and a film thickness of 5 to 1000 μm (preferably 50 to 500 μm) and may include holes (pores) that penetrate the film in its cross-sectional direction, have sizes of 0.01 to 10 μm (preferably 0.03 to 1 μm), and are dispersed at a sufficient density. Specifically, exemplary usable supports include nonwoven fabrics or porous films made from materials including polyesters, polyamides, polyolefins such as polyethylenes and polypropylenes, celluloses, and Teflon (registered trademark). It is also possible to laminate the resulting porous film as a single layer onto a separately-prepared dense layer according to a common film lamination procedure or device typically using an adhesive, to give an assembly (base for a circuit board) including a dense layer and a porous film layer arranged on one or both sides of the dense layer.

The porous film (layer) formed by the above method may further be subjected to a polymerization or cross-linking (curing) process typically with heat, visible rays, ultraviolet rays, electron beams, or radiations, for the purpose of polymerizing precursor or improving the chemical resistance. Typically, as is described above, a film formed from a polyimide precursor may further be subjected typically to thermal imidation or chemical imidation to yield a porous film layer composed of a polyimide resin. A porous film layer formed typically from a polyamideimide resin may be subjected to thermal cross-linking. The porous film (layer) may further be coated with a chemical-resistant coat on the film surface and inner surfaces of pores by immersing in a solution of a chemical-resistant polymer and then drying. Exemplary chemical-resistant polymers include phenolic resins, urea resins, melamine resins, benzoguanamine resins, polyimide resins, epoxy resins, benzoxazine resins, polypropylene resins, polyurethane resins, fluorocarbon resins, alkyd resins, cellulose acetate resins, phthalic acid resins, maleic acid resins, silicone resins, triazine resins, furan resins, polyester resins, xylene resins, poly(vinyl alcohol)s, ethylene-vinyl alcohol copolymers, chitins, and chitosans.

The above-mentioned method gives a porous film (layer) which has a large number of uniformly dispersed continuous micropores and is composed of a resin such as a polyamide-imide resin, a poly(ether imide) resin, or a polycarbonate resin, in which the porous film layer has an average pore diameter of micropores of 0.01 to 10 μm, a porosity of 30% to 80%, and a thickness of 0.1 to 100 μm.

The porous film layer may have desired diameters of micropores, porosity, and rate of open area by suitably selecting the types and amounts of components of the polymer solution, the amount of water in the polymer solution, the humidity, temperature, and time period upon flow casting, the type of the solid base used in flow casting, and the type of, if employed, aftertreatment, as is described above.

Circuit boards according to the present invention may be produced, for example, by forming conductive interconnections on at least one side of a porous film layer having a large number of continuous micropores with an average pore diameter of 0.01 to 10 μm, which porous film layer may be obtained, for example, as above. This porous film layer is preferably a resinous layer formed through phase inversion (resinous phase inversion layer), and is more preferably a resinous layer formed through wet phase inversion as above. The porous film layer alone may work as a base for a circuit board, as is described above. In another embodiment, such a porous film layer having an average pore diameter of 0.01 to 10 μm may be arranged on one or both sides of a dense layer having substantially no pore to give an assembly, and this assembly may also be used as a base for a circuit board.

The process of forming conductive interconnections on a surface of the porous film layer is not particularly limited, but is preferably a printing process. Exemplary printing processes include, but are not limited to, relief printing (flexographic printing), ink-jet printing, screen printing, offset printing, sublimation (heat-fusion) printing, thermal printing, gravure printing, laser beam printing, paste drawing (paste printing), and nanocontact printing. These printing processes may be conducted according to known or common procedures.

Representative processes for forming conductive interconnections by printing include processes of printing a conductive ink or conductive paste onto the porous film layer, such as (1) a process of applying a conductive ink onto a surface of the porous film layer through ink-jet printing to form conductive interconnections; (2) a process of applying a conductive ink to a printing plate with relief and/or intaglio corresponding to a pattern of interconnections and transferring this to a surface of the porous film layer to form conductive interconnections; (3) a process of extruding, from a syringe, a conductive paste into a pattern of interconnections onto the surface of the porous film layer to form to form conductive interconnections; and (4) a process of applying a conductive paste in a pattern of interconnections to the surface of the porous film layer through screen printing to form conductive interconnections.

Exemplary conductive inks include, but are not limited to, gold inks, silver inks, silver Nano-metal inks, copper inks, carbon inks, and silver-carbon inks. Exemplary conductive pastes usable herein include, but are not limited to, silver conductive pastes, copper conductive pastes, gold conductive pastes, palladium conductive pastes, palladium-silver conductive pastes, platinum conductive pastes, platinum-silver conductive pastes, and nickel conductive pastes. These processes may further include the step of plating the formed conductive interconnections according to a common procedure.

Other representative processes for forming conductive interconnections by printing include processes of printing a catalyzer (plating catalyst) onto the porous film layer and then carrying out plating, such as (5) a process of applying a catalyzer (plating catalyst) to a surface of the porous film layer through ink-jet printing to form a pattern of interconnections, and thereafter carrying out plating to form conductive interconnections; (6) a process of applying a catalyzer to a printing plate with relief and/or intaglio corresponding to a pattern of interconnections, transferring this to the surface of the porous film layer, and thereafter carrying out plating to form conductive interconnections; (7) a process of extruding, from a syringe, a catalyzer into a pattern of interconnections onto the surface of the porous film layer, and thereafter carrying out plating to form conductive interconnections; and (8) a process of applying a catalyzer in a pattern of interconnections to the surface of the porous film layer through screen printing, and thereafter carrying out plating to form conductive interconnections.

Exemplary catalyzers usable herein include salts of metals that act as catalysts in electroless plating. Specific exemplary catalyzers include hydroxycarboxylic acid salts (e.g., citrates and tartrates) or inorganic salts (e.g., sulfates and hydrochlorides) of metals selected from copper-group elements including gold, silver, and copper; platinum-group elements such as palladium and platinum; and iron-group elements such as nickel. Printing of a catalyzer may be carried out, for example, by preparing an ink containing the catalyzer, a suitable vehicle, and other components such as additives according to necessity, and printing the ink through a suitable printing process. The printed catalyzer is subjected to reduction into a metal, and electroless plating, where necessary subsequent electroplating (electrodeposition), is conducted to form conductive interconnections. The reduction of the catalyzer may employ a reducing agent. Exemplary reducing agents include hypophosphorous acid and salts thereof, hydrazine and salts thereof, borohydride compounds, aminoborane compounds, glucose, and formaldehyde. The reduction process may be carried out, for example, with a 0.5 to 10 percent by weight aqueous solution of a reducing agent at a temperature ranging from room temperature to about 50° C. The electroless plating process may be carried out according to a known procedure typically with an electroless copper plating bath or electroless nickel plating bath. The electroplating (electrodeposition) process may also be carried out according to a known procedure typically with copper sulfate.

Printing inks or pastes for use in printing may be inks or pastes each containing at least a solid material (solid matter) and a solvent. Among them, preferred are printing inks or pastes each containing, as a main solvent, such a liquid that whose contact angle with a surface of the porous film layer becomes 60 degrees or less (more preferably 50 degrees or less, and further preferably 40 degrees or less) within 300 msec after dropping a droplet (1 µl) of the liquid onto the surface of the porous film layer; of which more preferred are those containing, as a main solvent, such a liquid that whose contact angle with a surface of the porous film layer becomes 60 degrees or less (more preferably 50 degrees or less, and further preferably 40 degrees or less) within 300 msec after dropping a droplet (1 µl) of the liquid onto the surface of the porous film layer, and that the droplet has a radius of 1600 µm or less (preferably 1500 µm or less, and more preferably 1400 µm or less) upon a lapse of 300 msec after the dropping. When such a printing ink or paste is used, the solvent in the printing ink or paste is immediately absorbed by pores of the porous film layer, the ink or paste thereby has an increased viscosity to lose fluidity, and the solid material in the ink or paste remains on a surface of the porous film layer. This gives a printed article that excels in fine-line depictability without suffering from bleeding.

The solid material (solid matter) in the printing ink or paste may be selected typically from known inorganic materials and organic materials, according to the purpose such as formation of interconnections or inductors, luminous elements, resistors, capacitors, or semiconductors (semiconductor devices). Exemplary inorganic materials include metals such as gold, silver, copper, nickel, and aluminum; glass; inorganic electroluminescent materials such as ZnS, Mn/CdSSe, ZnS:TbOF, ZnS:Tb, SrS:Ce, $(SrS:CeZnS)_n$, $CaCa_2S_4$:Ce, $SrGa_2S_4$:Ce, and SrS:Ce/ZnS:Mn; carbon; and other inorganic materials including ceramic materials such as silica and zirconia. Exemplary organic materials include organic pigments; conductive polymers; and organic semiconductive materials such as pentacenes and thiophenes. The solid material may have any shape or form, as long as not adversely affecting the printability, and exemplary solid materials usable herein may be in a variety of forms such as particles, flakes, fibers, scales, hollow particles, or hollow fibers.

Solvents for use in a printing ink or paste may be suitably selected according typically to the type of a resin in the printing ink or paste, and exemplary solvents include hydrocarbon solvents, halogenated hydrocarbon solvents, alcohol solvents, phenolic solvents, ketone solvents, fatty acids/acid anhydrides, ester solvents, nitrogen-containing/sulfur-containing polar solvents, and water. Specific exemplary solvents include toluene, terpineol, decahydronaphthalene, tetradecane, decanol, diethylene glycol monoethyl ether, diethylene glycol monobutyl ether, ethylene glycol monomethyl ether, ethylene glycol monoethyl ether, diethylene glycol monomethyl ether, triethylene glycol monomethyl ether, propylene glycol monomethyl ether, dipropylene glycol monomethyl ether, propylene glycol monopropyl ether, dipropylene glycol monopropyl ether, ethylene glycol monoisopropyl ether, diethylene glycol monoisopropyl ether, ethylene glycol monobutyl ether, diethylene glycol monobutyl ether, triethylene glycol monobutyl ether, propylene glycol monobutyl ether, dipropylene glycol monobutyl ether, ethylene glycol monoisobutyl ether, diethylene glycol monoisobutyl ether, ethylene glycol monohexyl ether, diethylene glycol monohexyl ether, ethylene glycol mono-(2-ethylhexyl)ether, ethylene glycol monoallyl ether, ethylene glycol monophenyl ether, ethylene glycol dimethyl ether, diethylene glycol dimethyl ether, diethylene glycol diethyl ether, diethylene glycol dibutyl ether, triethylene glycol dimethyl ether, diethylene glycol monobutyl ether acetate (butyl Carbitol acetate), terpineol, diethylene glycol monobutyl ether acetate, butanol, propanediols, butanediols, pentanediols, ethylene glycol, glycerol, and water. Each of these solvents may be used alone or in combination. Technologies on ink solvents are disclosed typically in JP-A No. 2004-319281, JP-A No. 2004-111057, JP-A No. 2006-059669, and JP-A No. 2004-143325. Among these solvents, solvents having a viscosity of 0.00001 to 1 Pa·s are preferably used, for their good absorption by the porous film layer.

Printing inks or pastes having a viscosity of 0.05 to 1 Pa·s are preferably used as the printing ink or paste in printing. When a printing ink or paste of this type is used, the solvent in the printing ink or paste is immediately absorbed by pores of the porous film layer, and the solid material remains on a surface of the porous film layer, to give a printed article that excels in fine-line depictability without suffering from bleeding. The viscosity of the printing ink or paste can be adjusted by setting or varying the type and concentration of the solid material, the types and concentrations of resins and other additives, and/or the type of the solvent.

In the methods of producing circuit boards, according to the present invention, conductive interconnections are formed on at least one side of a porous film layer having a large number of continuous micropores with an average pore diameter of 0.01 to 10 µm. The multiplicity of micropores act to enable convenient and efficient production of circuit boards whose interconnections have high adhesion and can be depicted satisfactorily.

A printed article 1 according to an embodiment of the present invention includes a porous film layer and a print arranged on a surface of the porous film layer, the print containing at least a straight-line portion having an average line width of 10 to 1000 µm and a length of 500 µm or more, in which the printed article has a fluctuation F in line width of 30% or less, which fluctuation F is expressed by following Expression (1):

$$F = (L\text{Max} - L\text{Min})/L\text{Ave} \times 100 \quad (1)$$

wherein LAve represents an average line width of a straight-line portion in a length of 500 µm; LMax represents a maximum line width of the straight-line portion in a length of 500 µm; and LMin represents a minimum line width of the straight-line portion in a length of 500 µm.

A printed article 2 according to another embodiment of the present invention includes a porous film layer and a print arranged on a surface of the porous film layer, the print containing at least a straight-line portion having an average line width of 10 to 1000 µm and a length of 500 µm or more, in which the printed article has a standard deviation Σ in line width of 7 or less, which standard deviation Σ is expressed by following Expression (2):

$$\Sigma = \sqrt{(((L\text{Ave} - L\text{Max})^2 + (L\text{Ave} - L\text{Min})^2)/2)} \quad (2)$$

wherein LAve represents an average line width of a straight-line portion in a length of 500 µm; LMax represents a maximum line width of the straight-line portion in a length of 500 µm; and LMin represents a minimum line width of the straight-line portion in a length of 500 µm As used herein the "fluctuation F" and "standard deviation Σ" in line width are values as measured in a straight-line portion having an average line width of 10 to 1000 µm and a length of 500 µm or more. These are preferably values as measured in a straight-line portion having an average line width of 10 to 500 μm and a length of 500 μm or more; and more preferably values as measured in a straight-line portion having an average line width of 15 to 100 μm and a length of 500 μm or more. If the average line width is less than 10 μm, it may be difficult to print such a thin line. If it exceeds 1000 μm, the resulting interconnections may be excessively thick (wide) to increase the size of the entire circuit unpractically.

The maximum line width LMax and the minimum line width LMin may be determined based on an enlarged photograph of a straight-line portion of the printed article, having an average line width of 10 to 1000 μm and a length of 500 μm (see FIG. 11). The average line width LAve may be determined by tracing the line to a transparent film and calculating the average line width from the weight of the traced line. When a printed article has a fluctuation F of 30% or less or a standard deviation Σ of 7 or less, it may be determined as a superior print (interconnection) excellent in fine-line depictability (linearity). The fluctuation F is preferably 20% or less, and more preferably 10% or less. The standard deviation Σ is preferably 5 or less, and more preferably 3 or less. It is particularly preferred that both F and Σ are equal to or less than the specific values. When printing is carried out on a porous film layer, at the instant when a printing ink (paste) comes in contact with the porous film (porous membrane), the main solvent in an ink is absorbed by the porous film, thereby the ink has an increased viscosity and loses fluidity to avoid bleeding (diffusion) on the porous film. This enables depiction of straight lines excellent in fine-line depictability (linearity) using a variety of inks (pastes). In contrast, when printing is carried out on a regular PET film or PI film, the printing ink (paste) bleeds and spreads peripherally, and it is difficult to depict straight lines with good fine-line depictability (linearity).

A printed article 3 according to yet another embodiment of the present invention includes a porous film layer; and a print printed on a surface of the porous film from a printing plate, in which the printing plate has an opening width L1, the print has a corresponding printed width L2, and the ratio of L2 to L1 (L2/L1) is 0.8 to 1.2.

As used herein the "opening width L1" of a printing plate means, for example, a line width of a straight line when the printing plate has an opening in the form of the straight line, and it means a diameter of a circle when the printing plate has an opening in the form of the circle. In this connection, the shape of opening of the printing plate is not limited to straight line and circle, but may also be any shape such as a curved line, a polygonal shape such as triangle or rectangle, or an asterisk. The corresponding printed width L2 after printing may be determined based on an electron microscopic enlarged photograph. When a straight line is depicted, the average line width of a straight line having a length of 500 μm may be employed as the printed width L2. When it is difficult to directly measure the printed width L2 because typically of an uneven outline of the print, the printed width L2 may be determined by tracing the outline of the print to a transparent film, and calculating the printed width based on the weight of the traced film. Upper views in FIG. 4 are explanatory drawings showing the relationship between L1 and L2 when the printing plate has a straight-line opening; and lower views in FIG. 4 are explanatory drawings showing the relationship between L1 and L2 when the printing plate has a circular opening. When a printed article has a ratio L2/L1 within a range of 0.8 to 1.2, the printed article is determined to have a superior print (interconnection) excellent in printing/depicting reproducibility. The opening width L1 of the printing plate may range, for example, from 10 to 1000 μm, preferably from 10 to 500 μm, and more preferably from 15 to 100 μm.

The ratio L2/L1 is preferably within a range of 0.9 to 1.1. When printing is carried out on a porous film layer from a printing plate, at the instant when a printing ink (paste) comes in contact with the porous film (porous membrane), the main solvent in the ink is absorbed by the porous film, thereby the ink has an increased viscosity and loses fluidity to avoid bleeding (diffusion) on the porous film. This enables printing excellent in printing/depicting reproducibility using a variety of inks (pastes). In contrast, when printing is carried out on a regular PET film or PI film through a printing plate, the printing ink (paste) spreads peripherally upon the film surface, and it is difficult to carry out printing with good printing/depicting reproducibility.

Preferred porous film layers for use herein are those having a large number of uniformly dispersed continuous micropores (communicating micropores). In such porous film layers, preferably at least 10 μm deep from the outermost surface of the printed portion is homogeneously porous; more preferably at least 20 μm deep from the outermost surface of the printed portion is homogeneously porous; and particularly preferably the entire porous film layer is homogenously porous.

The average pore diameter (average pore diameter in film surface) of the porous film layer is preferably 0.01 to 20 μm (e.g., 0.01 to 10 μm), more preferably 0.5 to 15 μm, and particularly preferably 1 to 10 μm. A porous film layer having excessively small-sized pores may show insufficient permeability with respect to the printing ink, to often give a print with insufficient adhesion. A porous film layer having excessively large-sized pores may not so effectively anchor the ink. This may also often cause insufficient adhesion of the print, may cause ink diffusion and line feathering to often reduce straight-line depictability, and may reduce mechanical strength to often cause deformation. In contrast, a porous film layer having an average pore diameter within the above-specified range may smoothly absorb and effectively anchor the ink, to give a print with very high adhesion and to suppress the ink from diffusing to thereby give excellent fine-line depictability.

The porosity (percentage of voids) of the porous film layer is, for example, 30% to 80%, preferably 40% to 80%, and more preferably 50% to 80%. A porous film layer having an excessively low porosity may show insufficient permeability with respect to the printing ink to thereby often give a print with unsatisfactory adhesion. In contrast, a porous film layer having an excessively high porosity may have insufficient mechanical strength. The rate of open area in a surface of the porous film layer (rate of open area in surface) is, for example, about 30% or more (e.g., about 30% to 80%), and preferably about 50% to 80%. A porous film layer having an excessively low rate of open area in surface may show insufficient permeability with respect to the printing ink to thereby often give a print with unsatisfactory adhesion. A porous film layer having an excessively high rate of open area in surface may be likely to have insufficient mechanical strength.

The thickness of the porous film layer is, for example, 0.1 to 100 μm. When the substrate for a printed article (base to be printed) includes a porous film layer alone, the thickness of the porous film layer is preferably 5 to 100 μm, and more preferably 25 to 70 μm. When the substrate for a printed article (base to be printed) is an assembly of a porous film layer and a support such as a dense layer, the thickness of the porous film layer is preferably 0.1 to 25 μm, and more preferably 1 to 10 μm. A porous film layer having an excessively small thickness may not sufficiently absorb the main solvent in the printing ink (paste). In contrast, a porous film layer having an excessively large thickness may be unlikely to have a uniformly controlled distribution of pore diameters. The thickness of the porous film layer is preferably two times or more, and more preferably ten times or more the average pore diameter.

Micropores on both sides of a porous film layer may differ in pore properties such as average pore diameters, because these micropores grow under different conditions upon the formation of the porous film layer. Typically, a porous film may be produced through phase inversion which basically includes the steps of preparing a polymer solution of a resin for constituting the porous film, casting the polymer solution onto a base (substrate) to give a cast film, and coagulating the cast film. In this case, micropores in the porous film are formed under different conditions between one surface not in contact with the base (air-side surface) and the other surface in contact with the base (base-side surface), and they may often have different pore properties. When micropores on one side of the porous film layer have an average pore diameter $\phi A$ and micropores on the other side have an average pore diameter $\phi B$, $\phi A$ and $\phi B$ preferably satisfy the condition: $0.1 \leq \phi A/\phi B \leq 10$. If the ratio $\phi A/\phi B$ is less than 0.1 or more than 10, micropores on both sides of the film may be in poor balance to thereby often show insufficient fine-line depictability. When micropores on the air-side surface of the porous film have an average pore diameter $\phi A$ and micropores on the base-side surface have an average pore diameter $\phi B$, $\phi A$ and $\phi B$ preferably satisfy the condition: $0.15 \leq \phi A/\phi B \leq 8$ and more preferably satisfy the condition: $0.2 \leq \phi A/\phi B \leq 5$. The value $\phi A/\phi B$ may be adjusted by suitably setting production conditions of the porous film. Specifically, the value may be controlled by suitably setting, for example, the type and surface properties of the base on which a polymer solution containing a material for constituting the porous film is to be cast; and/or the atmosphere (e.g., temperature and humidity) upon formation of micropores.

Exemplary indexes for expressing the continuity of micropores in the porous film layer include a Gurley permeability indicating gas permeability, and a pure water permeation rate. The Gurley permeability of the porous film layer is preferably 0.2 to 100 seconds/100 cc, and more preferably 1 to 50 seconds/100 cc. A porous film layer having an excessively high Gurley permeability may not sufficiently absorb the solvent of the printing ink. In contrast, a porous film layer having an excessively low Gurley permeability may possibly show insufficient mechanical strength.

When one side of the porous film layer bearing a print has an average pore diameter A, and the print has a width W, W and A preferably satisfy the condition: $W/A \geq 5$, and more preferably satisfy the condition: $W/A \geq 10$. If the ratio W/A is less than 5, a printing ink, for example, may not be anchored sufficiently to thereby adversely affect adhesion of the print, or the ink may diffuse to cause line feathering and to often impair depictability of interconnections.

Printed articles according to embodiments of the present invention include at least a straight-line portion having an average line width of 10 to 1000 µm and a length of 500 µm or more. They may further have any of, for example, a straight-line portion having a width smaller than this range, a straight-line portion having a width larger than this range, and a non-straight-line portion.

Preferred materials (raw materials) for constituting the porous film layer include those having insulating properties, of which resins are advantageously used. Exemplary resins include polyimide resins, polyamideimide resins, poly(ether sulfone) resins, poly(ether imide) resins, polycarbonate resins, polyarylate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, acrylic resins, epoxy resins, polyolefinic resins (e.g., polymethylpentene resins and cyclic polyolefinic resins), and fluorocarbon resins (e.g., poly(vinylidene fluoride) resins). Among them, preferred resins from the viewpoints of having thermal stability and excelling in mechanical strength, chemical resistance, and electric properties include polyimide resins, polyamideimide resins, poly(ether sulfone) resins, poly(ether imide) resins, polycarbonate resins, aromatic polyamide resins, polyamide resins, polybenzoxazole resins, polybenzimidazole resins, polysulfone resins, and cellulosic resins; of which polyamideimide resins, poly(ether imide) resins, polycarbonate resins, and poly(ether sulfone) resins are more preferred. Such polymers may also be copolymers or graft polymers. Each of these materials can be used alone or in combination. The porous film layer may be coated with a chemical-resistant polymeric compound on its layer surface and inner surfaces of pores.

The porous film layer may be used alone as a substrate for a printed article (base to be printed). In another embodiment, the porous film layer is arranged on one or both sides of a support such as a dense layer having substantially no pore, to give an assembly, and this assembly is used as a base of a printed article. Use of an assembly of this type helps to increase the mechanical strength of the base. When the base for the printed article (base to be printed) is composed of a porous film layer alone, printing can be conducted on one or both sides of the porous film layer to thereby give, for example, a circuit on one or both sides thereof. In addition, when the substrate for a printed article (base to be printed) is composed of an assembly including a support and a porous film layer arranged on one or both sides of the support, printing can be conducted on one or both sides of the base to thereby give, for example, a circuit on one or both sides thereof.

Materials (raw materials) for constituting the support include, but are not limited to, materials of various types, such as resins, fibers, metals, and ceramics. The support may be in any form such as a film-like, fibrous, or sheet-like form. Representative materials for constituting the support include plastics such as polyimide resins, polyamideimide resins, poly(ether sulfone) resins, poly(ether imide) resins, polycarbonate resins, polyarylate resins, poly(phenylene sulfide) resins, liquid crystalline polyester resins, polyester resins, aromatic polyamide resins, polyamide resins, polybenzoxazole resins, polybenzimidazole resins, polybenzothiazole resins, polysulfone resins, polyolefinic resins, cellulosic resins, acrylic resins, fluorocarbon resins, urethane resins, silicone resins, and epoxy resins; metals such as iron, aluminum, copper, titanium, tin, and zinc; inorganic materials such as glass, ceramics, concrete, and rock (stone); and wood and bamboos. Each of these materials can be used alone or in combination. Exemplary preferred supports include polyimide films, poly(ethylene terephthalate) films, poly(ethylene naphthalate) films, aramid films, and glass-epoxy substrates, from the points typically of handleability, strength, and thermal stability.

The thickness of the support is, for example, 1 to 300 µm, and preferably 5 to 100 µm. A support having an excessively small thickness may be difficult to handle. In contrast, a support having an excessively large thickness may have insufficient flexibility.

A porous film layer in a printed article according to an embodiment of the present invention may be formed by phase inversion. Typically, the porous film layer may be formed by wet phase inversion of casting a solution mixture onto a solid base to give a cast film, and introducing the cast film into a coagulation bath, in which the solution mixture contains a material (resin component) constituting the porous film layer, a water-soluble polymer, a polar solvent, and where necessary water. The material (resin component) constituting the porous film layer is preferably one that dissolves in a water-miscible polar solvent and gives a film by phase inversion. Specifically, exemplary materials usable herein include the above-exemplified resins for constituting the porous film layer. Instead of these resins, any of precursors of the resins, such as monomer components (starting materials) and oligomers thereof, may also be used. Typically, a porous layer made from a polyimide precursor may further be subjected to thermal imidation or chemical imidation to give a porous polyimide layer. When a porous film layer of a polyimide resin is to be formed, a porous film composed of a desired polyimide resin may be obtained by preparing a porous film layer by the above procedure, except for using a polyamic acid as a precursor of a polyimide resin (polyimide precursor), and carrying out thermal imidation or chemical imidation of the porous film layer.

Addition of a water-soluble polymer and water to a polymer solution to be cast is effective to give a spongy and porous film structure. Exemplary water-soluble polymers include polyethylene glycols, polyvinylpyrrolidones, poly(ethylene oxide)s, poly(vinyl alcohol)s, poly(acrylic acid)s, polysaccharides, derivatives of these, and mixtures of them. Among them, polyvinylpyrrolidones are preferred, because they may help to suppress void formation within the film and to increase the mechanical strength of the film. Each of these water-soluble polymers may be used alone or in combination. From the viewpoint of yielding a porous structure, the molecular weight of the water-soluble polymer is, for example, about 200 or more, preferably about 300 or more, more preferably about 400 or more (e.g., about 400 to $20 \times 10^4$), and particularly preferably about 1000 or more (e.g., about 1000 to $20 \times 10^4$).

Among these components, the water-soluble polymer is very effective to make the film structure spongy and is an important additive, since varying the type and amount of the water-soluble polymer helps to yield a variety of structures. However, the water-soluble polymer becomes an unnecessary component ultimately and will be removed by washing or rinsing when the cast film is immersed typically in water to coagulate the cast film into a porous layer. A porous structure can be formed by any of dry phase inversion and wet phase inversion, but it is preferably formed by wet phase inversion from the above-mentioned points.

The polar solvent can be selected from those having solubility with respect to the chemical skeleton of the resin to be used (good solvent for the resin). Exemplary good solvents typically for polyamideimide resins, polyamic acids, poly(ether imide) resins, and polycarbonate resins include dimethylacetamide (DMAc), N-methyl-2-pyrrolidone (NMP), N,N-dimethylformamide, NMP/xylene, NMP/xylene/methyl ethyl ketone, ethyl alcohol/toluene, dimethyl sulfoxide, and 2-pyrrolidone. Each of the polar solvents can be used alone or in combination.

Exemplary preferred polymer solutions to be cast include solution mixtures each containing 8 to 25 percent by weight of a polymer component as a material for constituting the porous film layer, 10 to 50 percent by weight of a water-soluble polymer, 0 to 10 percent by weight of water, and 30 to 82 percent by weight of a water-miscible polar solvent.

A polymer solution, if having an excessively low concentration of a polymer (polymer component) mainly constituting the porous film layer, may cause insufficient strength of the resulting film. In contrast, a polymer solution, if having an excessively high concentration thereof, may cause a lower porosity of the film. The water-soluble polymer is added to the polymer solution to help to give a film having a homogeneous spongy porous inside structure. If the concentration thereof is excessively low, huge voids of sizes exceeding about 10 μm may occur in the film to reduce homogeneity. If it is excessively high, the water-soluble polymer may not dissolve satisfactorily. The amount of water can be used to adjust the diameters of voids (pore diameter), and the diameters of voids may increase with an increasing amount of water.

Exemplary materials (raw materials) for the solid base used in flow casting of the polymer solution include the above-exemplified materials (raw materials) for constituting the support in the assembly. Exemplary solid bases further include composite films or sheets each containing two or more different materials in surface and core thereof, respectively. Such composite films or sheets may be prepared by affixing different films or sheets with each other or by carrying out a surface treatment such as coating, vapor deposition, or sputtering. Exemplary solid bases further include those subjected to a surface treatment such as adhesion promoting treatment, antistatic treatment, sandblasting, and/or corona discharge treatment. When the solid base used herein is used as intact as the support of the assembly, it is preferred to selectively use a material having affinity for the material constituting the porous film layer (e.g., a resin having a monomer unit of similar type), or to use a resinous base which has been subjected to a surface treatment such as adhesion promoting treatment and/or corona discharge treatment.

Conditions for flow casting of the polymer solution into a film are preferably such that relative humidity of 70% to 100% (more preferably 90% to 100%) and a temperature is 15° C. to 90° C. (more preferably 30° C. to 80° C.); and more preferably such that relative humidity is about 100% (e.g., 95% to 100%) and a temperature is 40° C. to 70° C. If the water content (moisture content) in air is less than the above-specified range, there may occur a problem of a low rate of open area in surface. When the polymer solution is cast into a film, the cast film is preferably held in an atmosphere at a temperature of 15° C. to 90° C. and relative humidity of 70% to 100% for 0.2 to 15 minutes before being introduced into a coagulation bath composed of a nonsolvent for the polymer component. Holding the cast film (film-like cast article) under the above conditions helps to make the resulting porous film layer homogeneous and highly continuous. This is probably because holding the cast film under such humidified conditions may help water to migrate from the surface toward inside of the film to thereby accelerate phase separation of the polymer solution efficiently.

The coagulation bath for use in phase inversion can be any solvent that coagulates the polymer component and may be selected suitably according to the type of a resin used as the polymer component. Typically, exemplary coagulation baths as solvents that coagulate polyamideimide resins, polyamic acids, and poly(ether imide) resins include water-miscible or -soluble coagulation baths, such as water; alcohols including monohydric alcohols such as methanol and ethanol, and polyhydric alcohols such as glycerol; water-soluble polymers such as polyethylene glycols; and mixtures of these.

When the solid base is used as the support of the assembly, a porous film deposited or precipitated as a result of introduction into a coagulation bath is subjected to drying as intact, to give an assembly (base to be printed) composed of a support and a porous film layer. An assembly having porous film layers on both sides of a support can be prepared by forming a porous film layer on one side of the support and conducting the same procedure again. In another embodiment, a porous film layer alone may be obtained by transferring a porous film, deposited as a result of introduction into a coagulation bath, from the solid base to a support plate, and drying the transferred porous film. This porous film layer is usable alone as a base for a circuit board. The support plate is preferably one made of a material being resistance to the coagulation bath and having a large number of micropores in a surface to be in contact with the film for yielding a higher drying rate; and among such support plates, more preferred are those having such a permeability as to allow the coagulation solvent (coagulation bath) to permeate therethrough at an appropriate rate. Exemplary support plates may have a gas permeability of less than 1000 seconds/100 cc (preferably less than 100 seconds/100 cc) and a film thickness of 5 to 1000 µm (preferably 50 to 500 µm) and may include holes (pores) that penetrate the film in its cross-sectional direction, have sizes of 0.01 to 10 µm (preferably 0.03 to 1 µm), and are dispersed at a sufficient density. Specifically, exemplary usable support plates include nonwoven fabrics or porous films made from materials including polyesters, polyamides, polyolefins such as polyethylenes and polypropylenes, celluloses, and Teflon (registered trademark). It is also possible to laminate the resulting porous film as a single layer onto a separately-prepared support (e.g., a dense layer) according to a common film lamination procedure or device typically using an adhesive, to give an assembly (base to be printed) including the support and a porous film layer on one or both sides of the support.

The porous film (layer) formed by the above method may further be subjected to a polymerization or cross-linking (curing) process typically with heat, visible rays, ultraviolet rays, electron beams, or radiations, for the purpose of polymerizing precursor or improving the chemical resistance. Typically, as is described above, a film formed from a polyimide precursor may further be subjected typically to thermal imidation or chemical imidation to yield a porous film layer composed of a polyimide resin. A porous film layer formed typically from a polyamideimide resin may be subjected to thermal cross-linking. The porous film (layer) may further be coated with a chemical-resistant coat on the film surface and inner surfaces of pores by immersing in a solution of a chemical-resistant polymer and then drying. Exemplary chemical-resistant polymers include phenolic resins, urea resins, melamine resins, benzoguanamine resins, polyimide resins, epoxy resins, benzoxazine resins, polypropylene resins, polyurethane resins, fluorocarbon resins, alkyd resins, cellulose acetate resins, phthalic acid resins, maleic acid resins, silicone resins, triazine resins, furan resins, polyester resins, xylene resins, poly(vinyl alcohol)s, ethylene-vinyl alcohol copolymers, chitins, and chitosans.

The above-mentioned method gives a porous film (layer) which has a large number of uniformly dispersed continuous micropores and is composed of a resin such as a polyamideimide resin, a poly(ether imide) resin, a polycarbonate resin, or a poly(ether sulfone) resin, in which the porous film layer has an average pore diameter of micropores of 0.01 to 10 µm, a porosity of 30% to 80%, and a thickness of 0.1 to 100 µm.

The porous film layer may have desired diameters of micropores, porosity, and rate of open area by suitably selecting the types and amounts of components of the polymer solution, the amount of water in the polymer solution, the humidity, temperature, and time period upon flow casting, the type of the solid base used in flow casting, and the type of, if employed, aftertreatment, as is described above.

The printed articles 1 and 2 according to the present invention may be produced, for example, by printing a print onto at least one side of a porous film layer obtained typically by the above procedure and having a large number of continuous micropores with an average pore diameter of 0.01 to 10 µm, which print includes at least a straight-line portion having an average line width of 10 to 1000 µm and a length of 500 µm or more. This porous film layer is preferably a resinous layer formed through phase inversion, and is more preferably a resinous layer formed through wet phase inversion as above. The porous film layer may work alone as a substrate for a printed article, as is described above. In another embodiment, such a porous film layer having an average pore diameter of 0.01 to 20 µm is arranged on one or both sides of a support, such as a dense layer having substantially no pore, to give an assembly, and this assembly is also used as a substrate for a printed article.

Processes for carrying out printing on a surface of the porous film layer include, but are not limited to, ink-jet printing, screen printing, offset printing, sublimation (heat-fusion) printing, thermal printing, gravure printing, laser beam printing, paste drawing, and nanocontact printing. These printing processes may be conducted according to known or common procedures. Among them, a preferred printing process is a process of extruding a paste through a screen mesh or metal mask.

The printed article 3 according to the present invention may be produced, for example, by carrying out printing from a printing plate onto at least one side of a porous film layer obtained typically by the above procedure and having a large number of continuous micropores with an average pore diameter of 0.01 to 10 µm. This porous film layer is preferably a resinous layer formed through phase inversion, and is more preferably a resinous layer formed through wet phase inversion as above. The porous film layer may work alone as a substrate for a printed article, as is described above. In another embodiment, such a porous film layer having an average pore diameter of 0.01 to 10 µm is arranged on one or both sides of a support such as a dense layer having substantially no pore, to give an assembly, and this assembly also works as a substrate for a printed article.

The process for carrying out printing on a surface of the porous film layer from a printing plate is not particularly limited and can be any of, for example, screen printing, offset printing, and gravure printing. These printing processes may be conducted according to known or common procedures. Among them, a preferred printing process is a process of extruding a paste through a screen mesh or metal mask.

Methods of producing a printed circuit board by printing a conductive ink or conductive paste onto a surface of a porous film layer to form conductive (electroconductive) interconnections (circuit) will be described below, as representative exemplary processes for producing printed articles by printing. Exemplary specific processes for forming conductive interconnections include (1) a process of applying a conductive ink onto a surface of the porous film layer through ink-jet printing to form conductive interconnections; (2) a process of applying a conductive ink to a printing plate with relief and/or intaglio corresponding to a pattern of interconnections and transferring this to a surface of the porous film layer to form conductive interconnections; (3) a process of extruding, from a syringe, a conductive paste into a pattern of interconnections onto the surface of the porous film layer to form to form conductive interconnections; and (4) a process of applying a conductive paste in a pattern of interconnections to the surface of the porous film layer through screen printing to form conductive interconnections.

Exemplary conductive (electroconductive) inks include, but are not limited to, gold inks, silver inks, silver Nano-metal inks, copper inks, carbon inks, and silver-carbon inks. Exemplary conductive pastes include, but are not limited to, silver conductive pastes, copper conductive pastes, gold conductive pastes, palladium conductive pastes, palladium-silver conductive pastes, platinum conductive pastes, platinum-silver conductive pastes, and nickel conductive pastes. The above processes may further include carrying out plating onto the formed conductive interconnections according to a common procedure.

Other representative processes for forming conductive interconnections by printing include processes of printing a catalyzer (plating catalyst) onto the porous film layer and then carrying out plating, such as (5) a process of applying a catalyzer to a surface of the porous film layer through ink-jet printing to form a pattern of interconnections, and thereafter carrying out plating to form conductive interconnections; (6) a process of applying a catalyzer to a printing plate with relief and/or intaglio corresponding to a pattern of interconnections, transferring this to the surface of the porous film layer, and thereafter carrying out plating to form conductive interconnections; (7) a process of extruding, from a syringe, a catalyzer into a pattern of interconnections onto the surface of the porous film layer, and thereafter carrying out plating to form conductive interconnections; and (8) a process of applying a catalyzer in a pattern of interconnections to the surface of the porous film layer through screen printing, and thereafter carrying out plating to form conductive interconnections.

Exemplary catalyzers usable herein include salts of metals that act as catalysts in electroless plating. Specific exemplary catalyzers include hydroxycarboxylic acid salts (e.g., citrates and tartrates) or inorganic salts (e.g., sulfates and hydrochlorides) of metals selected from copper-group elements including gold, silver, and copper; platinum-group elements such as palladium and platinum; and iron-group elements such as nickel. Printing of a catalyzer may be carried out, for example, by preparing an ink containing the catalyzer, a suitable vehicle, and other components such as additives according to necessity, and printing the ink through a suitable printing process. The printed catalyzer is subjected to reduction into a metal, and electroless plating, where necessary with subsequent electroplating (electrodeposition), are conducted to form conductive interconnections. The reduction of the catalyzer may employ a reducing agent. Exemplary reducing agents include hypophosphorous acid and salts thereof, hydrazine and salts thereof, borohydride compounds, aminoborane compounds, glucose, and formaldehyde. The reduction process may be carried out, for example, with a 0.5 to 10 percent by weight aqueous solution of a reducing agent at a temperature ranging from room temperature to about 50° C. The electroless plating process may be carried out according to a known procedure typically with an electroless copper plating bath or an electroless nickel plating bath. The electroplating (electrodeposition) process may also be carried out according to a known procedure typically with copper sulfate.

Printing inks or pastes for use in printing may be inks or pastes each containing at least a solid material (solid matter) and a solvent. Among them, preferred are printing inks or pastes each containing such a liquid that whose contact angle with a surface of the porous film layer becomes 60 degrees or less (more preferably 50 degrees or less, and further preferably 40 degrees or less) within 300 msec after dropping a droplet (1 μl) of the liquid onto the surface of the porous film layer; of which more preferred are those containing, as a main solvent, such a liquid that whose contact angle with a surface of the porous film layer becomes 60 degrees or less (more preferably 50 degrees or less, and further preferably 40 degrees or less) within 300 msec after dropping a droplet (1 μl) of the liquid onto the surface of the porous film layer, and that the droplet has a radius of 1600 μm or less (preferably 1500 μm or less, and more preferably 1400 μm or less) upon a lapse of 300 μsec after the dropping. When a printing ink or paste of this type is used, the solvent in the printing ink or paste is immediately absorbed by pores of the porous film layer, the ink or paste thereby has an increased viscosity to lose fluidity, and the solid material in the ink or paste remains on a surface of the porous film layer. This gives a printed article that excels in fine-line depictability without suffering from bleeding.

The solid material (solid matter) in the printing ink or paste may be selected typically from known inorganic materials and organic materials, according to the purpose such as formation of interconnections or inductors, luminous elements, resistors, capacitors, or semiconductors (semiconductor devices). Exemplary inorganic materials include metals such as gold, silver, copper, nickel, and aluminum; as well as glass, inorganic electroluminescent materials such as ZnS, Mn/CdSSe, ZnS:TbOF, ZnS:Tb, SrS:Ce, $(SrS:CeZnS)_n$, $CaCa_2S_4$:Ce, $SrGa_2S_4$:Ce, and SrS:Ce/ZnS:Mn; carbon; and other inorganic materials including ceramic materials such as silica and zirconia. Exemplary organic materials include organic pigments; conductive polymers; and organic semiconductive materials such as pentacenes and thiophenes. The solid material may have any shape or form, as long as not adversely affecting printability, and exemplary solid materials usable herein may be in a variety of forms such as particles, flakes, fibers, scales, hollow particles, or hollow fibers.

Solvents for use in a printing ink or paste may be suitably selected according typically to the type of a resin in the printing ink or paste, and exemplary solvents include hydrocarbon solvents, halogenated hydrocarbon solvents, alcohol solvents, phenolic solvents, ketone solvents, fatty acids/acid anhydrides, ester solvents, nitrogen-containing/sulfur-containing polar solvents, and water. Specific exemplary solvents include toluene, terpineol, decahydronaphthalene, tetradecane, decanol, diethylene glycol monoethyl ether, diethylene glycol monobutyl ether, ethylene glycol monomethyl ether, ethylene glycol monoethyl ether, diethylene glycol monomethyl ether, triethylene glycol monomethyl ether, propylene glycol monomethyl ether, dipropylene glycol monomethyl ether, propylene glycol monopropyl ether, dipropylene glycol monopropyl ether, ethylene glycol monoisopropyl ether, diethylene glycol monoisopropyl ether, ethylene glycol monobutyl ether, diethylene glycol monobutyl ether, triethylene glycol monobutyl ether, propylene glycol monobutyl ether, dipropylene glycol monobutyl ether, ethylene glycol monoisobutyl ether, diethylene glycol monoisobutyl ether, ethylene glycol monohexyl ether, diethylene glycol monohexyl ether, ethylene glycol mono-(2-ethylhexyl)ether, ethylene glycol monoallyl ether, ethylene glycol monophenyl ether, ethylene glycol dimethyl ether, diethylene glycol dimethyl ether, diethylene glycol diethyl ether, diethylene glycol dibutyl ether, triethylene glycol dimethyl ether, diethylene glycol monobutyl ether acetate, terpineol, diethylene glycol monobutyl ether acetate, butanol, propanediols, butanediols, pentanediols, ethylene glycol, glycerol, and water. Each of these solvents may be used alone or in combination. Technologies on ink solvents are disclosed typically in JP-A No. 2004-319281, JP-A No. 2004-111057, JP-A No. 2006-059669, and JP-A No. 2004-143325.

Printing inks or pastes having a viscosity of 0.05 to 1 Pa·s are preferably used as the printing ink or paste for use in printing. When a printing ink or paste of this type is used, the solvent in the printing ink or paste is immediately absorbed by pores of the porous film layer, and the solid material remains on a surface of the porous film layer, to give a printed article that excels in fine-line depictability without suffering from bleeding. The viscosity of the printing ink or paste can be adjusted by setting or varying the type and concentration of the solid material, the types and concentrations of resins and other additives, and/or the type of the solvent.

A method of producing a printed pattern according to an embodiment of the present invention includes the step of (1) carrying out printing on a porous film layer, (2A) bringing the printed porous film layer into contact with a solvent, and (3A) evaporating the solvent, to form a densified layer. FIG. 27 depicts explanatory drawings (as cross-sectional views) of respective steps as an embodiment of a method of producing a printed pattern according to the present invention, in which 1 stands for a porous film layer, 6 stands for a support, 7 stands for a print, 8 stands for a solvent, 9 stands for a porous layer impregnated with the solvent, and 11 stands for a densified layer.

[Step (1)]

In Step (1), a print 7 is applied to a porous film layer 1. The porous film layer is preferably one having a large number of uniformly dispersed continuous micropores (communicating micropores). The porous film layer is preferably homogeneously porous at least 10% (with respect to the entire thickness) deep from the outermost surface of a printed portion; is more preferably homogeneously porous at least 20% (with respect to the entire thickness) deep from the outermost surface of the printed portion; and is particularly preferably entirely homogenously porous.

The average pore diameter (average pore diameter in film surface) of the porous film layer is preferably 0.01 to 20 µm (e.g., 0.01 to 10 µm), more preferably 0.5 to 15 µm, and particularly preferably 1 to 10 µm. A porous film layer having excessively large-sized pores may show insufficient permeability with respect to a printing ink to thereby often give a print with unsatisfactory adhesion. A porous film layer having excessively large-sized pores may not so effectively anchor the ink. This may also often cause lower adhesion of the print, may cause ink diffusion and line feathering to often reduce straight-line depictability, and may reduce mechanical strength to often cause deformation. In contrast, a porous film layer having an average pore diameter within the above-specified range may smoothly absorb the ink and, additionally, effectively anchor the ink, to give a print with very high adhesion and to suppress the ink from diffusing to thereby give excellent fine-line depictability.

The porosity (percentage of voids) of the porous film layer is, for example, 30% to 80%, preferably 40% to 80%, and more preferably 50% to 80%. A porous film layer having an excessively low porosity may show insufficient permeability with respect to the printing ink to thereby often give a print with unsatisfactory adhesion. In contrast, a porous film layer having an excessively high porosity may have insufficient mechanical strength. The rate of open area in a surface of the porous film layer (rate of open area in surface) is, for example, about 30% or more (e.g., about 30% to 80%), and preferably about 50% to 80%. A porous film layer having an excessively low rate of open area in surface may show insufficient permeability with respect to the printing ink to thereby often give a print with unsatisfactory adhesion. In contrast, A porous film layer having an excessively high rate of open area in surface may be likely to have insufficient mechanical strength.

The thickness of the porous film layer is, for example, 0.1 to 100 µm. When the substrate for a printed article (base to be printed) includes a porous film layer alone, the thickness of the porous film layer is preferably 5 to 100 µm, and more preferably 25 to 70 µm. When the substrate for a printed article (base to be printed) is an assembly of a support, such as a dense layer, and a porous film layer, the thickness of the porous film layer is preferably 0.1 to 25 µm, and more preferably 1 to 10 µm. A porous film layer having an excessively small thickness may not satisfactorily absorb the main solvent of a printing ink (paste). In contrast, a porous film layer having an excessively large thickness may be unlikely to have a uniformly controlled distribution of pore diameters. The thickness of the porous film layer is preferably two times or more, and more preferably ten times or more the average pore diameter.

Micropores on both sides of a porous film layer may differ in pore properties such as average pore diameters, because these micropores grow under different conditions upon the formation of the porous film layer. Typically, a porous film may be produced through phase inversion which basically includes the steps of preparing a polymer solution of a resin for constituting the porous film, casting the polymer solution onto a base (substrate) to give a cast film, and coagulating the cast film. In this case, micropores in the porous film are formed under different conditions between one surface not in contact with the base (air-side surface) and the other surface in contact with the base (base-side surface), and they may often have different pore properties. When micropores on one side of the porous film layer have an average pore diameter $\phi A$ and micropores on the other side have an average pore diameter $\phi B$, $\phi A$ and $\phi B$ preferably satisfy the condition: $0.1 \leq \phi A/\phi B \leq 10$. If the ratio $\phi A/\phi B$ is less than 0.1 or more than 10, micropores on both sides of the film may be in poor balance to thereby often show insufficient fine-line depictability. When micropores on the air-side surface of the porous film have an average pore diameter $\phi A$ and micropores on the base-side surface have an average pore diameter $\phi B$, $\phi A$ and $\phi B$ preferably satisfy the condition: $0.15 \leq \phi A/\phi B \leq 8$, and more preferably satisfy the condition: $0.2 \leq \phi A/\phi B \leq 5$. The value $\phi A/\phi B$ may be adjusted by suitably setting production conditions of the porous film. Specifically, the value may be controlled by suitably setting, for example, the type and surface properties of the base on which a polymer solution containing a material for constituting the porous film is to be cast; and/or the atmosphere (e.g., temperature and humidity) upon formation of micropores.

Exemplary indexes for expressing the continuity of micropores in the porous film layer include a Gurley permeability indicating gas permeability, and a pure water permeation rate. The Gurley permeability of the porous film layer is preferably 0.2 to 100 seconds/100 cc, more preferably 1 to 50 seconds/100 cc, and particularly preferably 1 to 10 seconds/100 cc. A porous film layer having an excessively high Gurley permeability may not sufficiently absorb the solvent of the printing ink. In contrast, a porous film layer having an excessively low Gurley permeability may possibly show insufficient mechanical strength.

Preferred materials (raw materials) for constituting the porous film layer include those having insulating properties, of which resins are advantageously used. Exemplary resins include polyimide resins, polyamideimide resins, poly(ether sulfone) resins, poly(ether imide) resins, polycarbonate resins, polyarylate resins, poly(phenylene sulfide) resins, liquid crystalline polyester resins, aromatic polyamide resins, polyamide resins, polybenzoxazole resins, polybenzimidazole resins, polybenzothiazole resins, polysulfone resins, cellulosic resins, acrylic resins, epoxy resins, polyolefinic resins (e.g., polymethylpentene resins and cyclic polyolefinic resins), and fluorocarbon resins (e.g., poly(vinylidene fluoride) resins). Among them, preferred resins from the viewpoints of having thermal stability and excelling in mechanical strength, chemical resistance, and electric properties include polyimide resins, polyamideimide resins, poly(ether sulfone) resins, poly(ether imide) resins, polycarbonate resins, aromatic polyamide resins, polyamide resins, polybenzoxazole resins, polybenzimidazole resins, polysulfone resins, and cellulosic resins; of which polyamideimide resins, poly(ether imide) resins, polycarbonate resins, and poly(ether sulfone) resins are more preferred. Such polymers may also be copolymers or graft polymers. Each of these materials can be used alone or in combination. The porous film layer may be coated with a chemical-resistant polymeric compound on its layer surface and inner surfaces of pores.

The porous film layer 1 may be used alone as a substrate for a printed article (base to be printed). In another embodiment, the porous film layer 1 may be arranged one or both sides of a support 6, such as a dense layer having substantially no pore, to give an assembly, and this assembly may be used as a substrate for a printed article. Use of an assembly of this type helps to increase the mechanical strength of the base. When the substrate for a printed article (base to be printed) is composed of a porous film layer alone, printing can be conducted on one or both sides of the porous film layer to thereby give, for example, a circuit on one or both sides thereof. In another embodiment in which the substrate for a printed article (base to be printed) is an assembly composed of a support and a porous film layer arranged on one or both sides thereof, printing can also be conducted on one or both sides of the base to thereby give, for example, a circuit on one or both sides thereof.

Materials (raw materials) for constituting the support include, but are not limited to, materials of various types, such as resins, fibers, metals, and ceramics. The support may be in any form such as a film-like, fibrous, sheet-like, or foil form. The support may be any of, for example, dense (compact) supports and supports having a large number of through holes.

Representative exemplary materials for constituting the support include plastics such as polyimide resins, polyamideimide resins, poly(ether sulfone) resins, poly(ether imide) resins, polycarbonate resins, polyarylate resins, poly(phenylene sulfide) resins, liquid crystalline polyester resins, polyester resins, aromatic polyamide resins, polyamide resins, polybenzoxazole resins, polybenzimidazole resins, polybenzothiazole resins, polysulfone resins, polyolefinic resins, cellulosic resins, acrylic resins, fluorocarbon resins, urethane resins, silicone resins, and epoxy resins; metals such as iron, aluminum, copper, titanium, tin, and zinc; inorganic materials such as glass, ceramics, concrete, and rock (stone); and wood and bamboos. Each of these materials can be used alone or in combination. Exemplary preferred supports include polyimide films, films typically of poly(ethylene terephthalate)s, poly(ethylene naphthalate)s, and aramids, and glass-epoxy substrates, from the points typically of handleability, strength, and thermal stability.

When the support is a metallic foil, exemplary metallic foils usable herein include copper foil, aluminum foil, iron foil, nickel foil, gold foil, silver foil, tin foil, zinc foil, and stainless steel foil. The metallic foil may be a single layer or a composite metallic film including two or more layers composed of identical or different materials. Of the both sides of a metallic foil, a pressure-sensitive adhesive layer may be arranged on one side opposite to the porous film layer. In this case, a protective film (release film) may further be arranged on the pressure-sensitive adhesive layer.

When the support is a support having a large number of through holes, exemplary supports include woven fabrics (e.g., woven fabrics made typically from natural fibers such as cotton fibers, glass fibers, and resinous fibers such as PEEK fibers, aromatic polyamide fibers, and polybenzoxazole fibers), mesh clothes (e.g., polyester mesh clothes, nylon mesh clothes, carbon mesh clothes, Teflon (registered trademark) mesh clothes, polypropylene mesh clothes, silk mesh clothes, and polyethylene mesh clothes), punched films (e.g., those prepared typically by punching films such as of PETs or polyimides), and other plastic films or sheets having a large number of through holes; woven wires (e.g., plain woven wires, twilled woven wires, plain Dutch woven wires, and twilled Dutch woven wires), perforated metals (those prepared typically by punching metallic foil or sheets), expanded metals, etched metals, and other metallic foil or sheets having a large number of through holes (through holes). Among them, mesh clothes having water resistance are preferably used.

The thickness of the support is, for example, 1 to 300 µm, and preferably 5 to 100 µm. A support having an excessively small thickness may be difficult to handle. In contrast, a support having an excessively large thickness may show insufficient flexibility.

The porous film layer may be formed according to phase inversion. Typically, the porous film layer may be formed through wet phase inversion in which a solution mixture containing a material (resin component) for constituting the porous film layer, a water-soluble polymer, a polar solvent, and where necessary water is cast onto a solid base and then introduced into a coagulation bath. The material (resin component) for constituting the porous film layer is preferably one that is soluble in a water-miscible polar solvent and is capable of forming a film through phase inversion. Specifically, the resins exemplified as resins constituting the porous film layer are usable herein. Instead of these resins, precursors thereof, such as monomer components (starting materials) of the resins and oligomers thereof, are also usable. Typically, when a porous film layer of a polyimide resin is to be formed, a porous film composed of a desired polyimide resin may be obtained by preparing a porous film layer by the above procedure, except for using a polyamic acid as a precursor of a polyimide resin (polyimide precursor), and carrying out thermal imidation or chemical imidation of the porous film layer.

Addition of a water-soluble polymer and water to a polymer solution to be cast is effective to give a spongy and porous film structure. Exemplary water-soluble polymers include polyethylene glycols, polyvinylpyrrolidones, poly(ethylene oxide)s, poly(vinyl alcohol)s, poly(acrylic acid)s, polysaccharides, derivatives of these, and mixtures of them. Among them, polyvinylpyrrolidones are preferred, because they may help to suppress void formation within the film and to increase the mechanical strength of the film. Each of these water-soluble polymers may be used alone or in combination. From the viewpoint of yielding a porous structure, the weight-average molecular weight of the water-soluble polymer is, for example, about 200 or more, preferably about 300 or more, more preferably about 400 or more (e.g., about 400 to $20 \times 10^4$), and particularly preferably about 1000 or more (e.g., about 1000 to $20 \times 10^4$).

Among these components, the water-soluble polymer is very effective to make the film structure spongy and is an important additive, since varying the type and amount of the water-soluble polymer helps to yield a variety of structures. However, the water-soluble polymer becomes an unnecessary component ultimately and will be removed by washing or rinsing when the cast film is immersed typically in water to coagulate the cast film into a porous layer. A porous structure can be formed by any of dry phase inversion and wet phase inversion process, but it is desirably formed through wet phase inversion, from the above-mentioned points.

The polar solvent can be selected from those having solubility with respect to the chemical skeleton of the resin to be used (good solvent for the resin). Exemplary good solvents typically for polyamideimide resins, polyamic acids, poly(ether imide) resins, and polycarbonate resins include dimethylacetamide (DMAc), N-methyl-2-pyrrolidone (NMP), N,N-dimethylformamide, NMP/xylene, NMP/xylene/methyl ethyl ketone, ethyl alcohol/toluene, dimethyl sulfoxide, and 2-pyrrolidone. Each of these polar solvents can be used alone or in combination.

Exemplary preferred polymer solutions to be cast include solution mixtures each containing 8 to 25 percent by weight of a polymer component as a material for constituting the porous film layer, 10 to 50 percent by weight of a water-soluble polymer, 0 to 10 percent by weight of water, and 30 to 82 percent by weight of a water-miscible polar solvent.

A polymer solution, if having an excessively low concentration of a polymer (polymer component) mainly constituting the porous film layer, may cause insufficient strength of the resulting film. In contrast, a polymer solution, if having an excessively high concentration thereof, may cause a lower porosity of the film. The water-soluble polymer is added to the polymer solution so as to help to give a film having a homogeneous spongy porous inside structure. If the concentration thereof is excessively low, huge voids of sizes exceeding about 10 µm may occur in the film to reduce homogeneity. If it is excessively high, the water-soluble polymer may not dissolve satisfactorily. The amount of water can be used to adjust the diameters of voids (pore diameter), and the diameters of voids may increase with an increasing amount of water.

Exemplary materials (raw materials) for the solid base used in flow casting of the polymer solution include the above-exemplified materials (raw materials) for constituting the support in the assembly. Exemplary solid bases further include composite films or sheets each containing two or more different materials in surface and core thereof, respectively. Such composite films or sheets may be prepared by affixing different films or sheets with each other or by carrying out a surface treatment such as coating, vapor deposition, or sputtering. Exemplary solid bases further include those subjected to a surface treatment such as adhesion promoting treatment, antistatic treatment, sandblasting, and/or corona discharge treatment. When the solid base used herein is used as intact as the support of the assembly, it is preferred to selectively use a material having affinity for the material constituting the porous film layer (e.g., a resin having a monomer unit of similar type), or to use a resinous base which has been subjected to a surface treatment such as adhesion promoting treatment and/or corona discharge treatment.

Conditions for flow casting of the polymer solution into a film are preferably such that relative humidity is 70% to 100% (preferably 90% to 100%) and a temperature is 15° C. to 90° C. (preferably 30° C. to 80° C.); and more preferably such that relative humidity is about 100% (e.g., 95% to 100%) and a temperature is 40° C. to 70° C. If the water content (moisture content) in air is less than the above-specified range, there may occur a problem of a low rate of open area in surface. When the polymer solution is cast into a film, the cast film is preferably held in an atmosphere at a temperature of 15° C. to 90° C. and relative humidity of 70% to 100% for 0.2 to 15 minutes before being introduced into a coagulation bath composed of a nonsolvent for the polymer component. Holding the cast film (film-like cast article) under the above conditions helps to make the resulting porous film layer homogeneous and highly continuous. This is probably because holding the cast film under such humidified conditions may help water to migrate from the surface toward inside of the film to thereby accelerate phase separation of the polymer solution efficiently.

The coagulation bath (coagulation liquid) for use in phase inversion can be any solvent that coagulates the polymer component and may be selected suitably according to the type of a resin used as the polymer component. Typically, exemplary coagulation baths as solvents that coagulate polyamideimide resins, polyamic acids, and poly(ether imide) resins include water-miscible or -soluble coagulation baths including water; alcohols including monohydric alcohols such as methanol and ethanol, and polyhydric alcohols such as glycerol; water-soluble polymers such as polyethylene glycols; and mixtures of these.

When the solid base is used as the support of the assembly, a porous film deposited or precipitated as a result of introduction into a coagulation bath is subjected to drying as intact, to give an assembly (base to be printed) composed of a support and a porous film layer. An assembly having porous film layers on both sides of a support can be prepared by forming a porous film layer on one side of the support and conducting the same procedure again. In another embodiment, a porous film layer alone may be obtained by transferring a porous film, deposited as a result of introduction into a coagulation bath, from the solid base to a support plate, and drying the transferred porous film. This porous film layer is usable alone as a base (substrate) for a circuit board. The support plate is preferably one made of a material being resistance to the coagulation bath and having a large number of micropores in a surface to be in contact with the film for yielding a higher drying rate; and among such support plates, more preferred are those having such a permeability as to allow the coagulation solvent (coagulation bath) to permeate therethrough at an appropriate rate. Exemplary support plates may have a gas permeability of less than 1000 µsec/100 cc (preferably less than 100 seconds/100 cc), a film thickness of 5 to 1000 µm (preferably 50 to 500 µm) and may include holes that penetrate the film in its cross-sectional direction, have sizes of 0.01 to 10 µm (preferably 0.03 to 1 µm), and are dispersed in a sufficient density. Specifically, exemplary usable support plates include nonwoven fabrics or porous films made from materials including polyesters, polyamides, polyolefins such as polyethylenes and polypropylenes, celluloses, and Teflon (registered trademark). It is also possible to laminate the resulting porous film as a single layer onto a separately-prepared support (e.g., a dense layer) according to a common film lamination procedure or device typically using an adhesive, to give an assembly (base to be printed) including the support and a porous film layer on one or both sides of the support.

The porous film (layer) formed by the above method may further be subjected to a polymerization or cross-linking (curing) process typically with heat, visible rays, ultraviolet rays, electron beams, or radiations, for the purpose of polymerizing precursor or improving the chemical resistance. Typically, as is described above, a film formed from a polyimide precursor may further be subjected typically to thermal imidation or chemical imidation to yield a porous film layer composed of a polyimide resin. A porous film layer formed typically from a polyamideimide resin may be subjected to thermal cross-linking. The porous film (layer) may further be coated with a chemical-resistant coat on the film surface and inner surfaces of pores by immersing in a solution of a chemical-resistant polymer and then drying. Exemplary chemical-resistant polymers include phenolic resins, urea resins, melamine resins, benzoguanamine resins, polyimide resins, epoxy resins, benzoxazine resins, polypropylene resins, polyurethane resins, fluorocarbon resins, alkyd resins, cellulose acetate resins, phthalic acid resins, maleic acid resins, silicone resins, triazine resins, furan resins, polyester resins, xylene resins, poly (vinyl alcohol)s, ethylene-vinyl alcohol copolymers, chitins, and chitosans.

The above-mentioned method gives a porous film (layer) which has a large number of uniformly dispersed continuous micropores and is composed of a resin such as a polyamide-imide resin, a poly(ether imide) resin, a polycarbonate resin, or a poly(ether sulfone) resin, in which the porous film layer has an average pore diameter of micropores of 0.01 to 10 µm, a porosity of 30% to 80%, and a thickness of 0.1 to 100 µm.

The porous film layer may have desired diameters of micropores, porosity, and rate of open area by suitably selecting the types and amounts of components of the polymer solution, the amount of water in the polymer solution, the humidity, temperature, and time period upon flow casting, the type of the solid base used in flow casting, and the type of, if employed, aftertreatment, as is described above.

A process for carrying out printing on a surface of the porous film layer can be, but is not limited to, any of ink-jet printing, screen printing, offset printing, sublimation (heat-fusion) printing, thermal printing, gravure printing, laser beam printing, paste drawing, and nanocontact printing. These printing processes may be conducted according to known or common procedures. Among them, ink-jet printing and screen printing are particularly preferred.

Methods of producing printed circuit boards by printing a conductive ink or conductive paste onto a surface of a porous film layer to form conductive (electroconductive) interconnections (circuit) will be described below, as representative exemplary processes for producing printed articles by printing. Exemplary specific processes for forming conductive interconnections include (1) a process of applying a conductive ink onto a surface of the porous film layer through ink-jet printing to form conductive interconnections; (2) a process of applying a conductive ink to a printing plate with relief and/or intaglio corresponding to a pattern of interconnections, and transferring this to a surface of the porous film layer to form conductive interconnections; (3) a process of extruding, from a syringe, a conductive paste into a pattern of interconnections onto the surface of the porous film layer to form to form conductive interconnections; and (4) a process of applying a conductive paste in a pattern of interconnections to the surface of the porous film layer through screen printing to form conductive interconnections.

Exemplary usable conductive inks include, but are not limited to, gold inks, silver inks, silver Nano-metal inks, copper inks, carbon inks, and silver-carbon inks. Exemplary usable conductive pastes include, but are not limited to, silver conductive pastes, copper conductive pastes, gold conductive pastes, palladium conductive pastes, palladium-silver conductive pastes, platinum conductive pastes, platinum-silver conductive pastes, and nickel conductive pastes. The above methods may further include carrying out plating onto the formed conductive interconnections according to a common procedure. The timing when plating is carried out is not particularly limited. Typically, plating may be carried out after printing in Step (1) and formation of a densified layer in Steps (2) and (3); or plating may be carried out after printing in Step (1) but before formation of a densified layer in Steps (2) and (3).

Other representative processes for forming conductive interconnections by printing include processes of printing a catalyzer (plating catalyst) onto the porous film layer and then carrying out plating, such as (5) a process of applying a catalyzer to a surface of the porous film layer through ink-jet printing to form a pattern of interconnections, and thereafter carrying out plating to form conductive interconnections; (6) a process of applying a catalyzer to a printing plate with relief and/or intaglio corresponding to a pattern of interconnections, transferring this to the surface of the porous film layer, and thereafter carrying out plating to form conductive interconnections; (7) a process of extruding, from a syringe, a catalyzer into a pattern of interconnections onto the surface of the porous film layer, and thereafter carrying out plating to form conductive interconnections; and (8) a process of applying a catalyzer in a pattern of interconnections to the surface of the porous film layer through screen printing, and thereafter carrying out plating to form conductive interconnections.

Exemplary catalyzers usable herein include salts of metals that act as catalysts in electroless plating. Specific exemplary catalyzers include hydroxycarboxylic acid salts (e.g., citrates and tartrates) or inorganic salts (e.g., sulfates and hydrochlorides) of metals selected from copper-group elements including gold, silver, and copper; platinum-group elements such as palladium and platinum; and iron-group elements such as nickel. Printing of a catalyzer may be carried out, for example, by preparing an ink containing the catalyzer, a suitable vehicle, and other components such as additives according to necessity, and printing the ink through a suitable printing process. The printed catalyzer is subjected to reduction into a metal, and electroless plating, where necessary with subsequent electroplating (electrodeposition), are conducted to form conductive interconnections. The reduction of the catalyzer may employ a reducing agent. Exemplary reducing agents include hypophosphorous acid and salts thereof, hydrazine and salts thereof, borohydride compounds, aminoborane compounds, glucose, and formaldehyde. The reduction process may be carried out, for example, with a 0.5 to 10 percent by weight aqueous solution of a reducing agent at a temperature ranging from room temperature to about 50° C. The electroless plating process may be carried out according to a known procedure typically with an electroless copper plating bath or an electroless nickel plating bath. The electroplating (electrodeposition) process may also be carried out according to a known procedure typically with copper sulfate.

Printing inks or pastes for use in printing may be inks or pastes each containing at least a solid material (solid matter) and a solvent. Among them, preferred are printing inks or pastes each containing such a liquid that whose contact angle with a surface of the porous film layer becomes 60 degrees or less (more preferably 50 degrees or less, and further preferably 40 degrees or less) within 300 msec after dropping a droplet (1 µl) of the liquid onto the surface of the porous film layer; of which more preferred are those containing, as a main solvent, such a liquid that whose contact angle with a surface of the porous film layer becomes 60 degrees or less (more preferably 50 degrees or less, and further preferably 40 degrees or less) within 300 msec after dropping a droplet (1 µl) of the liquid onto the surface of the porous film layer, and that the droplet has a radius of 1600 µm or less (preferably 1500 µm or less, and more preferably 1400 µm or less) upon a lapse of 300 msec after the dropping. When a printing ink or paste of this type is used, the solvent in the printing ink or paste is immediately absorbed by pores of the porous film layer, the ink or paste thereby has an increased viscosity to lose fluidity, and the solid material in the ink or paste remains on a surface of the porous film layer. This gives a printed article that excels in fine-line depictability without suffering from bleeding.

The solid material (solid matter) in the printing ink or paste may be selected typically from known inorganic materials and organic materials, according to the purpose such as formation of interconnections or inductors, luminous elements, resistors, capacitors, or semiconductors (semiconductor devices). Exemplary inorganic materials include metals such as gold, silver, copper, nickel, and aluminum; as well as glass, inorganic EL materials such as ZnS, Mn/CdSSe, ZnS:TbOF, ZnS:Tb, SrS:Ce, (SrS:CeZnS)$_n$, CaCa$_2$S$_4$:Ce, SrGa$_2$S$_4$:Ce, and SrS:Ce/ZnS:Mn; carbon; and other inorganic materials including ceramic materials such as silica and zirconia. Exemplary organic materials include organic pigments; conductive polymers; and organic semiconductive materials such as pentacenes and thiophenes. The solid material may have any shape or form, as long as not adversely affecting printability, and exemplary solid materials usable herein may be in a variety of forms such as particles, flakes, fibers, scales, hollow particles, or hollow fibers.

Solvents for use in a printing ink or paste may be suitably selected according typically to the type of a resin in the printing ink or paste, and exemplary solvents include hydrocarbon solvents, halogenated hydrocarbon solvents, alcohol solvents, phenolic solvents, ketone solvents, fatty acids/acid anhydrides, ester solvents, nitrogen-containing/sulfur-containing polar solvents, and water. Specific exemplary solvents include toluene, terpineol, decahydronaphthalene, tetradecane, decanol, diethylene glycol monoethyl ether, diethylene glycol monobutyl ether, ethylene glycol monomethyl ether, ethylene glycol monoethyl ether, diethylene glycol monomethyl ether, triethylene glycol monomethyl ether, propylene glycol monomethyl ether, dipropylene glycol monomethyl ether, propylene glycol monopropyl ether, dipropylene glycol monopropyl ether, ethylene glycol monoisopropyl ether, diethylene glycol monoisopropyl ether, ethylene glycol monobutyl ether, diethylene glycol monobutyl ether, triethylene glycol monobutyl ether, propylene glycol monobutyl ether, dipropylene glycol monobutyl ether, ethylene glycol monoisobutyl ether, diethylene glycol monoisobutyl ether, ethylene glycol monohexyl ether, diethylene glycol monohexyl ether, ethylene glycol mono-(2-ethylhexyl)ether, ethylene glycol monoallyl ether, ethylene glycol monophenyl ether, ethylene glycol dimethyl ether, diethylene glycol dimethyl ether, diethylene glycol diethyl ether, diethylene glycol dibutyl ether, triethylene glycol dimethyl ether, diethylene glycol monobutyl ether acetate, terpineol, diethylene glycol monobutyl ether acetate, butanol, propanediols, butanediols, pentanediols, ethylene glycol, glycerol, and water. Each of these solvents may be used alone or in combination. Technologies on ink solvents are disclosed typically in JP-A No. 2004-319281, JP-A No. 2004-111057, JP-A No. 2006-059669, and JP-A No. 2004-143325.

Printing inks or pastes having a viscosity of 0.05 to 1 Pa·s are preferably used as the printing ink or paste in printing. When a printing ink or paste of this type is used, the solvent in the printing ink or paste is immediately absorbed by pores of the porous film layer, and the solid material remains on a surface of the porous film layer, to give a printed article that excels in fine-line depictability without suffering from bleeding. The viscosity of the printing ink or paste can be adjusted by setting or varying the type and concentration of the solid material, the types and concentrations of resins and other additives, and/or the type of the solvent.

Step (1) gives a print that excels in fine-line depictability. Typically, when a print having a straight-line portion having an average line width of 10 to 1000 μm and a length of 500 μm or more is printed on a surface of the porous film layer, Step (1) can give a print having a fluctuation F in line width of 30% or less, which fluctuation F is expressed by Expression (1):

$$F=(L\text{Max}-L\text{Min})/L\text{Ave}\times 100 \qquad (1)$$

wherein LAve represents an average line width of a straight-line portion in a length of 500 μm; LMax represents a maximum line width of the straight-line portion in a length of 500 μm; and LMin represents a minimum line width of the straight-line portion in a length of 500 μm.

When a print having at least a straight-line portion having an average line width of 10 to 1000 μm and a length of 500 μm or more is printed onto a surface of the porous film layer, Step (1) can give a print having a standard deviation in line width Σ of 7 or less, which standard deviation Σ is expressed by following Expression (2):

$$\Sigma=\sqrt{(((L\text{Ave}-L\text{Max})^2+(L\text{Ave}-L\text{Min})^2)/2)} \qquad (2)$$

wherein LAve represents an average line width of a straight-line portion in a length of 500 μm; LMax represents a maximum line width of the straight-line portion in a length of 500 μm; LMax represents a maximum line width of the straight-line portion in a length of 500 μm; and LMin represents a minimum line width of the straight-line portion in a length of 500 μm.

As used herein the "fluctuation F" and "standard deviation Σ" in line width are values as measured in a straight-line portion having an average line width of 10 to 1000 μm and a length of 500 μm or more. These are preferably values as measured in a straight-line portion having an average line width of 10 to 500 μm and a length of 500 μm or more; and more preferably are values as measured in a straight-line portion having an average line width of 15 to 100 μm and a length of 500 μm or more. If the average line width is less than 10 μm, it may be difficult to print such a thin line. If it exceeds 1000 μm, the resulting interconnections may be excessively thick (wide) to increase the size of the entire circuit unpractically.

The maximum line width LMax and the minimum line width LMin may be determined based on an enlarged photograph of the straight-line portion of the printed article, having an average line width of 10 to 1000 μm and a length of 500 μm (see FIG. 13). The average line width LAve may be determined by tracing the line to a transparent film and calculating from the weight of the traced line. When a print has a fluctuation F of 30% or less or a standard deviation Σ of 7 or less, it may be determined as a superior print (interconnection) excellent in fine-line depictability (linearity). The fluctuation F is preferably 20% or less, and more preferably 10% or less. The standard deviation Σ is preferably 5 or less, and more preferably 3 or less. It is particularly preferred that both F and Σ are equal to or less than the specific values. When printing is carried out on a porous film layer, at the instant when a printing ink (paste) comes in contact with the porous film (porous membrane), the main solvent in an ink is absorbed by the porous film, thereby the ink has an increased viscosity and loses fluidity to avoid bleeding (diffusion) on the porous film. This enables depiction of straight lines excellent in fine-line depictability (linearity) using a variety of inks (pastes). In contrast, when printing is carried out on a regular PET film or PI film, the printing ink (paste) bleeds and spreads peripherally, and it is difficult to depict straight lines with good fine-line depictability (linearity).

[Step (2A)]

In Step (2A), the porous film layer 1 bearing the print 7 is brought into contact with a solvent 8 to impregnate the porous film layer 1 with the solvent 8 to thereby dissolve the porous film layer in the solvent. The reference numeral 9 in FIG. 27 stands for a porous film layer impregnated with the solvent. The dissolution of the porous film layer in the solvent is not necessarily conducted in Step (2A) but may be conducted for the first time in subsequent Step (3A) in which the porous film layer is heated for drying. The dissolution of the porous film layer in the solvent may also be conducted both in Steps (2A) and Step (3A). The timing of the process of dissolving the porous film layer in a solvent may vary depending typically on the type of the solvent to be used and the drying temperature. Typically, when a solvent having a high solubility with respect to the porous film layer is used, the porous film layer may be dissolved in the solvent in Step (2A), and the solvent may be removed by drying (evaporating) in Step (3A) to form a densified layer. When a solvent having a low solubility with respect to the porous film layer is used, the porous film layer may be dissolved in the solvent and simultaneously evaporated by the action of heat upon evaporation in Step (3A), to form a densified layer.

The solvent is not particularly limited, as long as it does not dissolve the print but dissolves the material (e.g., a resin) constituting the porous film layer at room temperature or with heating, and each of various solvents can be used alone or in combination. Usable solvents also include a mixture of one or more solvents that dissolve the porous film layer by themselves, and one or more nonsolvents that do not dissolve the porous film layer by themselves (e.g., alcohols and hydrocarbons), in which the mixture substantially dissolves the porous film layer therein. The solubility and drying period of the porous film layer may be controlled by mixing a solvent that dissolve the porous film layer with a nonsolvent or water that does not dissolve the porous film layer by itself. Typically, a solvent having high dissolving ability, if used alone, might cause excessively rapid dissolution of the porous film layer, and the formed print might creep with the dissolved porous film layer before carrying out the drying step. In contrast, addition of a nonsolvent and/or water to a solvent having high dissolving ability reduces the solubility of the porous film layer therein, and this may prevent the formed print from creeping with the dissolved porous film layer. In another embodiment, a solvent having high dissolving ability is mixed with a nonsolvent and/or water showing higher volatility than the solvent. In this embodiment, the solubility of the porous film layer may be maintained low before drying, because of the presence of the nonsolvent; and the nonsolvent and the solvent having high dissolving ability evaporate slowly during drying. Thus, a dense layer can be formed while preventing the formed print from creeping out.

Solvents for use herein may be suitably selected according to the type of material constituting the porous film layer, and exemplary solvents include dimethyl sulfoxide (DMSO), N,N-dimethylformamide (DMF), N,N-dimethylacetamide (DMAc), N-methyl-2-pyrrolidone (NMP), tetrahydrofuran (THF), 1,3-dioxolane, 1,3-dioxane, 1,4-dioxane, γ-butyrolactone (GBL), mixtures of these, and mixtures of one or more types of these solvents with a solvent or water that does not dissolve the porous film layer by itself. When a mixture of one or more types of the exemplified solvents with a solvent or water that does not dissolve the porous film layer by itself is used, the ratio of the former (one or more types of the exemplified solvents) to the latter (solvent or water that does not dissolve the porous film layer by itself) (the weight ratio of the total amount of the former to the total amount of the latter [(the former)/(the latter)]) is, for example, 10/90 to 99/1, preferably 20/80 to 95/5, more preferably 30/70 to 90/10, and particularly preferably 40/60 to 80/20.

Typically, when the material constituting the porous film layer is a polyamideimide resin, the solvent can be, for example, any of dimethyl sulfoxide (DMSO), N,N-dimethylformamide (DMF), N,N-dimethylacetamide (DMAc), N-methyl-2-pyrrolidone (NMP), tetrahydrofuran (THF), γ-butyrolactone (GBL), mixtures of these, mixtures of one or more types of these solvents with a solvent or water that does not dissolve the porous film layer by itself. When the material constituting the porous film layer is a poly(ether imide) resin, the solvent can be, for example, any of dimethyl sulfoxide (DMSO), N,N-dimethylformamide (DMF), N,N-dimethylacetamide (DMAc), N-methyl-2-pyrrolidone (NMP), 1,3-dioxolane, 1,4-dioxane, γ-butyrolactone (GBL), mixtures of these, and mixtures of one or more types of these solvents with a solvent or water that does not dissolve the porous film layer by itself.

Where necessary, the solvent to be in contact with the porous film layer may further contain any of, for example, additives, resins, and inorganic materials. Addition of these components to the solvent may help to control the viscosity of the solvent and to improve coatability thereof. Nonvolatile components such as resins, if added to the solvent, advantageously remain on a surface of the print to thereby protect the formed print. In addition, nonvolatile components such as additives and inorganic materials, if added to the solvent, remain on the densified layer and help to improve the printability when another printing (second printing) is carried out on the densified layer.

Exemplary processes for bringing the printed porous film layer into contact with a solvent include, but are not limited to, a process of immersing the printed porous film layer in the solvent; a process of applying the solvent to a surface of the porous film layer using a coating procedure or device such as a die coater, a roll coater, a bar coater, a gravure coater, or a spin coater; a process of spraying the solvent to a surface of the porous film layer typically with a spray; a process of heating and thereby evaporating the solvent, and applying the vapor of the solvent to a surface of the porous film layer; a process of impregnating a liquid-absorbable article such as a nonwoven fabric or sponge with the solvent, and bringing the absorbed article into contact with the porous film layer to transfer the solvent thereto; ink-jet printing process; screen printing process; offset printing process; gravure printing process; and relief printing process. The porous film layer may be entirely dissolved, or partially dissolved typically for the purpose of applying another printing. In the latter case, a common printing process such as ink-jet printing, screen printing, offset printing, gravure printing, or relief printing is effective.

Bringing the printed porous film layer into contact with the solvent may be carried out at ordinary temperature (room temperature) or carried out while heating at least one of the porous film layer and solvent to increase the solubility.

The porous film layer should be dissolved to such a degree as not to cause deformation of the print. Typically, the entire porous film layer other than a printed portion may be dissolved or only a surface layer of the porous film layer other than the printed portion may be dissolved. The degree of dissolution may be such as to ensure sufficient denseness of the resulting dried layer to prevent liquid absorption.

[Step (3A)]

In Step (3A), the solvent is evaporated (dried). As is described above, the porous film layer is dissolved in a solvent in Step (2A) and/or Step (3A). Evaporating (drying) the solvent yields a densified layer 10. When the porous film layer is dissolved and then the solvent is evaporated, a large number of pores collapse to give a densified layer. This may improve the strength of the printed portion and adhesion of the print. This may also improve the interlayer adhesion between a support and a porous film layer when the base to be printed is an assembly of the support and the porous film layer. Additionally, the densified surface layer of the printed article helps to solve problems which may often occur in a porous material, such as swelling as a result of absorbing water or another liquid. It also helps to improve the gas barrier properties and abrasion resistance and, in addition, to increase the strength of the resulting printed article.

Evaporation of the solvent is generally conducted by heating. The heating temperature and heating duration may be suitably set according to the type of a solvent to be used. Typically, a high-boiling-point solvent with low volatility (e.g., NMP), if used, may be evaporated and removed through a heat treatment typically at about 200° C. for about 10 minutes. A highly volatile solvent (e.g., THF), if used, may be evaporated and removed through a heat treatment at about 100° C. for about 10 minutes. The heat treatment may also be conducted at higher temperatures.

In a preferred embodiment of the present invention, when the porous film layer used in Step (1) has contact angles with water of $\Theta A_{1000}$ and $\Theta A_{100}$ upon lapses of 1000 msec and 100 msec, respectively, as measured (at a temperature of 25° C. and humidity of 60%) after dropping the water (1 μl) to a surface of the porous film layer, the ratio of $\Theta A_{1000}$ to $\Theta A_{100}$ ($\Theta A_{1000}/\Theta A_{100}$) is less than 0.6 ($\Theta A_{1000}/\Theta A_{100} < 0.6$), and when the densified layer obtained through desolvation in Step (3A) has contact angles with water of $\Theta B_{1000}$ and $\Theta B_{100}$ as measured upon lapses of 1000 μsec and 100 msec, respectively, after dropping the water onto a surface of the densified layer, the ratio of $\Theta B_{1000}$ to $\Theta B_{100}$ ($\Theta B_{1000}/\Theta B_{100}$) is more than 0.6 ($\Theta B_{1000}/\Theta B_{100} > 0.6$).

When $\Theta A_{1000}/\Theta A_{100}$ is less than 0.6, it means that the water droplet is rapidly absorbed by pores of the porous film layer, since the contact angle decreases with absorption of the water droplet. The relational expression: $\Theta A_{1000}/\Theta A_{100} < 0.6$ may be satisfied typically by adjusting the average pore diameter, porosity, thickness, and gas permeability of the porous film layer. When this relational expression is satisfied, in general, a solvent in a printing ink or paste may be rapidly absorbed by pores of the porous film layer upon printing, and the ink or paste may thereby have an increased viscosity to lose fluidity. Thus, the solid material in the ink or paste remains on the porous surface to avoid bleeding and to give a printed pattern excellent in fine-line depictability. The ratio $\Theta A_{1000}/\Theta A_{100}$ may be less than 0.6, is preferably 0.55 or less, and more preferably 0.5 or less. The lower limit of the ratio $\Theta A_{1000}/\Theta A_{100}$ is, for example, 0.1, and preferably 0.2. The contact angle $\Theta A_{100}$ is preferably 10 degrees to 80 degrees, and more preferably 20 degrees to 60 degrees.

When the ratio $\Theta B_{1000}/\Theta B_{100}$ is more than 0.6, it means that the water droplet is absorbed by the densified layer slowly, i.e., that a large number of pores collapse to give a densified layer. The relational expression: $\Theta B_{1000}/\Theta B_{100} > 0.6$ may be satisfied typically by adjusting or setting the process of bringing the porous film layer into contact with the solvent, the type and amount of the solvent, and the temperature and duration of the contact with the solvent in Step (2A). When this relational expression is satisfied, the printed article has a densified surface to show high adhesion of the print or surface layer (when the base to be printed is an assembly). The ratio $\Theta B_{1000}/\Theta B_{100}$ may be more than 0.6 and is preferably 0.65 or more. The upper limit of the ratio $\Theta B_{1000}/\Theta B_{100}$ is 1. The contact angle $\Theta B_{100}$ is preferably 10 degrees to 80 degrees, and more preferably 20 degrees to 60 degrees.

A porous film layer may suffer from problems such as swelling as a result of absorption of water or another liquid. In the method according to the present invention, the porous film layer is thermally melted to collapse pores to thereby give a densified surface. Thus, problems such as swelling due to absorption of a liquid may be prevented. The degree of densification of the porous film layer by the treatments of dissolution with a solvent and evaporation is determined based on the ratio of $\Theta A_{1000}$ to $\Theta B_{1000}$ ($\Theta A_{1000}/\Theta B_{1000}$). In an embodiment, the ratio $\Theta A_{1000}/\Theta B_{1000}$ is less than 1 and is preferably less than 0.85, and more preferably less than 0.7. The lower limit of the ratio $\Theta A_{1000}/\Theta B_{1000}$ is, for example, 0.02, and preferably 0.05.

A method of producing a printed pattern according to another embodiment of the present invention (method 2) includes the steps of (1) carrying out printing on a porous film layer, (2B) thermally melting the printed porous film layer, and (3B) cooling and solidifying the molten layer, to form a densified layer. FIG. 28 depicts explanatory drawings (as cross-sectional views) of the method of producing a printed pattern, as another embodiment of the present invention, in which 1 stands for a porous film layer, stands for a support, 7 stands for a print, 10 stands for a molten porous film layer, and 11 stands for a densified layer.

[Step (1)]

Step (1) is as with the Step (1) in the method 1 of producing a printed pattern, except for the thickness of the porous film layer.

The thickness of the porous film layer is, for example, 0.1 to 1000 μm. When the substrate for a printed article (base to be printed) is composed of a porous film layer alone, the thickness of the porous film layer is preferably 5 to 100 μm, and more preferably 25 to 70 μm. When the substrate for a printed article (base to be printed) is an assembly of a support of dense layer and a porous film layer, the thickness of the porous film layer is generally 0.1 to 100 μm, preferably 0.1 to 25 μm, and more preferably 1 to 10 μm. When the substrate for a printed article (base to be printed) is an assembly of a support having a large number of through holes (e.g., a mesh cloth) and a porous film layer, the thickness of the porous film layer is generally 0.5 to 1000 μm, preferably 1 to 1000 μm, and more preferably 5 to 500 μm. A porous film layer having an excessively small thickness may not sufficiently absorb a main solvent of a printing ink (paste). In contrast, a porous film layer having an excessively large thickness may be unlikely to have a uniformly controlled distribution of pore diameters. The thickness of the porous film layer is preferably two times or more, and particularly preferably ten times or more the average pore diameter.

[Step (2B)]

In Step (2B), the porous film layer 1 bearing a print 3 is thermally melted. The reference numeral "10" in FIG. 28 stands for a molten porous film layer after thermal melting. Exemplary procedures for thermally melting the porous film layer include, but are not particularly limited to, heating the porous film layer with an infrared heater; bringing the porous film layer into contact with a heating roll; and placing the porous film layer in a heating oven. With respect to the degree of thermal melting of the porous film layer, the porous film layer may be fully or completely melted, or the porous film layer may be partially melted only in its surface layer and still have a residual porous portion. The thermal melting of the porous film layer may be verified typically by elimination of liquid absorptivity of the surface after cooling/solidifying. The degree of thermal melting of the porous film layer may be such as to ensure sufficient denseness to prevent liquid absorption after cooling/solidifying.

The temperature and duration of thermal melting of the porous film layer may vary depending on the melting point/ glass transition point of a material constituting the porous film layer and may be selected suitably within a range where the print does not deform. In general, thermal melting is conducted at a temperature of 180° C. to 450° C., and preferably 200° C. to 420° C. for a duration of about 1 minute to 5 hours, and preferably about 10 minutes to 1 hour. Typically, when thermal melting is conducted by heating in a heating oven for 30 minutes, the heating temperature is preferably 220° C. to 270° C. when the porous film layer is composed of a polycarbonate; is preferably 270° C. to 400° C. when the porous film layer is composed of a poly(ether imide); and is preferably 250° C. to 360° C. when the porous film layer is composed of a poly(ether sulfone).

[Step (3B)]

In Step (3B), the molten porous film layer 10 is solidified by cooling to form a densified layer 11. By thermally melting the porous film layer, and cooling and solidifying the molten porous film layer, a large number of pores collapse to give a densified layer. This helps to increase the strength of the printed portion and adhesion of the print. This also helps to improve interlayer adhesion between a support and a porous film layer when the base to be printed is an assembly of the support and the porous film layer. Additionally, the densified surface layer of the printed article helps to solve problems which may often occur in a porous material, such as swelling as a result of absorbing water or another liquid. It also helps to improve the gas barrier properties and abrasion resistance and, in addition, to increase the strength of the resulting printed article.

The procedure for cooling/solidifying is not particularly limited and may be standing to cool or forced cooling.

In a preferred embodiment of the present invention, when the porous film layer used in Step (1) has contact angles with water of $\Theta A_{1000}$ and $\Theta A_{100}$ upon lapses of 1000 msec and 100 msec, respectively, as measured (at a temperature of 25° C. and humidity of 60%) after dropping the water (1 μl) to a surface of the porous film layer, the ratio of $\Theta A_{1000}$ to $\Theta A_{100}$ ($\Theta A_{1000}/\Theta A_{100}$) is less than 0.6 ($\Theta A_{1000}/\Theta A_{100}<0.6$), and when the densified layer obtained through cooling/solidifying in Step (3) has contact angles with water of $\Theta B_{1000}$ and $\Theta B_{100}$ as measured upon lapses of 1000 msec and 100 msec, respectively, after dropping the water onto a surface of the densified layer, the ratio of $\Theta B_{1000}$ to $\Theta B_{100}$ ($\Theta B_{1000}/\Theta B_{100}$) is more than 0.6 ($\Theta B_{1000}/\Theta B_{100}>0.6$).

When $\Theta A_{1000}/\Theta A_{100}$ is less than 0.6, it means that the water droplet is rapidly absorbed by pores of the porous film layer, since the contact angle decreases with absorption of the water droplet. The relational expression: $\Theta A_{1000}/\Theta A_{100}<0.6$ may be satisfied typically by adjusting the average pore diameter, porosity, thickness, and gas permeability of the porous film layer. When this relational expression is satisfied, in general, a solvent in a printing ink or paste may be rapidly absorbed by pores of the porous film layer upon printing, and the ink or paste may thereby have an increased viscosity to lose fluidity. Thus, the solid material in the ink or paste remains on the porous surface to avoid bleeding and to give a printed pattern excellent in fine-line depictability. The ratio $\Theta A_{1000}/\Theta A_{100}$ is preferably 0.55 or less, and more preferably 0.5 or less. The lower limit of the ratio $\Theta A_{1000}/\Theta A_{100}$ is, for example, 0.1, and preferably 0.2. The contact angle $\theta A_{100}$ is preferably 10 degrees to 80 degrees, and more preferably 20 degrees to 60 degrees.

When the ratio $\Theta B_{1000}/\Theta B_{100}$ is more than 0.6, it means that the water droplet is absorbed by the densified layer slowly, i.e., that a large number of pores collapse to give a densified layer. The relational expression: $\Theta B_{1000}/\Theta B_{100}>0.6$ may be satisfied typically by adjusting the temperature and duration of thermal melting in Step (2B). When this relational expression is satisfied, the printed article has a densified surface to show high adhesion of the print or surface layer (when the base to be printed is an assembly). The ratio $\Theta B_{1000}/\Theta B_{100}$ is preferably 0.65 or more. The upper limit of the ratio $\Theta B_{1000}/\Theta B_{100}$ is 1. The contact angle $\Theta B_{100}$ is preferably 10 degrees to 80 degrees, and more preferably 20 degrees to 60 degrees.

A porous film layer may suffer from problems such as swelling as a result of absorption of water or another liquid. In the method according to the present invention, the porous film layer is thermally melted to collapse pores to thereby give a densified surface. Thus, problems such as swelling due to liquid absorption may be prevented. The degree of densification of the porous film layer by thermal melting and subsequent cooling and solidification may be determined based on the ratio of $\Theta A_{1000}$ to $\Theta B_{1000}$ ($\Theta A_{1000}/\Theta B_{1000}$) In an embodiment of the present invention, the ratio $\Theta A_{1000}/\Theta B_{1000}$ is less than 1, preferably less than 0.85, and more preferably less than 0.7. The lower limit of the ratio $\Theta A_{1000}/\Theta B_{1000}$ is, for example, 0.02, and preferably 0.05.

The porous film layer herein is subjected to thermal melting and cooling/solidifying to densify the porous layer; and the resulting layer thereby has an increased tensile strength. Specifically, when the densified layer after cooling/solidifying in Step (3B) has a tensile strength F2, and the porous film layer used in Step (1) has a tensile strength F1, the ratio of F2 to F1 (F2/F1) may be more than 1. The ratio F2/F1 may serve as an index of the degree of densification, and is preferably 1.5 or more, and more preferably 2 or more. The upper limit of the ratio F2/F1 is, for example, 100.

Printed articles bearing printed patterns formed by the methods of producing a printed pattern according to the present invention are free typically from bleeding and excel in fine-line depictability. Additionally, they have high adhesion of the print and surface layer (when the base to be printed is an assembly) and are resistant to breakage. Exemplary printed articles herein include printed circuit boards (printed wiring boards); as well as inductors, electroluminescent devices (EL) and other luminous elements, resistors, capacitors, transistors, and other components (electric/electronic components); and electromagnetic shielding films.

EXAMPLES

The present invention will be illustrated in further detail with reference to several examples below. It should be noted, however, that these examples are never construed to limit the scope of the present invention. Measurements in a tape peeling test were conducted and the average pore diameter and porosity were determined according to the following procedures. These average pore diameter and porosity were determined only on frontmost micropores seen in an electron micrograph, and micropores seen in the back of the micrograph were excluded from the object to be measured.

(Measurement Techniques)

Tape Peeling Test (i) An after-mentioned tape is affixed to a porous layer, and the affixed portion is traced with a roller.

(ii) A T-peel test is conducted with a tensile tester [supplied by ORIENTEC Co., Ltd. under the trade name of "TENSILON RTA-500"] under a condition of 50 mm/min.

(iii) The presence or absence of interfacial delamination between the porous layer and the base is observed.

Tape: Film Masking Tape No. 603 (#25) supplied by Teraoka Seisakusho Co., Ltd., 24-mm wide Roller: having a diameter of 30 mm and a load of 200 gf Average Pore Diameter Areas of pores at arbitrary 30 or more points in a surface or cross section of a sample assembly were measured based on electron micrographs, and the average of measured areas was defined as an average pore area Save. Assuming that the pores are completely round, the average pore area was converted into a pore diameter according to the following equation, and this was defined as an average pore diameter. As used herein the symbol "π" refers to the ratio of the circumference of a circle to its diameter.

Surficial or internal average pore diameter [μm]=2×(Save/π)$^{1/2}$

Porosity

The internal porosity of a porous layer was calculated according to the following equation, in which V represents the volume [cm$^3$] of the film (porous layer); W represents the weight [g] of the porous layer; and ρ represents the density [g/cm$^3$] of the material for the porous layer. The densities of a polyamideimide and a polyimide were 1.45 [g/cm$^3$] and 1.42 [g/cm$^3$], respectively.

Porosity [%]=100−100×W/(ρ·V)

Porosity of Porous Layer Assembled with Base Having Through Holes

When a porous layer is assembled (integrated) with a base having through holes, it is difficult to measure the internal porosity of the porous layer as intact. Accordingly, using a poly(ethylene terephthalate) (PET) film (supplied by Teijin DuPont Films Japan Limited under the trade name of "Type S") as a base instead of a mesh cloth, a polymer solution was cast onto the PET film, immersed in water to coagulate the cast film, and the coagulated cast film was peeled off from the PET film and dried to give a porous film. The parameters of this porous film were measured, and the internal porosity was calculated according to the following equation, in which V represents the volume [cm$^3$] of the film (porous layer); W represents the weight [g] of the porous layer; and ρ represents the density [g/cm$^3$] of the material for the porous layer. The densities of a polyamideimide and a polyimide were set at 1.45 [g/cm$^3$] and 1.42 [g/cm$^3$], respectively.

Porosity [%]=100−100×W/(ρ·V)

Example 1

A material composition for film formation was prepared by adding 30 parts by weight of a polyvinylpyrrolidone (having a molecular weight of 5×10$^4$) as a water-soluble polymer to 100 parts by weight of a polyamideimide resin solution (supplied by Toyobo Co., Ltd. under the trade name of "VYLOMAX HR11NN"; having a solid content of 15 percent by weight and a solution viscosity of 20 dPa·s/25° C. in a solvent of NMP). While holding at 25° C., this material composition was cast onto PET film (Type S, 100 μm thick) supplied by Teijin DuPont Films Japan Limited as a base, using a film applicator under conditions of a gap (clearance) between the film applicator and the base of 127 μm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 50 μm, and the assembly had a total thickness of about 150 μm.

The prepared assembly was subjected to a tape peeling test to find that the base and the porous layer suffered from no interfacial delamination therebetween. This assembly was electron-microscopically observed to find that the porous layer was in intimate contact with the PET film, had an average pore diameter of pores appearing in its surface of about 1.0 μm, was substantially homogenous inside thereof, and contained entirely dispersed continuous micropores with an average pore diameter of about 1.0 μm. The porous layer had an internal porosity of 70%.

Example 2

An assembly including a base and a porous layer arranged thereon was prepared by the procedure of Example 1, except for using the water-soluble polymer in an amount of 33.3 parts by weight and carrying out casting under a condition of a gap between the film applicator and the PET base film of 102 μm. The porous layer had a thickness of about 35 μm, and the assembly had a total thickness of about 135 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 70%.

Example 3

An assembly including a base and a porous layer arranged thereon was prepared by the procedure of Example 1, except for using the water-soluble polymer in an amount of 40 parts by weight and carrying out casting under a condition of a gap between the film applicator and the PET base film of 51 μm. The porous layer had a thickness of about 15 μm, and the assembly had a total thickness of about 115 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 4

A material composition for film formation was prepared by adding 40 parts by weight of a polyvinylpyrrolidone (having a molecular weight of 5×10$^4$) as a water-soluble polymer to 100 parts by weight of a polyamideimide resin solution (supplied by Toyobo Co., Ltd. under the trade name of "VYLOMAX HR11NN"; having a solid content of 15 percent by weight and a solution viscosity of 20 dPa·s/25° C. in a solvent of NMP). While holding at 25° C., this material composition was cast onto a PET film (Type G2, 50 μm thick) supplied by Teijin DuPont Films Japan Limited as a base, using a film applicator under a condition of a gap between the film applicator and the base of 51 μm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 15 μm, and the assembly had a total thickness of about 65 μm.

The prepared assembly was subjected to a tape peeling test to find that the base and the porous layer suffered from no interfacial delamination therebetween. The film structure of the porous layer was electron-microscopically observed to find that the porous layer was in intimate contact with the PET film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 5

An assembly including a base and a porous layer arranged thereon was prepared by the procedure of Example 4, except for using, instead of the PET film Type G2, a PET film (Type HS, antistatically treated, 100 μm thick) supplied by Teijin DuPont Films Japan Limited as the base. The resulting porous layer had a thickness of about 15 μm, and the assembly had a total thickness of about 115 μm.

The prepared assembly was subjected to a tape peeling test to find that the base and the porous layer suffered from no interfacial delamination therebetween. This assembly was electron-microscopically observed to find that the porous layer was in intimate contact with the PET film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 6

An assembly including a base and a porous layer arranged thereon was prepared by the procedure of Example 4, except for using the water-soluble polymer in an amount of parts by weight and using, instead of the PET film, a polypropylene film (50 μm thick) as the base. The resulting porous layer had a thickness of about 15 μm, and the assembly had a total thickness of about 65 μm.

The prepared assembly was subjected to a tape peeling test to find that the base and the porous layer suffered from no interfacial delamination therebetween. This assembly was electron-microscopically observed to find that the porous layer was in intimate contact with the PET film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 7

A material composition for film formation was prepared by adding 40 parts by weight of a polyvinylpyrrolidone (having a molecular weight of $5\times10^4$) as a water-soluble polymer to 100 parts by weight of a polyamideimide resin solution (supplied by Toyobo Co., Ltd. under the trade name of "VYLO-MAX HR11NN"; having a solid content of 15 percent by weight and a solution viscosity of 20 dPa·s/25° C., in a solvent of NMP). While holding at 25° C., this material composition was cast onto a polyimide film (supplied by DuPont-Toray Co., Ltd. under the trade name of "Kapton 100H," 25 μm thick) as a base, using a film applicator under a condition of a gap between the film applicator and the base of 51 μm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 20 μm, and the assembly had a total thickness of about 45 μm.

The prepared assembly was subjected to a tape peeling test to find that the tape was peeled off at an interface with the porous layer, and the base and the porous layer remained in intimate contact without interfacial delamination therebetween. This assembly was electron-microscopically observed to find that the porous layer was in intimate contact with the polyimide film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Comparative Example 1

The procedure of Example 7 was repeated, except that a PET film (supplied by Teijin DuPont Films Japan Limited under the trade name of "Type S") was used as a base instead of the polyimide film; the material composition was cast onto the PET film, and then immersed in water for coagulation, the coagulated porous film was transferred to a polyimide film (supplied by DuPont-Toray Co., Ltd. under the trade name of "Kapton 100H," 25 μm thick) and dried, to give a porous film (assembly).

The prepared assembly was subjected to a tape peeling test to find that interfacial delamination between the polyimide film and the porous layer partially occurred before the tape was peeled off at an interface with the porous layer. This is probably because the thin porous layer wrinkled when it was transferred to the polyimide film, and thereby the assembly included two or more portions containing interlayer air gaps between the porous layer and the polyimide film. This assembly was electron-microscopically observed and found to have two or more portions where the porous layer was not in intimate contact with the polyimide film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 8

A material composition for film formation was prepared by mixing a solution of a polyamic acid (supplied by Ube Industries, Ltd. under the trade name of "U-Varnish-A"; having a solid content of 18 percent by weight and a solution viscosity of 5 Pa·s/30° C., in a solvent of NMP) as a polyimide precursor, a polyvinylpyrrolidone (having a molecular weight of $5\times10^4$) as a water-soluble polymer, and NMP as a solvent in such proportions that the weight ratio of polyamic acid/NMP/polyvinylpyrrolidone was 15/85/33.3. While holding at 25° C., this material composition was cast onto a polyimide film (Kapton 100H, 25 μm thick) supplied by DuPont-Toray Co., Ltd. as a base, using a film applicator under a condition of a gap between the film applicator and the base of 25 μm. Immediately after casting, the article was placed in a vessel and held at a temperature of 50° C. and humidity of about 100% for 8 minutes. The article was then immersed in water for coagulation and dried in a thermostat chamber at a temperature of 30° C. without peeling off from the base. Next, the polyamic acid constituting the porous layer was imidated by heating in a thermostat chamber at 270° C. for 30 minutes, to thereby give an assembly including the base and a polyimide porous film arranged thereon. The porous layer had a thickness of about 20 μm, and the assembly had a total thickness of about 45 μm.

The prepared assembly was subjected to a tape peeling test to find that the tape was peeled at an interface with the porous layer, and the base and the porous layer remained in intimate contact without interfacial delamination therebetween. This assembly was electron-microscopically observed to find that the porous layer was in intimate contact with the polyimide film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 9

An assembly including a base and a porous layer arranged thereon was prepared by the procedure of Example 8, except for using, instead of the polyvinylpyrrolidone, a polyethylene glycol (having a molecular weight of 400) as the water-soluble polymer, and for mixing materials in such proportions that the weight ratio of polyamic acid/NMP/polypropylene glycol was 15/85/20. The porous layer had a thickness of about 4 μm, and the assembly had a total thickness of about 29 μm.

The prepared assembly was subjected to a tape peeling test to find that the base and the porous layer suffered from no interfacial delamination therebetween. This assembly was electron-microscopically observed to find that the porous layer was in intimate contact with the polyimide film, had an average pore diameter of pores appearing in its surface of about 0.1 μm, was substantially homogenous inside thereof, and contained entirely dispersed continuous micropores with an average pore diameter of about 0.1 μm. The porous layer had an internal porosity of 70%.

Example 10

The assembly obtained in Example 7 (having a base/(porous layer) combination of polyimide/polyamideimide) was subjected to a heating treatment in a thermostat chamber at 270° C. for 30 minutes to carry out thermal cross-linking and insolubilization of the polyamideimide constituting the porous layer to thereby impart chemical resistance to the porous layer. The assembly whose porous layer had been imparted with solvent resistance by heating treatment was not dissolved in NMP even 10 minutes after immersion. In contrast, the assembly prepared in Example 7 (before heating treatment) dissolved in NMP within several seconds after immersion.

The prepared assembly was subjected to a tape peeling test to find that the tape was peeled off at an interface with the newly formed porous layer, and the base and the porous layer remained in intimate contact without interfacial delamination therebetween. This assembly was electron-microscopically observed to find that the newly formed porous layer was in intimate contact with the base, had an average pore diameter of pores appearing in its surface of about 0.3 μm, was substantially homogenous inside thereof, and contained entirely dispersed continuous micropores with an average pore diameter of about 0.3 μm. The newly formed porous layer had an internal porosity of 70%.

Example 11

A porous layer of polyamideimide about 20 μm thick was formed on a side of the base bearing no porous layer in the assembly prepared in Example 7 [having a base/(porous layer) combination of polyimide film (25 μm)/polyamideimide (20 μm)] by the procedure of Example 7 and thereby yielded a both-sided multilayer assembly having a total thickness of about 65 μm and having a layer structure of (porous layer)/base/(porous layer) of polyamideimide (20 μm)/polyimide (25 μm)/polyamideimide (20 μm).

The prepared assembly was subjected to a tape peeling test to find that the base and the porous layer suffered from no interfacial delamination therebetween. This assembly was electron-microscopically observed to find that the porous layer was in intimate contact with the polyimide film, had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example 12

A material composition for film formation was prepared by adding 45 parts by weight of a polyvinylpyrrolidone (having a molecular weight of $5 \times 10^4$) as a water-soluble polymer to 100 parts by weight of a poly(ether imide) resin solution (supplied by GE Plastics Japan Ltd. under the trade name of "ULTEM 1000"; having a solid content of 15 percent by weight, in a solvent of NMP). While holding at 25° C., this material composition was cast onto a polyimide film (Kapton 100H, 25 μm thick) supplied by DuPont-Toray Co., Ltd. as a base, using a film applicator under a condition of a gap between the film applicator and the polyimide base film of 51 μm. Immediately after casting, the article was placed in a vessel and held at a temperature of 50° C. and humidity of about 80% for 30 seconds. The article was then immersed in water for coagulation, subjected to air drying at room temperature without peeling off from the polyimide film, and thereby yielded an assembly including the base and a porous layer arranged thereon. The porous layer had a thickness of about 20 μm, and the assembly had a total thickness of about 45 μm.

The prepared assembly was subjected to a tape peeling test to find that the base and the porous layer suffered from no interfacial delamination therebetween. This assembly was electron-microscopically observed to find that the porous layer was in intimate contact with the polyimide film, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 80%.

Example 13

A novolak epoxy resin (supplied by Tohto Kasei Co., Ltd. under the trade name of "YDCN-701") was diluted with xylene, to give a chemical-resistance improver containing 5 parts by weight of the novolak epoxy resin and 100 parts by weight of the solvent. The assembly obtained in Example 7 (having a base/(porous layer) combination of polyimide film/ polyamideimide) was immersed in this chemical-resistance improver for 3 minutes and retrieved from the coating composition (chemical-resistance improver), followed by air drying. The dried assembly was fixed to a Teflon (registered trademark) plate with a polyimide tape and then heated in a thermostat chamber at 220° C. for 30 minutes to cure the novolak epoxy resin. The obtained assembly was electron-microscopically observed to find that the porous layer was substantially homogeneous inside thereof and contained entirely dispersed continuous micropores as with the assembly prepared in Example 7.

Example 14

A fluorocarbon resin for painting (supplied by Asahi Glass Co., Ltd. under the trade name of "Lumiflon LF-200") and a polyisocyanate compound (supplied by Nippon Polyurethane Industry Co., Ltd. under the trade name of "Coronate HX") were diluted with xylene to give a coating composition containing 0.86 part by weight of the fluorocarbon resin, 0.14 part by weight of the polyisocyanate compound, and 100 parts by weight of the solvent.

The film (assembly) bearing a porous film prepared in Example 7 (having a polyamideimide porous layer and a polyimide base film) was immersed in the coating composition for 3 minutes, retrieved from the coating composition, and air-dried. Next, the dried film having the porous layer was fixed to a Teflon (registered trademark) plate with a polyimide tape, and heated in a thermostat chamber at 270° C. for 30 minutes to cure the fluorocarbon resin/polyisocyanate compound. The obtained assembly was electron-microscopically observed to find that the porous layer was substantially homogeneous inside thereof and had entirely dispersed continuous micropores as with the assembly prepared in Example 7.

Example 15

A circuit board was produced according to the following procedure using the assembly prepared in Example 13.

A naphthoquinone diazide-containing phenolic resin (having a naphthoquinone diazide content of 33 equivalent mole percent) was dissolved in acetone to give a photosensitive composition as a 1 percent by weight solution. The obtained solution was applied, by dipping, to both sides of the assembly prepared in Example 13. This procedure gave a coat of the naphthoquinone diazide-containing phenolic resin covering surfaces of internal pores of the porous layer. Drying at room temperature for 30 minutes gave a photosensitive composition-coated layer.

The surface of the porous layer of the assembly bearing the photosensitive composition-coated layer was exposed to light at an exposure of 500 mJ/cm$^2$ and a wavelength of 436 nm through a mask with a line width of 1 mm and a space of 1 mm, to form a latent image composed of indenecarboxylic acid. The assembly bearing the patterned latent image was subjected to a catalyst deposit treatment according to a catalyzer-accelerator process. Specifically, the assembly was immersed in an aqueous copper sulfate solution adjusted to 0.5 M for 5 minutes and then rinsed with distilled water three times. The aqueous copper sulfate solution used had a pH of 4.1. The rinsed film was immersed in a 0.01 M aqueous sodium borohydride solution for 30 minutes and rinsed with distilled water. The catalyst formation treatment gave a member having reduced copper in the patterned latent image portion. The obtained material for a circuit board had a pattern with a line width of 1 mm and a space of 1 mm. The thus-obtained material for a circuit board was further immersed in an electroless copper plating bath for 30 minutes to apply copper plating to the exposed patterned portion, to thereby give a circuit board having a pattern of interconnections with a line width of 1 mm and a space of 1 mm.

Example 16

A circuit board having a pattern of copper interconnections with a line width of 1 mm and a space of 1 mm in exposed patterned portions was produced by the procedure of Example 15, except for using the assembly prepared in Example 8.

Example 17

A material for a circuit board was prepared by using the assembly prepared in Example 7 [having a base/(porous layer) combination of polyimide film (25 μm)/polyamideimide (20 μm)] as an assembly and employing a sensitizing-activating process as a deposit of catalyst. Specifically, the sensitizing-activating process was conducted according to the following procedure.

A sensitizing agent was prepared as a stannous chloride solution containing 0.89 mol/m$^3$ SnCl$_2$ and 2.4 mol/m$^3$HCl. Additionally, an activating agent was prepared as a palladium chloride solution containing 0.56 mol/m$^3$ PdCl$_2$ and 12.0 mol/m$^3$HCl.

The assembly was immersed in the sensitizing agent for 120 seconds and rinsed with ion exchanged water. Next, the assembly was immersed in the activating agent for 60 seconds and rinsed with ion exchanged water. Thus, the surface of the assembly was treated with a catalyst (activation through formation of catalyst nuclei).

A nickel plating bath was prepared as a solution by sequentially dissolving 3 g of nickel(II) sulfate hexahydrate (NiSO$_4$.6H$_2$O), 1 g of sodium citrate dihydrate, and 1 g of sodium hypophosphite monohydrate in 100 ml of ion exchanged water.

As soon as the multilayer assembly after the catalyst formation was immersed in the nickel plating bath heated at 90° C., bubbles evolved and a nickel coat was deposited on the surface of the porous layer. The multilayer assembly was retrieved 10 minutes later and rinsed with ion exchanged water, followed by air drying. The nickel coat was found to selectively deposit on the porous layer surface in the multilayer assembly. There was slight deposition of nickel coat on the base (homogeneous polyimide layer), but this nickel coat was completely removed by the subsequent rinsing with ion exchanged water. Regarding the thus-obtained assembly, it is considered that a large amount of the catalyst was attached to the porous layer which had a large surface area as a result of the catalyst formation, this accelerated the deposition of nickel, and the deposited nickel was entangled with and thereby firmly fixed to the porous layer. In contrast, a nickel coat was not formed on the base surface ultimately, probably because a very small amount of the catalyst was attached to the base surface, and nickel did not entangle with such homogeneous surface of the base.

Example 18

A material for a circuit board was prepared by the procedure of Example 17, except for using the assembly prepared in Example 8 [having a base/(porous layer) combination of polyimide film (25 μm)/polyimide (20 μm)] as an assembly.

Example 19

Printing with a conductive ink was carried out on an assembly according to screen printing under conditions of a printing speed of 30 mm/sec and a printing pressure of 0.1 MPa using a screen mask with a pattern of interconnections having a line-and-space of 20 μm (L/S=20 μm/20 μm). The assembly was the assembly prepared in Example 7 [having a base/(porous layer) combination of polyimide film (25 μm)/polyamideimide (20 μm)]; and the conductive ink was a silver paste supplied by Fujikura Kasei Co., Ltd. under the trade name of NANO DOTITE XA9053. A screen printing machine LS-25TVA supplied by Newlong Seimitsu Kogyo Co., Ltd. was used herein. After printing, the article was held at 180° C. for 30 minutes to cure the conductive ink to thereby form interconnections. The used ink was of a type in which silver oxide is reduced into silver by heating, and the ink was black immediately after printing but showed metallic silver luster after heating. The printed article was electron-microscopically observed to find that a pattern of interconnections with a line-and-space (L/S) of 20 μm/20 μm was formed.

Example 20

A material composition for film formation was prepared by adding 15 parts by weight of a polyvinylpyrrolidone (having a molecular weight of $5 \times 10^4$) as a water-soluble polymer to 100 parts by weight of a polyamideimide resin solution (supplied by Toyobo Co., Ltd. under the trade name of "VYLO-MAX N-100H"; having a solid content of 15 percent by weight and a solution viscosity of 60 dPa·s/25° C. in a solvent of NMP). While holding at 25° C., this material composition was cast onto a polyimide film (supplied by DuPont-Toray Co., Ltd. under the trade name of "Kapton 100H," 25 μm thick) as a base, using a film applicator. The casting was conducted under a condition of a gap between the film applicator and the base of 89 μm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 14 μm, and the assembly had a total thickness of about 39 μm.

The prepared assembly was subjected to a tape peeling test to find that the tape was peeled at an interface with the porous layer, and the base and the porous layer remained in intimate contact without interfacial delamination therebetween. This assembly was electron-microscopically observed to find that the porous layer was in intimate contact with the polyimide film, had an average pore diameter of pores appearing in its surface of about 1 μm, was substantially homogenous inside thereof, and contained entirely dispersed continuous micropores with an average pore diameter of about 1 μm. The porous layer had an internal porosity of 70%.

Example 21

An assembly including a base and a porous layer arranged thereon was prepared by the procedure of Example 7, except for using the polyvinylpyrrolidone (having a molecular weight of $5 \times 10^4$) as the water-soluble polymer in an amount of 30 parts by weigh. The resulting porous layer had a thickness of about 23 μm, and the assembly had a total thickness of about 48 μm.

The prepared assembly was subjected to a tape peeling test to find that the tape was peeled at an interface with the porous layer, and the base and the porous layer remained in intimate contact without interfacial delamination therebetween. This assembly was electron-microscopically observed to find that the porous layer was in intimate contact with the polyimide film, had an average pore diameter of pores appearing in its surface of about 1 μm, was substantially homogenous inside thereof, and contained entirely dispersed continuous micropores with an average pore diameter of about 1 μm. The porous layer had an internal porosity of 70%.

Example 22

An assembly including a base and a porous layer arranged thereon was prepared by the procedure of Example 1, except for using a PET film supplied by Teijin DuPont Films Japan Limited (under the trade name of "HS74AS," 100 μm thick) as the base and casting the material composition for film formation onto an AS side (antistatically treated side) of the film under a condition of a gap between the film applicator and the base of 13 μm. The resulting porous layer had a thickness of 7 μm, and the assembly had a total thickness of about 107 μm.

The prepared assembly was subjected to a tape peeling test to find that the tape was peeled at an interface with the porous layer, and the base and the porous layer remained in intimate contact without interfacial delamination therebetween. This assembly was electron-microscopically observed to find that the porous layer was in intimate contact with the PET film, had an average pore diameter of pores appearing in its surface of about 1 μm, was substantially homogenous inside thereof, and contained entirely dispersed continuous micropores with an average pore diameter of about 1 μm. The porous layer had an internal porosity of 70%.

Example 23

A circuit board was produced by carrying out screen printing as printing using a screen mask with a pattern of interconnections with a line-and-space (L/S) of 20 μm/20 μm by the procedure of Example 19, except for using the assembly prepared in Example 21 [having a base/(porous layer) combination of polyimide film (25 μm)/polyamideimide (23 μm)] as the assembly. The prepared circuit board was electron-microscopically observed to find that a pattern of interconnections with a line-and-space (L/S) of 20 μm/20 μm was formed.

Example 24

A circuit board was produced by carrying out screen printing as printing using a screen mask with a pattern of interconnections with a line-and-space (L/S) of 20 μm/20 μm by the procedure of Example 19, except for using the assembly prepared in Example 22 [having a base/(porous layer) combination of PET film (100 μm)/polyamideimide (7 μm)]. The prepared circuit board was electron-microscopically observed to find that a pattern of interconnections with a line-and-space (L/S) of 20 μm/20 μm was formed.

Example 25

Pores of the polyamideimide porous layer of the circuit board prepared in Example 23 were filled with a resin according to the following procedure.

The circuit board was fixed on a top of a hot plate supplied by KOIKE PRECISION INSTRUMENTS Co., Ltd. (under the trade name of "MODEL HP-19U300") with a polyimide tape and raised in temperature to 60° C. Additionally, a curable resin (uncured epoxy resin) was prepared as a 100:30 (by weight) mixture of Component A and Component B of an epoxy resin supplied by Huntsman Advanced Materials (two-component epoxy resin under the trade name of "Araldite 2020"). The curable resin was placed on a porous layer-side surface of the circuit board. The curable resin was spread overall with a fluorocarbon-resin spatula so that pores of the porous layer were fully filled with the uncured epoxy resin (curable resin). After removing excess epoxy resin with the spatula and wiping paper, the article as intact was heated at 60° C. for 1.5 hours to cure the epoxy resin to thereby give a circuit board having resin-filled pores in its porous layer.

Example 26

A circuit board having resin-filled pores in its porous layer was produced by the procedure of Example 25, except for using, as the epoxy resin, a curable resin prepared as a 100:80 (by weight) mixture of Component A and Component B of another two-component epoxy resin supplied by Huntsman Advanced Materials under the trade name of "Araldite 2011."

Example 27

Pores of the polyamideimide porous layer of the circuit board prepared in Example 23 were filled with a resin according to the following procedure.
The circuit board was fixed on a top of a hot plate supplied by KOIKE PRECISION INSTRUMENTS Co., Ltd. (under the trade name of "MODEL HP-19U300") with a polyimide tape and raised in temperature to 60° C. Additionally, a curable resin (uncured epoxy resin) was prepared as a 100:30 (by weight) mixture of Component A and Component B of an epoxy resin supplied by Huntsman Advanced Materials (two-component epoxy resin under the trade name of "Araldite 2020"). The curable resin (uncured epoxy resin) was placed on a porous layer-side surface of the circuit board. The curable resin was spread overall with a fluorocarbon-resin spatula, so that pores of the porous layer were fully filled with the uncured epoxy resin, and excess epoxy resin was removed with the spatula and wiping paper.
After the resin filling according to the above procedure, a polyimide film (under the trade name of "Kapton 100H," 25 µm thick) as a cover lay was placed on a surface of the porous layer of the circuit board carefully so as to avoid air bubbles, and the cover layer was further brought into intimate contact with the surface using a spatula. The article as intact was heated at 60° C. for 1.5 hours to cure the epoxy resin to give a flexible circuit board. The produced flexible circuit board had resin-filled pores in its porous layer and further had a polyimide cover layer arranged thereon.

Example 28

The circuit board prepared in Example 25 having resin-filled pores in its porous layer was fixed on a top of hot plate supplied by KOIKE PRECISION INSTRUMENTS Co., Ltd. (under the trade name of "MODEL HP-19U300") with a polyimide tape so that the porous layer faced outward as a surface. A polyimide film-based cover lay film supplied by Nikkan Industries Co., Ltd. [under the trade name of "CISV-2525 DB," having a layer structure (thickness) of polyimide base film (25 µm)/thermosetting resin adhesive layer (25 µm)] was placed on the top of the circuit board so that the adhesive layer surface came in contact with the circuit board, from which interlayer air bubbles were removed using a spatula. An iron weight of 1.5 kg (with a bottom area of 100 cm$^2$) was placed on the cover lay film, and the article was raised in temperature to 150° C. and heated for 1.5 hours. The heating was stopped whereas the weight was placed as intact, and the article was air-cooled to room temperature to cure the adhesive layer of the cover lay film to thereby give a flexible circuit board. The flexible circuit board had resin-filled pores in its porous layer and had a polyimide cover lay arranged thereon.

Example 29

A polyimide film (supplied by Kurabo Industries Ltd. under the trade name of "MIDFIL NS," 50 µm thick) was subjected to a surface treatment (alkali treatment) by immersing in a 0.1 N aqueous sodium hydroxide solution for 60 minutes.
Next, a material composition for film formation was prepared by adding 30 parts by weight of a polyvinylpyrrolidone (having a molecular weight of $5 \times 10^4$) as a water-soluble polymer to 100 parts by weight of a polyamideimide resin solution (supplied by Toyobo Co., Ltd. under the trade name of "VYLOMAX HR11NN"; having a solid content of 15 percent by weight and a solution viscosity of 20 dPa·s/25° C., in a solvent of NMP). While holding at 25° C., this material composition was cast onto the treated surface of the polyimide film (MIDFIL NS) using a film applicator under a condition of a gap between the film applicator and the base of 51 µm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 25 µm, and the assembly had a total thickness of about 75 µm.
The prepared assembly was subjected to a tape peeling test to find that the tape was peeled at an interface with the porous layer, and the base and the porous layer remained in intimate contact without interfacial delamination therebetween. This assembly was electron-microscopically observed to find that the porous layer was in intimate contact with the polyimide film, had an average pore diameter of pores appearing in its surface of about 1 µm, was substantially homogenous inside thereof, and contained entirely dispersed continuous micropores with an average pore diameter of about 1 µm. The porous layer had an internal porosity of 70%.

Referential Example 1

The procedure of Example 29 was repeated, except for using a polyimide film not subjected to the surface treatment (alkali treatment). However, some time after immersing in water, the porous layer delaminated from the polyimide film to fail to provide an assembly.

Example 30

Pores of the polyamideimide porous layer of the circuit board prepared in Example 23 were filled with a resin according to the following procedure.
The circuit board was fixed on a top of a hot plate supplied by KOIKE PRECISION INSTRUMENTS Co., Ltd. (under the trade name of "MODEL HP-19U300") with a polyimide tape. A resin solution of a soluble resin in a solvent used herein was a resin solution supplied by Toyobo Co., Ltd. under the trade name of VYLOMAX HR15ET, containing a polyamideimide resin as a resin component and a solvent mixture of 50 percent by weight of solvent ethanol and 50 percent by weight of toluene and having a solid content of 25 percent by weight and a solution viscosity of 7 dPa·s/25° C.

The resin composition (resin solution) was placed on the porous layer of the circuit board, spread overall with a fluorocarbon-resin spatula so that pores of the porous layer were filled with the resin solution, and excess solution was removed with the spatula and wiping paper. The article was then continuously heated at 60° C. for 1.5 hours to evaporate the solvent and thereby yielded a resin-filled assembly.

Referential Example 2

The circuit board prepared in Example 23 was dipped in NMP as a solvent in a glass laboratory dish, immediately retrieved and sandwiched between wiping rags to remove excess NMP. However, the porous layer of the circuit board immediately dissolved in NMP, the patterned interconnections on the porous layer crept out, and the pattern completely deformed.

Referential Example 3

The circuit board prepared in Example 23 was treated with a solvent according to the following procedure, but the pore structure of the porous layer did not change.
The circuit board was dipped in acetone as a solvent in glass laboratory dish, immediately retrieved and sandwiched between wiping rags to remove excess acetone. Next, the article was air-dried, fixed on a top of a hot plate supplied by KOIKE PRECISION INSTRUMENTS Co., Ltd. (under the trade name of "MODEL HP-19U300") with a polyimide tape, and heated at 150° C. for 20 minutes. The porous layer of the resulting circuit board showed substantially no change as compared to that before the solvent treatment.

Examples 31 to 44 and Referential Examples 4 and 5

The circuit board prepared in Example 23 was subjected to treatments with solvent mixtures having the compositions shown in Table 1 according to the following procedure, to give a series of circuit boards whose porous layer lost its pore structure.
Specifically, each of the circuit boards was dipped in a solvent mixture in a glass laboratory dish, immediately retrieved and sandwiched between wiping rags to remove excess solvent mixture. Next, the article was air-dried, fixed on a top of a hot plate supplied by KOIKE PRECISION INSTRUMENTS Co., Ltd. (under the trade name of "MODEL HP-19U300") with a polyimide tape, and heated at 150° C. for 20 minutes. The transparency of the porous layer and how the porous layer holds the pattern of interconnections were evaluated according to the criteria mentioned below. The results are shown in Table 1.

Example 45

The circuit board prepared in Example 24 was subjected to a treatment with a solvent according to the following procedure to give a circuit board whose porous layer lost its pore structure.
Specifically, the circuit board was dipped in a 1:2 (by weight) solvent mixture of NMP and water in a glass laboratory dish, immediately retrieved and sandwiched between wiping rags to remove excess solvent mixture. Next, the article was air-dried, fixed on a top of a hot plate supplied by KOIKE PRECISION INSTRUMENTS Co., Ltd. (under the trade name of "MODEL HP-19U300") with a polyimide tape, and heated at 150° C. for 20 minutes. The solvent treatment made the polyamideimide porous layer transparent, to give a circuit board having interconnections arranged on an overall slightly yellowish transparent film.

Example 46

Printing with a conductive ink was carried out on an assembly according to screen printing under conditions of a printing speed of 10 mm/sec and a printing pressure of 0.2 MPa using a screen-printing plate having a lattice pattern with a line width of 20l and a pitch (repeating interval) of 300 μm. The assembly was the assembly prepared in Example 22 [having a base/(porous layer) combination of PET film (100 μm)/polyamideimide (7 μm)]. The conductive ink was a silver paste supplied by Fujikura Kasei Co., Ltd. under the trade name of NANO DOTITE XA9053. A screen printing machine LS-150TVA supplied by Newlong Seimitsu Kogyo Co., Ltd. was used herein. After printing, the article was held at 150° C. for 30 minutes to cure the conductive ink to thereby form interconnections. The used ink was of a type in which silver oxide is reduced into silver by heating, and the ink was black immediately after printing but showed metallic silver luster after heating. The article was electron-microscopically observed to find that a lattice pattern with a line width of 20μ and a pitch (repeating interval) of 300 μm was formed. This can be used as an electromagnetic shielding film.

Example 47

Pores of the polyamideimide porous layer of the circuit board prepared in the lattice-pattern printed article prepared in Example 46 were filled with a resin according to the following procedure.
The circuit board was fixed on a top of a hot plate supplied by KOIKE PRECISION INSTRUMENTS Co., Ltd. (under the trade name of "MODEL HP-19U300") with a polyimide tape and raised in temperature to 60° C. Additionally, a curable resin (uncured epoxy resin) was prepared as a 100:30 (by weight) mixture of Component A and Component B of an epoxy resin supplied by Huntsman Advanced Materials (two-component epoxy resin under the trade name of "Araldite 2020"). The curable resin (uncured epoxy resin) was placed on a porous layer-side surface of the lattice-pattern printed article. The curable resin was spread overall with a fluorocarbon-resin spatula so that pores of the porous layer were fully filled with the uncured epoxy resin (curable resin). After removing excess epoxy resin with the spatula and wiping paper, the article was left stand at room temperature of about 30° C. for 10 hours to cure the epoxy resin and thereby yielded a lattice-pattern printed article having resin-filled pores in its porous layer. This can be used as an electromagnetic shielding film.

Example 48

The lattice-pattern printed article prepared in Example 46 was subjected to a treatment with a solvent according to the following procedure to give a lattice-pattern printed article whose porous layer lost its pore structure.
A 1:4 (by weight) solvent mixture of NMP and acetone was sprayed to the lattice-pattern printed article with a spray supplied by Furupla Co., Ltd. (under the trade name of "DiaSpray Excellent NO. 3530") to wet the entire article homogenously. Next, the article was air-dried, fixed on a top of a hot plate supplied by KOIKE PRECISION INSTRUMENTS Co., Ltd. (under the trade name of "MODEL HP-19U300") with a polyimide tape, and heated at 60° C. for 60 minutes. The solvent treatment made the polyamideimide porous layer transparent to give a lattice-pattern printed article having a lattice pattern arranged on an overall slightly yellowish transparent film. This can be used as an electromagnetic shielding film.

Example 49

An assembly including a base and a porous layer arranged thereon was prepared by the procedure of Example 1, except for using, instead of the PET film as the base, a Kapton pressure-sensitive adhesive tape (supplied by Teraoka Seisakusho Co., Ltd. under the trade name of "650R#25 (with a release film)," including Kapton 25 μm thick and a pressure-sensitive adhesive 25 μm thick), and for carrying out casting under a condition of a gap between the film applicator and the Kapton pressure-sensitive adhesive tape base of 51 μm. The resulting porous layer had a thickness of about 20 μm, and the assembly had a total thickness of about 45 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 1.0 μm, was substantially homogenous inside thereof, and contained entirely dispersed continuous micropores with an average pore diameter of about 1.0 μm. The porous layer had an internal porosity of 70%.

Example A1

A material composition for film formation was prepared by adding 30 parts by weight of a polyvinylpyrrolidone (having a molecular weight of $5\times10^4$) as a water-soluble polymer to 100 parts by weight of a polyamideimide resin solution (supplied by Toyobo Co., Ltd. under the trade name of "VYLOMAX HR11NN"; having a solid content of 15 percent by weight and a solution viscosity of 20 dPa·s/25° C., in a solvent of NMP). The material composition held at 25° C. was cast, using a film applicator, onto a mesh cloth supplied by SEFAR (under the trade name of "PETEX PET 64HC," 50 μm thick) placed on a glass plate. The casting was conducted at a gap between the film applicator and the mesh cloth of 51 μm. Immediately after casting, the article was placed in a vessel and held at a temperature of 50° C. and humidity of about 100% for 4 minutes. The article was then immersed in water for coagulation, air-dried at room temperature without peeling off from the mesh cloth, and thereby yielded an assembly including the mesh cloth integrated with a porous layer. The assembly had a total thickness of about 62 μm.

The prepared assembly was subjected to a tape peeling test to find that the mesh cloth and the porous layer suffered from no interfacial delamination therebetween. This assembly was electron-microscopically observed to find that the porous layer was in intimate contact with the mesh cloth, had an average pore diameter of pores appearing in its surface of about 1.0 μm, was substantially homogenous inside thereof, and contained entirely dispersed continuous micropores with an average pore diameter of about 1.0 μm. The porous layer had an internal porosity of 70%.

Example A2

An assembly including a mesh cloth integrated with a porous layer was prepared by the procedure of Example A1, except for using a mesh cloth supplied by SEFAR under the trade name of "NYTAL NY90HC" (61 μm thick) as the mesh cloth. The assembly had a total thickness of about 70 μm.

The prepared assembly was subjected to a tape peeling test to find that the mesh cloth and the porous layer suffered from no interfacial delamination therebetween. This assembly was electron-microscopically observed to find that the porous layer was in intimate contact with the mesh cloth, had an average pore diameter of pores appearing in its surface of about 1.0 μm, was substantially homogenous inside thereof, and contained entirely dispersed continuous micropores with an average pore diameter of about 1.0 μm. The porous layer had an internal porosity of 70%.

Example A3

An assembly including a mesh cloth integrated with a porous layer was prepared by the procedure of Example A1, except for using a mesh cloth supplied by SEFAR under the trade name of "NYTAL PACF130-49" (90 μm thick) as the mesh cloth. The assembly had a total thickness of about 97 μm.

The prepared assembly was subjected to a tape peeling test to find that the mesh cloth and the porous layer suffered from no interfacial delamination therebetween. This assembly was electron-microscopically observed to find that the porous layer was in intimate contact with the mesh cloth, had an average pore diameter of pores appearing in its surface of about 1.0 μm, was substantially homogenous inside thereof, and contained entirely dispersed continuous micropores with an average pore diameter of about 1.0 μm. The porous layer had an internal porosity of 70%.

Example A4

An electromagnetic regulator was produced by subjecting the assembly prepared in Example A1 to a catalyst formation treatment according to a sensitizing-activating process. This assembly had a total thickness of about 62 μm and included a mesh cloth (PETEX PET 64HC) and a polyamideimide porous layer. Specifically, the sensitizing-activating process was conducted according to the following procedure.

A sensitizing agent was prepared as a stannous chloride solution containing 0.89 mol/m$^3$ of $SnCl_2$ and 2.4 mol/m$^3$ of HCl. Additionally, an activating agent was prepared as a palladium chloride solution containing 0.56 mol/m$^3$ of $PdCl_2$ and 12.0 mol/m$^3$ of HCl.

The assembly was immersed in the sensitizing agent for 120 seconds and rinsed with ion exchanged water. Next, the assembly was immersed in the activating agent for 60 seconds and rinsed with ion exchanged water. Thus, the surface of the assembly was treated with a catalyst (activation through formation of catalyst nuclei).

A nickel plating bath was prepared as a solution by sequentially dissolving 3 g of nickel(II) sulfate hexahydrate ($NiSO_4.6H_2O$), 1 g of sodium citrate dihydrate, and 1 g of sodium hypophosphite monohydrate in 100 ml of ion exchanged water.

As soon as the multilayer assembly after the catalyst formation was immersed in the nickel plating bath heated at 90° C., bubbles evolved and a nickel coat was deposited on the surface of the porous layer. The multilayer assembly was retrieved 10 minutes later and rinsed with ion exchanged water, followed by air drying. The nickel coat was found to selectively deposit on the porous layer surface in the multilayer assembly. Regarding the thus-obtained assembly, it is considered that a large amount of the catalyst was attached to the porous layer which had a large surface area as a result of the catalyst formation, this accelerated the deposition of nickel, and the deposited nickel was entangled with and thereby firmly fixed to the porous layer.

Example A5

An assembly including a nonwoven fabric integrated with a porous layer was prepared by the procedure of Example A1, except for using, instead of the mesh cloth, a polyester nonwoven fabric supplied by Japan Vilene Co., Ltd. under the trade name of "MF-80K" (about 100 µm thick). The assembly had a total thickness of about 127 µm.

The prepared assembly was subjected to a tape peeling test to find that the nonwoven fabric and the porous layer suffered from no interfacial delamination therebetween. This assembly was electron-microscopically observed to find that the porous layer was in intimate contact with the nonwoven fabric, had an average pore diameter of pores appearing in its surface of about 1.0 µm, was substantially homogenous inside thereof, and contained entirely dispersed continuous micropores with an average pore diameter of about 1.0 µm. The porous layer had an internal porosity of 70%.

Example A6

A material composition for film formation was prepared by mixing a poly(ether sulfone) (supplied by Sumitomo Chemical Co., Ltd. under the trade name of "SUMIKAEXCEL PES 5200P"), a polyvinylpyrrolidone (having a molecular weight of $5 \times 10^4$) as a water-soluble polymer, and NMP as a solvent in a weight ratio of poly(ether sulfone)/NMP/polyvinylpyrrolidone of 15/85/30. While holding at 25° C., this material composition was cast onto a polyester nonwoven fabric supplied by Japan Vilene Co., Ltd. under the trade name of "MF-80K" (about 100 µm thick) as a base, using a film applicator under a condition of a gap between the film applicator and the base of 102 µm. Immediately after casting, the article was placed in a vessel and held at a temperature of 50° C. and humidity of about 100% for 4 minutes. The article was then immersed in water for coagulation, air-dried at room temperature without peeling off from the base, and thereby yielded an assembly including a nonwoven fabric integrated with a porous layer. The assembly had a total thickness of about 122 µm.

The prepared assembly was subjected to a tape peeling test to find that the nonwoven fabric and the porous layer suffered from no interfacial delamination therebetween. This assembly was electron-microscopically observed to find that the porous layer was in intimate contact with the nonwoven fabric, had an average pore diameter of pores appearing in its surface of about 3.0 µm, was substantially homogenous inside thereof, and contained entirely dispersed continuous micropores with an average pore diameter of about 3.0 µm. The porous layer had an internal porosity of 70%.

Example A7

Printing with a conductive ink was carried out on an assembly according to screen printing under conditions of a printing speed of 30 mm/sec and a printing pressure of 0.1 MPa using a screen-printing plate having a line-and-space of 20 µm (L/S=20 µm/20 µm). The assembly was the assembly prepared in Example A5 [having a base/(porous layer) combination of polyester nonwoven fabric (about 100 µm)/polyamideimide and having a total thickness of about 127 µm]. The conductive ink was a silver paste supplied by Fujikura Kasei Co., Ltd. under the trade name of NANO DOTITE XA9053. A screen printing machine LS-25TVA supplied by Newlong Seimitsu Kogyo Co., Ltd. was used herein. After printing, the article was held at 180° C. for 30 minutes to cure the conductive ink to thereby form interconnections. The used ink was of a type in which silver oxide is reduced into silver by heating, and the ink was black immediately after printing but showed metallic silver luster after heating. The article was electron-microscopically observed to find that a pattern of interconnections with a line-and-space (L/S) of 20 µm/20 µm was formed.

Example A8

Pores of the polyamideimide porous layer of the circuit board prepared in Example A7 were filled with a resin according to the following procedure.

The circuit board was fixed, with a polyimide tape, to a Teflon (registered trademark) sheet (50 µm thick) which was placed on a top of a hot plate supplied by KOIKE PRECISION INSTRUMENTS Co., Ltd. (under the trade name of "MODEL HP-19U300"), and the circuit board was raised in temperature to 60° C. Additionally, a curable resin (uncured epoxy resin) was prepared as a 100:30 (by weight) mixture of Component A and Component B of an epoxy resin supplied by Huntsman Advanced Materials (two-component epoxy resin under the trade name of "Araldite 2020"). The curable resin was placed on a porous-layer side surface of the circuit board and spread overall with a fluorocarbon-resin spatula so that pores of the porous layer were fully filled with the uncured epoxy resin (curable resin). After removing excess epoxy resin with the spatula and wiping paper, the article was left stand at room temperature of about 30° C. for 10 hours to cure the epoxy resin and thereby yielded a circuit board having resin-filled pores in its porous layer.

Example A9

The assembly prepared in Example A1 was shaped to give a sample (30 mm×20 mm) having three small holes that constitute vertexes of a right triangle having sides with lengths of 8 to 30 mm. The dimensional change of the sample was evaluated by measuring the distances among the three points "a," "b," and "c." Initial distances a1, b1, and c1 were measured. Next, about 50 cc of solvent methanol was placed in a Petri dish about 100 mm in diameter, and the sample was placed therein. Ten minutes into immersion, the sample was retrieved, sandwiched between glass slides to avoid drying, and the distances a2, b2, and c2 were measured. The rates of change of "a," "b," and "c" were respectively calculated according to the following equation:

Rate of change (%) of "a" after immersion=$\{(a2-a1)/a1\} \times 100$

The rates of change of "b" and "c" were calculated by the same procedure.

The calculated rates of change of "a," "b," and "c" were all 0%, and the assembly show no dimensional change by the action of methanol, verifying that mesh clothes are very effective for maintaining dimensions (shapes).

Example A10

The procedure of Example A9 was repeated to evaluate the dimensional change of the sample, except for using ion exchanged water as the solvent.

The calculated rates of change of "a," "b," and "c" were all 0%, and the assembly show no dimensional change by the action of ion exchanged water, verifying that mesh clothes are very effective for maintaining dimensions (shapes).

Example B1

A material composition for film formation was prepared by adding 30 parts by weight of a polyvinylpyrrolidone (having a molecular weight of $5\times10^4$) as a water-soluble polymer to 100 parts by weight of a polyamideimide resin solution (supplied by Toyobo Co., Ltd. under the trade name of "VYLOMAX HR11NN"; having a solid content of 15 percent by weight and a solution viscosity of 20 dPa·s/25° C., in a solvent of NMP). While holding at 25° C., this material composition was cast onto a rough surface of a copper foil supplied by MITSUI MINING & SMELTING CO., LTD (under the trade name of "3EC-HTE," 18 μm thick) as a base, using a film applicator under a condition of a gap between the film applicator and the base of 51 μm. Immediately after casting, the article was placed in a vessel and held at a temperature of 50° C. and humidity of about 100% for 4 minutes. The article was then immersed in water for coagulation, subjected to air drying at room temperature without peeling off from the base, and thereby yielded an assembly composed of the base and a porous layer arranged thereon. The porous layer had a thickness of about 15 μm, and the assembly had a total thickness of about 33 μm.

The prepared assembly was subjected to a tape peeling test to find that the base and the porous layer suffered from no interfacial delamination therebetween. This assembly was electron-microscopically observed to find that the porous layer was in intimate contact with the copper foil, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

Example B2

An assembly including a base and a porous layer arranged thereon was prepared by the procedure of Example B1, except for using the water-soluble polymer in an amount of 10 parts by weight and carrying out casting under a condition of a gap between the film applicator and the copper foil base of 152 μm. The porous layer had a thickness of about 37 μm, and the assembly had a total thickness of about 55 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 7 μm, was substantially homogenous inside thereof, and contained entirely dispersed continuous micropores with an average pore diameter of about 7 μm. The porous layer had an internal porosity of 60%.

Example B3

An assembly including a base and a porous layer arranged thereon was prepared by the procedure of Example B1, except for using, instead of the copper foil as the base, an aluminum foil supplied by Nippon Foil Mfg. Co., Ltd. (under the trade name of "Nippaku foil," 12 μm thick) and casting the material composition onto a rough surface of the aluminum foil under a condition of a gap between the film applicator and the aluminum foil base of 89 μm. The porous layer had a thickness of about 23 μm, and the assembly had a total thickness of about 35 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

Example B4

An assembly including a base and a porous layer arranged thereon was prepared by the procedure of Example B3, except for casting the material composition onto a glossy surface of the aluminum foil base. The porous layer had a thickness of about 18 μm, and the assembly had a total thickness of about 30 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

Comparative Example B1

A porous film was prepared by the procedure of Example B1, except for using, instead of the copper foil as the base, a PET film (supplied by Teijin DuPont Films Japan Limited under the trade name of "Type S"), casting the material composition onto the PET film, then immersing the article in water for coagulation, transferring the porous film onto a rough surface of a copper foil (supplied by MITSUI MINING & SMELTING CO., LTD under the trade name of "3EC-HTE," 18 μm thick), and drying the transferred film.

The prepared assembly was subjected to a tape peeling test to find that the polyimide film and the porous layer partially suffered from interfacial delamination therebetween before the tape was peeled off at an interface with the porous layer. This is probably because the thin porous layer wrinkled when it was transferred to the copper foil base, and thereby the assembly included two or more portions containing interlayer air gaps between the porous layer and the copper foil base. This assembly was electron-microscopically observed and found that there were two or more portions where the porous layer was not in intimate contact with the copper foil base. The porous layer had an average pore diameter of pores appearing in its surface of about 0.3 μm, was substantially homogenous inside thereof, and contained entirely dispersed continuous micropores with an average pore diameter of about 0.3 μm. The porous layer had an internal porosity of 70%.

Example B5

The assembly prepared in Example B1 (having a base/ (porous layer) combination of copper foil/polyamideimide) was subjected to a heating treatment in a thermostat chamber at 270° C. for 30 minutes to thermally cross-link and thereby insolubilize the polyamideimide constituting the porous layer. Thus, chemical resistance was imparted to the porous layer. The resulting assembly had the porous layer imparted with solvent resistance as a result of heating treatment. This assembly did not dissolve in NMP even 10 minutes after immersion. In contrast, the assembly prepared in Example B1 (before heating treatment) dissolved in NMP within several seconds after immersion.

The prepared assembly was subjected to a tape peeling test to find that the tape was peeled off at an interface with the newly formed porous layer, and the base and the porous layer remained in intimate contact without interfacial delamination therebetween. This assembly was electron-microscopically observed to find that the newly formed porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The newly formed porous layer had an internal porosity of 60%.

Example B6

The assembly prepared in Example B1 [having a base/(porous layer) combination of copper foil (18 μm)/polyamideimide (15 μm)] was subjected to formation of a porous layer of polyamideimide about 15 μm thick on a side of the copper foil base of the assembly not bearing the porous layer, to give a both-sided multilayer assembly having a layer structure of (porous layer)/base/(porous layer) of polyamideimide (15 μm)/copper foil (18 μm)/polyamideimide (15 μm). This assembly had a total thickness of about 48 μm.

The prepared assembly was subjected to a tape peeling test to find that the base and the porous layer suffered from no interfacial delamination therebetween. This assembly was electron-microscopically observed to find that the porous layer was in intimate contact with the copper foil, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

Example B7

A novolak epoxy resin (supplied by Tohto Kasei Co., Ltd. under the trade name of "YDCN-701") was diluted with xylene to give a chemical-resistance improver containing 5 parts by weight of the novolak epoxy resin and 100 parts by weight of the solvent. The assembly prepared in Example B1 (having a base/(porous layer) combination of copper foil/polyamideimide) was immersed in the chemical-resistance improver for 3 minutes, then retrieved from the improver (coating composition), and air-dried. The dried assembly was fixed onto a Teflon (registered trademark) plate with a polyimide tape, and heated in a thermostat chamber at 220° C. for 30 minutes to cure the novolak epoxy resin. The obtained assembly was electron-microscopically observed to find that the porous layer was substantially homogeneous inside thereof and contained entirely distributed continuous micropores, as with the assembly prepared in Example B1.

Example B8

A fluorocarbon resin for painting supplied by Asahi Glass Co., Ltd. (under the trade name of "Lumiflon LF-200") and a polyisocyanate compound (supplied by Nippon Polyurethane Industry Co., Ltd. under the trade name of "Coronate HX") were diluted with xylene, to give a coating composition containing 0.86 part by weight of the fluorocarbon resin, 0.14 part by weight of the polyisocyanate compound, and 100 parts by weight of the solvent.

The film (assembly) bearing the porous layer, prepared in Example B1, [having a base/(porous layer) combination of copper foil/polyamideimide] was immersed in the coating composition for 3 minutes, retrieved from the coating composition, and air-dried. Next, the dried film having the porous layer was fixed onto a Teflon (registered trademark) plate with a polyimide tape, and heated in a thermostat chamber at 270° C. for 30 minutes to cure the fluorocarbon resin/polyisocyanate compound. The obtained assembly was electron-microscopically observed to find that the porous layer was substantially homogeneous inside thereof and contained entirely distributed continuous micropores, as with the assembly prepared in Example B1.

Example B9

An assembly including a base and a porous layer arranged thereon was prepared by the procedure of Example B1, except for using, instead of the copper foil supplied by MITSUI MINING & SMELTING CO., LTD as the copper foil base, a copper foil supplied by Fukuda Metal Foil & Powder Co., Ltd. (under the trade name of "RCF-T5B-18," 18 μm thick). The porous layer had a thickness of about 21 μm, and the assembly had a total thickness of about 39 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

Example B10

An assembly including a base and a porous layer arranged thereon was prepared by the procedure of Example B9, except for casting the material composition onto a rough surface of an aluminum foil as a base. The porous layer had a thickness of about 19 μm, and the assembly had a total thickness of about 37 μm.

The prepared assembly was subjected to a tape peeling test to find that the base and the porous layer suffered from no interfacial delamination therebetween. This assembly was electron-microscopically observed to find that the porous layer was in intimate contact with the base, had an average pore diameter of pores appearing in its surface of about 0.5 μm, was substantially homogenous inside thereof, and contained entirely dispersed continuous micropores with an average pore diameter of about 0.5 μm. The porous layer had an internal porosity of 60%.

(Evaluation Tests)

Folding Endurance

Folding endurance tests according to Japanese Industrial Standards (JIS) C 5016 were conducted on the assembly prepared in Example 7 [having a base/(porous layer) combination of polyimide film (25 μm)/polyamideimide (20 μm)] and the assembly prepared in Example B1 [having a base/(porous layer) combination of copper foil/polyamideimide], using a MIT Type Folding endurance tester MIT-D supplied by Toyo Seiki Seisaku-Sho, Ltd. The tests were conducted under conditions of sample dimensions of 15 mm wide and 110 mm long, a bending angle of 135 degrees, a curvature radius (R) of bending face of 0.38 mm, a bending rate of 175 cpm, and a tension of 4.9 N. The results of the tests show that any of the assemblies did not break even after 20000 bending procedures, showed high folding endurance with trace bending marks in the porous layer, and had excellent flexibility.

Transparency

The pattern of interconnections and the transparency of the porous layer of the circuit boards prepared in Examples 31 to 44 and Referential Examples 4 and 5 was visually observed and evaluated according to the following criteria. The results are shown in Table 1.

Evaluation of how the Pattern of Interconnections was Retained:

Poor: The interconnections crept and the pattern of interconnections was completely lost as a result of dissolution of the porous layer;
Good: The pattern of interconnections was maintained.
Evaluation of the Transparency of the Porous Layer:
-: The porous layer dissolved and failed to be evaluated;
Poor: The porous layer did not dissolve but became transparent little;
Fair: Part of the porous layer did not become transparent;
Good: The entire porous layer became transparent.
[Table 1]

TABLE 1

| | | Solvent mixture | | |
|---|---|---|---|---|
| | | Type (A/B) | Ratio by weight | Interconnection pattern/ transparency | Total evaluation |
| Example | 31 | NMP/water | 1/0.25 | Good/Good | Good |
| | 32 | | 1/0.5 | Good/Good | Good |
| | 33 | | 1/1 | Good/Good | Good |
| | 34 | | 1/2 | Good/Good | Good |
| | 35 | | 1/3 | Good/Good | Good |
| | 36 | | 1/4 | Good/Good | Good |
| | 37 | | 1/5 | Good/Fair | Fair |
| Referential Example | 4 | | 1/0.1 | Poor/— | Poor |
| | 5 | | 1/10 | Good/Poor | Poor |
| Example | 38 | DMAc/water | 1/2 | Good/Good | Good |
| | 39 | DMF/water | 1/2 | Good/Good | Good |
| | 40 | DMSO/water | 1/2 | Good/Good | Good |
| | 41 | NMP/THF | 1/2 | Good/Good | Good |
| | 42 | | 1/4 | Good/Good | Good |
| | 43 | NMP/acetone | 1/4 | Good/Good | Good |
| | 44 | NMP/IPA | 1/4 | Good/Good | Good |

With respect to the following Examples, measurements of the gas permeability, average pore diameter in surface, and porosity of the porous film, peeling tests with a cellophane pressure-sensitive adhesive tape, and the measurements of the contact angle were carried out according to the following procedures. The results are shown in Tables C1 to C4.

[Gas Permeability]

The gas permeability was measured by using the Gurley's Densometer supplied by YOSHIMITSU according to JIS P 8117. In the procedure, the Gurley's Densometer used is of one-tenth scale in measuring area as compared with the standard, and the measured value was converted into a standard Gurley permeability according to Appendix 1 of JIS P 8117.

[Average Pore Diameter in Surface]

Areas of pores at arbitrary 30 or more points in a surface of a sample film were measured based on electron micrographs, and the average of measured areas was defined as an average pore area Save. Assuming that the pores are completely round, the average pore area was converted into a pore diameter according to the following equation, and this was defined as an average pore diameter. As used herein the symbol "π" refers to the ratio of the circumference of a circle to its diameter.

Average pore diameter in surface=2×(Save/π)½

The porosity of a sample film was determined according to the following equation, in which V represents the volume (cm3) of the film; W represents the weight (g) of the film; and D represents the density (g/cm3) of the material for the film. Typically, the density of a polycarbonate used in Preparation Example C3 was set at 1.2 (g/cm3).

Porosity (%)=100−100×W/(V·D)

[Peeling Test with Cellophane Pressure-Sensitive Adhesive Tape]

A cellophane pressure-sensitive adhesive tape [supplied by Nichiban Co., Ltd. under the trade name of "Cellotape (registered trademark) No. 405," 24 mm wide] was attached to both sides of a sample porous film bearing interconnections (base for a circuit board), and the attached portion was traced with a roller (30 mm in diameter, with 200 gf load). Next, a 180-degree peeling was conducted at a pulling rate of 50 mm/min using a universal tensile tester [supplied by ORIENTEC Co., Ltd., under the trade name of "TENSILON RTA-500"]. This procedure is a modification of the procedure specified in JIS K 6854-2, except for carrying out peeling with a cellophane pressure-sensitive adhesive tape instead of carrying out peeling after application of an adhesive.

[Measurement of Contact Angle]

The contact angle was measured by using a contact angle meter "Drop Master 700" supplied by Kyowa Interface Science Co., Ltd. Each of test liquids (1 μl) was dropped onto a surface of a sample film, and the contact angle and radius of the droplet were measured (see FIG. 9). The test liquids were (i) distilled water (surface tension of 73 dune/cm), (ii) toluene (surface tension of 28.4 dune/cm), (iii) diethylene glycol monobutyl ether acetate (surface tension of 29.9 dune/cm/20° C.), (iv) a high-viscosity aqueous solution A [an aqueous solution containing 0.5 percent by weight of HONEST GUM (carboxymethylcellulose resin supplied by Daicel Chemical Industries, Ltd.) in distilled water], and (v) a high-viscosity aqueous solution B [an aqueous solution containing 2.0 percent by weight of HONEST GUM (carboxymethylcellulose resin supplied by Daicel Chemical Industries, Ltd.) in distilled water]. Specifically, each of the test liquids was dropped onto an air-side surface of a PAI porous film prepared in Preparation Example C1. How the contact angle θ varies depending on the elapsed time after dropping in these tests is shown in FIG. 10. Additionally, the properties of the liquids (i) to (v) and contact angles thereof upon lapses of 100 msec and 1000 msec after dropping are shown in Table 5.

Preparation Example C1

A material composition for film formation was prepared by adding 30 parts by weight of a polyvinylpyrrolidone (having a molecular weight of $5.5 \times 10^4$) as a water-soluble polymer to 100 parts by weight of a solution. This solution was a product of Toyobo Co., Ltd. under the trade name of "VYLOMAX HR11N" [polyamideimide resin (PAI) solution, having a solid content of 15 percent by weight and a solution viscosity of 20 dPa·s/25° C., in a solvent of N-methyl-2-pyrrolidone (NMP)]. While holding at 25° C., this material composition was cast onto a PET film (Type S, 100 μm thick) supplied by Teijin DuPont Films Japan Limited as a base (solid base), using a film applicator. In this procedure, the gap was controlled to give a porous film 50 µm thick. Immediately after casting, the article was placed in a vessel at a temperature of 40° C. and relative humidity of 100% and held therein for 3 minutes. The article was then immersed in water for coagulation. Next, the coagulated film was transferred onto a polypropylene nonwoven fabric as a support (having a gas permeability of less than 1 second/100 cc and a film thickness of 260 µm), and dried together with the support to give a porous film (Porous Film A).

The prepared porous film was scanning-electron-microscopically observed on its film structure and found that the porous film had an average pore diameter A1 in the air-side surface upon casting of about 1.1 µm, an average pore diameter A2 in the base-side surface of about 0.9 µm, and a ratio of A1 to A2 (A1/A2) of 1.22, was substantially homogeneous inside thereof, and contained entirely dispersed continuous micropores. The film had a porosity of 80% and showed permeation performance as measured in terms of Gurley gas permeability of 9.5 seconds.

Contact angles with respect to the prepared porous film were measured, and the results are shown in Table 5. Table 5 demonstrates that this porous film exhibits good absorptivity with respect to any of the liquids, i.e., (i) distilled water, (ii) toluene, (iii) diethylene glycol monobutyl ether acetate, (iv) high-viscosity aqueous solution A, and (v) high-viscosity aqueous solution B.

Preparation Example C2

A material composition for film formation was prepared by dissolving a poly(ether imide) (PEI) [supplied by GE Plastics Japan Ltd. under the trade name of "ULTEM 1000"] and a polyvinylpyrrolidone (having a molecular weight of $5.5 \times 10^4$) each to 17 percent by weight in solvent NMP. While holding at 25° C., this material composition was cast onto a PET film supplied by Teijin DuPont Films Japan Limited (Type S, 100 µm thick) as a base (solid base), using a film applicator. In this procedure, the gap was adjusted so as to give a porous film 50 µm thick. After casting, the article was held in an atmosphere of a temperature of 25° C. and relative humidity of 100% for 3 minutes and then immersed in water for coagulation. Next, the coagulated film was transferred to a polypropylene nonwoven fabric (having a gas permeability of less than 1 second/ 100 cc and a film thickness of 260 µm) as a support and dried together with the support to give a porous film (Porous Film B).

The prepared porous film was scanning-electron-microscopically observed on its film structure and found that the porous film had an average pore diameter A1 in the air-side surface upon casting of 3.2 µm, an average pore diameter A2 in the base-side surface of 3.5 µm, and a ratio of A1 to A2 (A1/A2) of 0.91, was substantially homogeneous inside thereof, and contained entirely dispersed continuous micropores. The film had a porosity of 70% and showed permeation performance as measured in terms of Gurley gas permeability of 7.2 seconds.

Preparation Example C3

A polycarbonate (PC) [supplied by Sumitomo Dow Limited under the trade name of "Calibre 200-3"] was dissolved in N-methyl-2-pyrrolidone (NMP) to give a 20 percent by weight solution of the polycarbonate resin. In 100 parts by weight of the solution was dissolved 20 parts by weight of a polyvinylpyrrolidone (having a molecular weight of $5.5 \times 10^4$) to give a material composition for film formation. This material composition was cast onto a PET film supplied by Teijin DuPont Films Japan Limited (Type S, 100 µm thick) as a base (solid base), using a film applicator, in which the gap was adjusted so as to give a film 50 µm thick after drying. After casting, the article was held in an atmosphere of a temperature of 25° C. and relative humidity of 100% for 3 minutes and then immersed in water for coagulation. Next, the coagulated film was transferred to a polypropylene nonwoven fabric (having a gas permeability of less than 1 second/100 cc and a film thickness of 260 µm) as a support and dried together with the support to give a porous film (Porous Film C).

The prepared porous film was scanning-electron-microscopically observed on its film structure and found that the porous film had an average pore diameter A1 in the air-side surface upon casting of 2.4 µm, an average pore diameter A2 in the base-side surface of 3.3 µm, and a ratio of A1 to A2 (A1/A2) of 0.73, was substantially homogeneous inside thereof, and contained entirely dispersed continuous micropores. The film had a porosity of 70% and showed permeation performance as measured in terms of Gurley gas permeability of 11.2 seconds.

Preparation Example C4

A porous film (Porous Film D) having a thickness after drying of 50 µm was prepared by the procedure of Preparation Example C1, except for using the polyvinylpyrrolidone in an amount of 40 parts by weight.

The prepared porous film was scanning-electron-microscopically observed on its film structure and found that the porous film had an average pore diameter A1 in the air-side surface upon casting of 0.2 µm, was substantially homogeneous inside thereof, and contained entirely dispersed continuous micropores. The film had a porosity of 80%.

Preparation Example C5

A porous film (Porous Film E) having a thickness after drying of 50 µm was prepared by the procedure of Preparation Example C2, except for using the polyvinylpyrrolidone in an amount of 25 percent by weight.

The prepared porous film was scanning-electron-microscopically observed on its film structure and found that the porous film had an average pore diameter A1 in the air-side surface upon casting of 2 µm, was substantially homogeneous inside thereof, and contained entirely dispersed continuous micropores. The film had a porosity of 70%.

Preparation Example C6

A porous film (Porous Film F) having a thickness after drying of 50 µm was prepared by the procedure of Preparation Example C2, except for using the polyvinylpyrrolidone in an amount of 12 percent by weight.

The prepared porous film was scanning-electron-microscopically observed on its film structure and found that the porous film had an average pore diameter A1 in the air-side surface upon casting of 6 µm, was substantially homogeneous inside thereof, and contained entirely dispersed continuous micropores. The film had a porosity of 70%.

Example C1

Printing with a conductive ink [supplied by ULVAC Materials, Inc. under the trade name of "Ag Nano-metal Ink Ag1TeH"] was conducted through ink-jet (IJ) printing on Porous Film A prepared in Preparation Example C1. Initially, one dot (30 pl) was printed, and the average diameter (average of major axis and minor axis in the case of an ellipse) of the printed dot was determined and found to be 120 μm. Next, printing was conducted to form a shape shown in FIG. 7, in which two 5-mm squares (pads) 4 arranged in parallel, and midpoints of facing sides of the two squares are connected via a line 5 having a length of 10 mm. The line was depicted by printing one row of dots at intervals of half of the average diameter (60 μm). The line width was 130 μm.

After printing, the article was held at 200° C. for 30 minutes to cure the conductive ink to thereby form an interconnection. The conductivity of the interconnection was measured in the following manner.

A conductive adhesive copper wire was brought into contact with the pads 4 at both ends in FIG. 7, a voltage of 2 V was applied thereto, a current was detected, and the resistance (Ω) was calculated based on the current.

As a result, the interconnection had a conductivity of 45Ω. Next, this interconnection was subjected to a peeling test with a cellophane pressure-sensitive adhesive tape and found that the pressure-sensitive adhesive tape peeled off but the interconnection was not lost. The conductivity of the interconnection was measured again after the peeling test to find to be 47Ω.

Example C2

Printing with a conductive ink [supplied by ULVAC Materials, Inc. under the trade name of "Ag Nano-metal Ink Ag1TeH"] was conducted through ink-jet (IJ) printing on Porous Film B prepared in Preparation Example C2. Initially, one dot (30 pl) was printed, and the average diameter (average of major axis and minor axis in the case of an ellipse) of the printed dot was determined and found to be 85 μm. Next, printing was conducted to form the shape shown in FIG. 7. The line was depicted by printing one row of dots at intervals of half of the average diameter (43 μm). The line width was 90 μm.

After printing, the article was held at 200° C. for 30 minutes to cure the conductive ink to thereby form an interconnection. The conductivity of the interconnection was measured by the procedure of example C1 to find to be 50Ω. Next, this interconnection was subjected to a peeling test with a cellophane pressure-sensitive adhesive tape and found that the pressure-sensitive adhesive tape peeled off but the interconnection was not lost. The conductivity of the interconnection was measured again after the peeling test to find to be 54Ω.

Example C3

Printing with a conductive ink [supplied by ULVAC Materials, Inc. under the trade name of "Ag Nano-metal Ink Ag1TeH"] was conducted through ink-jet (IJ) printing on Porous Film C prepared in Preparation Example C3. Initially, one dot (30 pl) was printed, and the average diameter (average of major axis and minor axis in the case of an ellipse) of the printed dot was determined and found to be 140 μm. Next, printing was conducted to form the shape shown in FIG. 7. The line was depicted by printing one row of dots at intervals of half of the average diameter (70 μm). The line width was 140 μm.

After printing, the article was held at 200° C. for 30 minutes to cure the conductive ink to thereby form an interconnection. The conductivity of the interconnection was measured by the procedure of example C1 to find to be 42Ω. Next, this interconnection was subjected to a peeling test with a cellophane pressure-sensitive adhesive tape and found that the pressure-sensitive adhesive tape peeled off but the interconnection was not lost. The conductivity of the interconnection was measured again after the peeling test to find to be 51Ω.

Comparative Example C1

Printing with a conductive ink [supplied by ULVAC Materials, Inc. under the trade name of "Ag Nano-metal Ink Ag1TeH"] was conducted through ink-jet (IJ) printing on a polyimide film (PI film) [supplied by DuPont-Toray Co., Ltd. under the trade name of "Kapton H," 50 μm thick]. Initially, one dot (30 pl) was printed, and the average diameter (average of major axis and minor axis in the case of an ellipse) of the printed dot was determined and found to be 170 μm. Next, printing was conducted to form the shape shown in FIG. 7. The line was depicted by printing one row of dots at intervals of half of the average diameter (85 μm). The line width was 230 μm.

After printing, the article was held at 200° C. for 30 minutes to cure the conductive ink to thereby form an interconnection. The conductivity of the interconnection was measured by the procedure of Example C1 to find to be 40Ω. Next, this interconnection was subjected to a peeling test with a cellophane pressure-sensitive adhesive tape and found that the interconnection was attached to the pressure-sensitive adhesive tape and delaminated from the polyimide film. The conductivity of the interconnection was measured again after the peeling test to find that the current was below the detection limit and immeasurable (the resistance was infinite ∞). Additionally, another peeling test was conducted by using, instead of the cellophane pressure-sensitive adhesive tape, a paper pressure-sensitive adhesive tape [supplied by Nichiban Co., Ltd. under the trade name of "Paper Pressure-sensitive Adhesive Tape No. 208," 24 mm wide] having an adhesive strength lower than that of the cellophane pressure-sensitive adhesive tape. In this test, the interconnection was also attached to the pressure-sensitive adhesive tape and delaminated from the polyimide film.

Comparative Example C2

Printing with a conductive ink [supplied by ULVAC Materials, Inc. under the trade name of "Ag Nano-metal Ink Ag1TeH"] was conducted through ink-jet (IJ) printing on a fluorocarbon resin film (ETFE film) [supplied by Daikin Industries, Ltd. under the trade name of "NEOFLON ETFE EF-0050," 50 μm thick]. Initially, one dot (30 pl) was printed, and the average diameter (average of major axis and minor axis in the case of an ellipse) of the printed dot was determined and found to be 80 μm. Next, printing was conducted to form the shape shown in FIG. 7. The line was depicted by printing one row of dots at intervals of half of the average diameter (40 μm) with a line width of 110 μm. However, the line showed crawling and had a break.

After printing, the article was held at 200° C. for 30 minutes to cure the conductive ink to thereby form an interconnection. The conductivity of the interconnection was measured by the procedure of Example C1, to find that the current was below the detection limit and immeasurable (the resistance was infinite ∞). Next, this interconnection was subjected to a peeling test with a cellophane pressure-sensitive adhesive tape and found that the interconnection was attached to the pressure-sensitive adhesive tape and delaminated from the fluorocarbon resin film. The conductivity of the interconnection was measured again after the peeling test to find that the current was below the detection limit and immeasurable (the resistance was infinite ∞). Additionally, another peeling test was conducted by using, instead of the cellophane pressure-sensitive adhesive tape, a paper pressure-sensitive adhesive tape [supplied by Nichiban Co., Ltd. under the trade name of "Paper Pressure-sensitive Adhesive Tape No. 208," 24 mm wide] having an adhesive strength lower than that of the cellophane pressure-sensitive adhesive tape. In this test, the interconnection was also attached to the pressure-sensitive adhesive tape and delaminated from the polyimide film.
[Table 2]

TABLE 2

|  |  | Example C1 | Example C2 | Example C3 | Comparative Example C1 | Comparative Example C2 |
|---|---|---|---|---|---|---|
| Base | Type | Porous Film A | Porous Film B | Porous Film C | solid film | solid film |
|  | Material | PAI | PEI | PC | PI | ETFE |
| Average pore diameter | A1 (μm) | 1.1 | 3.2 | 2.4 | — | — |
|  | A2 (μm) | 0.9 | 3.5 | 3.3 | — | — |
|  | A1/A2 (—) | 1.22 | 0.91 | 0.73 | — | — |
| Porosity | (%) | 80 | 70 | 70 | — | — |
| Thickness | (μm) | 50 | 50 | 50 | 50 | 50 |
| Size of one dot (average diameter) | (μm) | 120 | 85 | 140 | 170 | 80 |
| Dot interval | (μm) | 60 | 43 | 70 | 85 | 40 |
| Line width | (μm) | 130 | 90 | 140 | 230 | 110 |
| Before peeling test | Resistance R1 (Ω) | 45 | 50 | 42 | 40 | ∞ |
| After peeling test | Condition | no problem | no problem | no problem | interconnection delamination | interconnection delamination |
|  | Resistance R2 (Ω) | 47 | 54 | 51 | ∞ | ∞ |
| Evaluation | R2/R1 (—) | 1.04 Good | 1.08 Good | 1.21 Good | ∞ Poor | — Poor |

Example C4

Printing with a conductive ink [supplied by ULVAC Materials, Inc. under the trade name of "Ag Nano-metal Ink Ag1TeH"] was conducted through ink-jet (IJ) printing on Porous Film D prepared in Preparation Example C4.

After printing, the article was held at 200° C. for 30 minutes to cure the conductive ink to thereby form interconnections. Next, the interconnections were subjected to a peeling test with a cellophane pressure-sensitive adhesive tape and found that the pressure-sensitive adhesive tape peeled off but the interconnections were not lost.

Example C5

Printing with a conductive ink [supplied by ULVAC Materials, Inc. under the trade name of "Ag Nano-metal Ink Ag1TeH"] was conducted through ink-jet (IJ) printing on Porous Film E prepared in Preparation Example C5.

After printing, the article was held at 200° C. for 30 minutes to cure the conductive ink to thereby form interconnections. Next, the interconnections were subjected to a peeling test with a cellophane pressure-sensitive adhesive tape and found that the pressure-sensitive adhesive tape peeled off but the interconnections were not lost.

Example C6

Printing with a conductive ink [supplied by ULVAC Materials, Inc. under the trade name of "Ag Nano-metal Ink Ag1TeH"] was conducted through ink-jet (IJ) printing on Porous Film F prepared in Preparation Example C6.

After printing, the article was held at 200° C. for 30 minutes to cure the conductive ink to thereby form interconnections. Next, the interconnections were subjected to a peeling test with a cellophane pressure-sensitive adhesive tape and found that the pressure-sensitive adhesive tape peeled off but the interconnections were not lost.

Comparative Example C3

Printing with a conductive ink [supplied by ULVAC Materials, Inc. under the trade name of "Ag Nano-metal Ink Ag1TeH"] was conducted through ink-jet (IJ) printing on a polyamideimide film (PAI) [solid film having a thickness of 25 μm, an average pore diameter of 0.001 μm, and a porosity of 50%].

After printing, the article was held at 200° C. for 30 minutes to cure the conductive ink to thereby form interconnections. Next, the interconnections were subjected to a peeling test with a cellophane pressure-sensitive adhesive tape and found that the interconnections were attached to the pressure-sensitive adhesive tape and delaminated from the polyamideimide film. After the peeling test, the conductivity of the interconnections was measured to find that the current was below the detection limit and immeasurable (the resistance was infinite ∞). Additionally, another peeling test was conducted by using, instead of the cellophane pressure-sensitive adhesive tape, a paper pressure-sensitive adhesive tape [supplied by Nichiban Co., Ltd. under the trade name of "Paper Pressure-sensitive Adhesive Tape No. 208," 24 mm wide] having an adhesive strength lower than that of the cellophane pressure-sensitive adhesive tape. In this test, the interconnections were also attached to the pressure-sensitive adhesive tape and delaminated from the polyamideimide film.

Comparative Example C4

Printing with a conductive ink [supplied by ULVAC Materials, Inc. under the trade name of "Ag Nano-metal Ink Ag1TeH"] was conducted through ink-jet (IJ) printing on a polyimide film (PI film) [solid film having a thickness of 100 μm, an average pore diameter of 0.005 μm, and a porosity of 60%].

After printing, the article was held at 200° C. for 30 minutes to cure the conductive ink to thereby form interconnections. Next, the interconnections were subjected to a peeling test with a cellophane pressure-sensitive adhesive tape and found that the interconnections were attached to the pressure-sensitive adhesive tape and delaminated from the polyamideimide film. After the peeling test, the conductivity of the interconnections was measured to find that the current was below the detection limit and immeasurable (the resistance was infinite ∞). Additionally, another peeling test was conducted by using, instead of the cellophane pressure-sensitive adhesive tape, a paper pressure-sensitive adhesive tape [supplied by Nichiban Co., Ltd. under the trade name of "Paper Pressure-sensitive Adhesive Tape No. 208," 24 mm wide] having an adhesive strength lower than that of the cellophane pressure-sensitive adhesive tape. In this test, the interconnections were also attached to the pressure-sensitive adhesive tape and delaminated from the polyamideimide film.

Comparative Example C5

Printing with a conductive ink [supplied by ULVAC Materials, Inc. under the trade name of "Ag Nano-metal Ink Ag1TeH"] was conducted through ink-jet (IJ) printing on a poly(ethylene terephthalate) film (PET film) [solid film having a thickness of 25 μm, an average pore diameter of 0.008 μm, and a porosity of 60%].

After printing, the article was held at 200° C. for 30 minutes to cure the conductive ink to thereby form interconnections. Next, the interconnections were subjected to a peeling test with a cellophane pressure-sensitive adhesive tape and found that the interconnections were attached to the pressure-sensitive adhesive tape and delaminated from the polyamideimide film. After the peeling test, the conductivity of the interconnections was measured to find that the current was below the detection limit and immeasurable (the resistance was infinite ∞). Additionally, another peeling test was conducted by using, instead of the cellophane pressure-sensitive adhesive tape, a paper pressure-sensitive adhesive tape [supplied by Nichiban Co., Ltd. under the trade name of "Paper Pressure-sensitive Adhesive Tape No. 208," 24 mm wide] having an adhesive strength lower than that of the cellophane pressure-sensitive adhesive tape. In this test, the interconnections were also attached to the pressure-sensitive adhesive tape and delaminated from the polyamideimide film.

[Table 3]

Example C7

Printing with a conductive ink [silver paste supplied by Daiken Chemical Co., Ltd. under the trade name of "CA-2503"] was conducted through screen printing on Porous Film A prepared in Preparation Example C1.

Screen printing was conducted with a printing plate having a straight-line portion with a line width of 50 μm (L1) as a pattern 1. An electron-microscopically enlarged photograph of the straight-line portion at a magnification of 200 times was taken, from which the average line width (L2) in a length of 500 μm was measured to find to be 100 μm.

Additionally, another screen printing was conducted with a printing plate having a straight-line portion with a line width of 20 μm (L1) as a pattern 2, and the average line width was measured in the same manner as above to find to be 40 μm. FIG. 8(a) shows an electron micrograph of the printed surface of the printed article obtained by using the printing plate having the pattern 2, enlarged at a magnification of 200 times. FIG. 8(a) demonstrates that the print excels in printing/depicting reproducibility. FIG. 8(b) is an electron micrograph of the cross section taken along line A-A' in FIG. 8(a), enlarged at a magnification of 1000 times. FIG. 8(b) demonstrates that the resulting print excelled in stability in which the conductive ink was in intimate contact with the porous film surface.

After printing, the article was held at 100° C. for 30 minutes so as to evaporate the solvent, and held at 200° C. for 30 minutes to cure the conductive ink to thereby form interconnections. The interconnections were subjected to a peeling test with a cellophane pressure-sensitive adhesive tape and found that the pressure-sensitive adhesive tape peeled off but the interconnections were not lost.

Example C8

Printed articles having average line widths of 100 μm and 40 μm were obtained using the printing plates of pattern 1 and pattern 2, respectively, by the procedure of Example C7, except for using Porous Film B prepared in Preparation Example C2 as the porous film. The interconnections were subjected to a peeling test with a cellophane pressure-sensitive adhesive tape and found that the pressure-sensitive adhesive tape peeled off but the interconnections were not lost.

Example C9

Printed articles having average line widths of 100 μm and 40 μm were obtained using the printing plates of pattern 1 and

TABLE 3

| | | Example C4 | Example C5 | Example C6 | Com. Ex. C3 | Com. Ex. C4 | Com. Ex. C5 |
|---|---|---|---|---|---|---|---|
| Base | Type | Porous Film D | Porous Film E | Porous Film F | solid film | solid film | solid film |
| | Material | PAI | PEI | PEI | PAI | PI | PET |
| Average pore diameter | A1 (μm) | 0.2 | 2 | 6 | — | — | — |
| Porosity | (%) | 80 | 70 | 70 | — | — | — |
| Thickness | (μm) | 50 | 50 | 50 | 25 | 25 | 100 |
| Condition after peeling test | | no problem | no problem | no problem | interconnection delamination | interconnection delamination | interconnection delamination | pattern 2, respectively, by the procedure of Example C7, except for using Porous Film C prepared in Preparation Example C3 as the porous film. The interconnections were subjected to a peeling test with a cellophane pressure-sensitive adhesive tape and found that the pressure-sensitive adhesive tape peeled off but the interconnections were not lost.
[Table 4]

TABLE 4

|  |  | Example C7 | Example C8 | Example C9 |
|---|---|---|---|---|
| Base | Type | Porous film A | Porous film B | Porous film C |
|  | Material | PAI | PEI | PC |
| Pattern 1 (μm) | Line width of printing plate | 50 | 50 | 50 |
|  | Printed line width | 100 | 100 | 100 |
| Pattern 2 (μm) | Line width of printing plate | 20 | 20 | 20 |
|  | Printed line width | 40 | 40 | 40 |
| Condition after peeling test |  | no problem | no problem | no problem |

[Table 5]

TABLE 5

|  |  | (i) Water | (ii) Toluene | (iii) Diethylene glycol monobutyl ether acetate | (iv) High-viscosity aqueous solution A | (v) High-viscosity aqueous solution B |
|---|---|---|---|---|---|---|
| Viscosity | (mPa·s) | 0.854 | 0.54 | 29.9 | 38 | 700 |
| Contact angle (degree) | θ 100 | 25.4 | 18.3 | 22.5 | 32.4 | 53.8 |
|  | θ 1000 | 13.0 | 13.2 | 19.1 | 28.6 | 37.3 |
| θ 1000/θ 100 |  | 0.51 | 0.72 | 0.85 | 0.88 | 0.69 |

In addition to the above evaluations, the contact angle and droplet radius were measured, and fine-line depictability and printing/depicting reproducibility were evaluated on the following examples according to the following techniques.

[Measurements of Contact Angle and Droplet Radius]

The contact angle was measured with a contact angle meter "Drop Master 700" supplied by Kyowa Interface Science Co., Ltd. A test liquid (1 μl) was dropped onto a surface of each of sample films, and the contact angle and radius of the droplet were measured (see FIG. 9). Specifically, diethylene glycol monobutyl ether acetate as the test liquid was dropped onto a surface of each of the sample films including a PAI porous film (air-side surface) prepared in Preparation Example D1; a PEI porous film (air-side surface) prepared in Preparation Example D2; a PET film used in Comparative Example D1; and a PI film used in Comparative Example D2. In these tests, how the contact angle varies depending on the elapsed time after dropping is shown in FIG. 11, and how the droplet radius varies depending on the elapsed time after dropping is shown in FIG. 12.

[Evaluation of Fine-Line Depictability]

An electron-microscopically enlarged photograph (200 times) of a straight-line portion having a width of 10 to μm and a length of 500 μm or more was taken. The average line width (LAve), maximum line width (LMax), and minimum line width (LMin) in a length of 500 μm were measured, and the fluctuation F and standard deviation Σ were calculated according to the following Expressions (1) and (2), respectively (see FIG. 13).

$$F = (L\text{Max} - L\text{Min})/L\text{Ave} \times 100 \quad (1)=$$

$$\Sigma = \sqrt{(((L\text{Ave} - L\text{Max})^2 + (L\text{Ave} - L\text{Min})^2)/2)} \quad (2)$$

The average line width (LAve) was determined by tracing the line to a transparent film, and converting the weight of the traced line into an average line width by calculation.

[Evaluation of Printing/Depicting Reproducibility]

An electron-microscopically enlarged photograph (200 times) of a straight-line portion having a width of 10 to 1000 μm and a length of 500 μm or more was taken. The straight-line portion 500 μm long was traced to a transparent film, and the weight of the traced straight-line portion was measured and converted into an average line width (L2) by calculation. The ratio of L2 to L1 (L2/L1) was determined by dividing the average line width (L2) by the opening width (L1) of the straight-line portion of the screen-printing plate (see FIG. 14).

Preparation Example D1

A polymer solution for film formation was prepared by dissolving 35 parts by weight of a polyvinylpyrrolidone (having a molecular weight of $5.5 \times 10^4$; water-soluble polymer) in 100 parts by weight of a polyamideimide (PAI) resin solution [Toyobo Co., Ltd. under the trade name of "VYLOMAX HR11N"]. This polymer solution was cast onto a polyimide (PI) film (solid base; 25 μm thick) using a film applicator, in which the gap was adjusted so as to give a film having a thickness after drying of about 30 μm. After casting, the film was held in an atmosphere at a temperature of 25° C. and relative humidity of 100% for 3 minutes, immersed in water for coagulation, dried, and thereby yielded a porous film.

The prepared porous film was observed on its film structure and found to have an average pore diameter A1 in the air-side surface upon casting of 0.2 μm, an average pore diameter A2 in the base-side surface of 0.2 μm, and a ratio of A1 to A2 (A1/A2) of 1, demonstrating that the porous film had homogeneous pore diameters in both sides thereof. In addition, the surface and cross section of the film were scanning-electron-microscopically observed to find that the film contained dispersed micropores having homogeneous pore diameters both in its air-side surface and base-side surface, was substantially homogeneous inside thereof, and had entirely dispersed continuous micropores. The film had a porosity of 80% and a Gurley permeability of 10 seconds or less. The average pore diameter A2 and the Gurley permeability herein were measured after peeling the PAI porous film from the PI base film.

Preparation Example D2

A polymer solution for film formation was prepared by dissolving a poly(ether imide) (PEI) [supplied by GE Plastics Japan Ltd. under the trade name of "ULTEM 1000"] and a polyvinylpyrrolidone (having a molecular weight of $5.5\times10^4$; water-soluble polymer) each to 17 percent by weight in solvent N-methyl-2-pyrrolidone (NMP). This polymer solution was cast onto a poly(ethylene terephthalate) (PET) film (solid base; 100 μm thick) using a film applicator, in which the gap was adjusted so as to give a film having a thickness after drying of about 30 μm. After casting, the film was held in an atmosphere at a temperature of 25° C. and relative humidity of 100% for 10 seconds, immersed in water for coagulation, dried, and thereby yielded a porous film.

The prepared porous film was observed on its film structure and found to have an average pore diameter A1 in the air-side surface upon casting of 3.2 μm, an average pore diameter A2 in the base-side surface of 3.5 μm, and a ratio of A1 to A2 (A1/A2) of 0.91, demonstrating that the porous film had homogeneous pore diameters in both sides thereof. In addition, the surface and cross section of the film were observed under a scanning electron microscope (SEM) to find that the film contained dispersed micropores having homogeneous pore diameters both in its air-side surface and base-side surface, was substantially homogeneous inside thereof, and had entirely dispersed continuous micropores. The film had a porosity of 60% and a Gurley permeability of 10 seconds or less. The average pore diameter A2 and the Gurley permeability herein were measured after peeling the PEI porous film from the PET base film.

Example D1

Screen printing was conducted on a surface (air-side surface) of the PAI porous film prepared in Preparation Example D1 using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 47.0 μm, respectively. By substituting these values into Expression (1) and Expression (2), the fluctuation F and the standard deviation Σ were calculated to be 3% and 1.1, respectively. The enlarged photographic view of the printed surface of the printed article is shown in FIG. 15, demonstrating that a print excellent in linearity (fine-line depictability) was obtained.

Additionally, diethylene glycol monobutyl ether acetate was dropped onto a surface (air-side surface) of the PAI porous film prepared in Preparation Example D1, and a contact angle was measured to find that a contact angle upon a lapse of 300 msec after dropping was 19.5 degrees and the droplet at this time point had a radius of 1290 μm. Instead of diethylene glycol monobutyl ether acetate, were dropped water, toluene, and decanol onto the surface of the porous film, and contact angles were measured to find that the porous film showed contact angles with these liquids of 17.2 degrees, 13.7 degrees, and 25.2 degrees, respectively, upon a lapse of 300 msec after dropping. The results demonstrate that printed articles excellent in fine-line depictability are obtained even when inks containing these solvents as a main solvent are used.

Example D2

Screen printing was conducted on a surface (air-side surface) of the PAI porous film prepared in Preparation Example D1, using a pattern diagram (straight line; with a set line width of 20 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 21.2 μm, 24.2 μm, and 23.0 μm, respectively. By substituting these values into Expression (1) and Expression (2), the fluctuation F and the standard deviation Σ were calculated to be 6% and 2.5, respectively. The enlarged photographic view of the printed surface of the printed article is shown in FIG. 16, demonstrating that a print excellent in linearity (fine-line depictability) was obtained.

Example D3

Screen printing was conducted on a surface (air-side surface) of the PEI porous film prepared in Preparation Example D2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 47.0 μm, respectively. By substituting these values into Expression (1) and Expression (2), the fluctuation F and the standard deviation Σ were calculated to be 3% and 1.1, respectively. The enlarged photographic view of the printed surface of the printed article is shown in FIG. 17, demonstrating that a print excellent in linearity (fine-line depictability) was obtained.

Additionally, diethylene glycol monobutyl ether acetate was dropped onto a surface (air-side surface) of the PEI porous film prepared in Preparation Example D2, and a contact angle was measured, to find that the contact angle upon a lapse of 300 msec after dropping was 20.8 degrees and the droplet at this time point had a radius of 1340 μm. Instead of diethylene glycol monobutyl ether acetate, were dropped water, toluene, and decanol onto the surface of the porous film, and contact angles were measured to find that the porous film showed contact angles with these liquids of 17 degrees, 12 degrees, and 29.5 degrees, respectively, upon a lapse of 300 msec after dropping. The results demonstrate that printed articles excellent in fine-line depictability are obtained even when inks containing these solvents as a main solvent are used.

Example D4

Screen printing was conducted on a surface (air-side surface) of the PEI porous film prepared in Preparation Example D2, using a pattern diagram (straight line; with a set line width of 20 μm). The ink used in printing was a conductive coating material. "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 23.3 μm, 24.2 μm, and 18.2 μm, respectively. By substituting these values into Expression (1) and Expression (2), the fluctuation F and the standard deviation Σ were calculated to be 26% and 3.7, respectively. The enlarged photographic view of the printed surface of the printed article is shown in FIG. 18, demonstrating that a print excellent in linearity (fine-line depictability) was obtained.

Comparative Example D1

Screen printing was conducted on a poly(ethylene terephthalate) (PET) film [supplied by Teijin DuPont Films Japan Limited under the trade name of "Tetron S100," 100 μm thick] using a pattern diagram (straight line; with a set line width of 20 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 43.9 μm, 48.5 μm, and 33.3 μm, respectively. By substituting these values into Expression (1) and Expression (2), the fluctuation F and the standard deviation Σ were calculated to be 34% and 8.2, respectively. The enlarged photographic view of the printed surface of the printed article is shown in FIG. 19, demonstrating that only a print poor in linearity (fine-line depictability) was obtained.

Additionally, diethylene glycol monobutyl ether acetate was dropped onto a surface of the poly(ethylene terephthalate) (PET) film, and a contact angle was measured, to find that the contact angle upon a lapse of 300 msec after dropping was 14.7 degrees and the droplet at this time point had a radius of 1690 μm.

Comparative Example D2

Screen printing was conducted on a polyimide film (PI film) [supplied by DuPont-Toray Co., Ltd. under the trade name of "Kapton 100H," 25 μm thick] using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (LAve), maximum line width (LMax), and minimum line width (LMin) in a length of 500 μm were measured to find to be 65.9 μm, 83.3 μm, and 50.0 μm, respectively. By substituting these values into Expression (1) and Expression (2), the fluctuation F and the standard deviation Σ were calculated to be 51% and 16.7, respectively. The enlarged photographic view of the printed surface of the printed article is shown in FIG. 20, demonstrating that only a print poor in linearity (fine-line depictability) was obtained.

Additionally, diethylene glycol monobutyl ether acetate was dropped onto a surface of the polyimide film (PI film), and a contact angle was measured, to find that the contact angle upon a lapse of 300 msec after dropping was 12.8 degrees and the droplet at this time point had a radius of 1630 μm.

Example E1

Screen printing was conducted on a surface (air-side surface) of the PAI porous film prepared in Preparation Example D1, using a printing plate having a straight-line portion with a line width of 50 μm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 μm was measured to find to be 47.0 μm, and the ratio L2/L1 was calculated to be 0.94. The enlarged photographic view of the printed surface of the printed article is shown in FIG. 21, demonstrating that a print excellent in printing/depicting reproducibility was obtained.

Additionally, diethylene glycol monobutyl ether acetate was dropped onto a surface (air-side surface) of the PAI porous film prepared in Preparation Example D1, and a contact angle was measured, to find that the contact angle upon a lapse of 300 msec after dropping was 19.5 degrees and the droplet at this time point had a radius of 1290 μm. Instead of diethylene glycol monobutyl ether acetate, were dropped water, toluene, and decanol onto a surface of the porous film, and contact angles were measured to find to be 17.2 degrees, 13.7 degrees, and 25.2 degrees, respectively, upon a lapse of 300 sec after dropping. The results demonstrate that printed articles excellent in printing/depicting reproducibility are obtained even when inks containing these solvents as a main solvent are used.

Example E2

Screen printing was conducted on a surface (air-side surface) of the PAI porous film prepared in Preparation Example D1, using a printing plate having a straight-line portion with a line width of 20 μm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 μm was measured to find to be 21.2 μm, and the ratio L2/L1 was calculated to be 1.06. The enlarged photographic view of the printed surface of the printed article is shown in FIG. 22, demonstrating that a print excellent in printing/depicting reproducibility was obtained.

Example E3

Screen printing was conducted on a surface (air-side surface) of the PEI porous film prepared in Preparation Example D2, using a printing plate having a straight-line portion with a line width of 50 μm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 μm was measured to find to be 47.0 μm, and the ratio L2/L1 was calculated to be 0.94. The enlarged photographic view of the printed surface of the printed article is shown in FIG. 23, demonstrating that a print excellent in printing/depicting reproducibility was obtained.

Additionally, diethylene glycol monobutyl ether acetate was dropped onto a surface (air-side surface) of the PEI porous film prepared in Preparation Example D2, and a contact angle was measured, to find that the contact angle upon a lapse of 300 msec after dropping was 20.8 degrees and the droplet at this time point had a radius of 1340 µm. Instead of diethylene glycol monobutyl ether acetate, were dropped water, toluene, and decanol onto a surface of the porous film, and contact angles were measured to find to be 17 degrees, 12 degrees, and 29.5 degrees, respectively, upon a lapse of 300 msec after dropping. The results demonstrate that printed articles excellent in fine-line depictability are obtained even when inks containing these solvents as a main solvent are used.

Example E4

Screen printing was conducted on a surface (air-side surface) of the PEI porous film prepared in Preparation Example D2, using a printing plate having a straight-line portion with a line width of 20 µm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 µm was measured to find to be 23.3 µm, and the ratio L2/L1 was calculated to be 1.17. The enlarged photographic view of the printed surface of the printed article is shown in FIG. 24, demonstrating that a print excellent in printing/depicting reproducibility was obtained.

Comparative Example E1

Screen printing was conducted on a poly(ethylene terephthalate) (PET) film [supplied by Teijin DuPont Films Japan Limited under the trade name of "Tetron S100," 100 µm thick], using a printing plate having a straight-line portion with a line width of 20 µm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 µm was measured to find to be 43.9 µm, and the ratio L2/L1 was calculated to be 2.20. The enlarged photographic view of the printed surface of the printed article is shown in FIG. 25, demonstrating that only a print poor in printing/depicting reproducibility was obtained.

Additionally, diethylene glycol monobutyl ether acetate was dropped onto a surface of the poly(ethylene terephthalate) (PET) film, and a contact angle was measured to find that the contact angle upon a lapse of 300 msec after dropping was 14.7 degrees and the droplet at this time point had a radius of 1690 µm.

Comparative Example E2

Screen printing was conducted on a polyimide film (PI film) [supplied by DuPont-Toray Co., Ltd. under the trade name of "Kapton 100H," 25 µm thick], using a printing plate having a straight-line portion with a line width of 50 µm (L1). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink. An electron-microscopically enlarged photograph (200 times) of a straight-line portion of the print was taken, from which the average line width (L2) in a length of 500 µm was measured to find to be 65.9 µm, and the ratio L2/L1 was calculated to be 1.32. The enlarged photographic view of the printed surface of the printed article is shown in FIG. 26, demonstrating that only a print poor in printing/depicting reproducibility was obtained.

Additionally, diethylene glycol monobutyl ether acetate was dropped onto a surface of the polyimide film (PI film), and a contact angle was measured to find that the contact angle upon a lapse of 300 msec after dropping was 12.8 degrees and the droplet at this time point had a radius of 1630 µm.

With respect to the following examples, the adhesion was evaluated and the tensile strength was measured according to the following procedures, in addition to the above evaluations.

[Evaluation of Adhesion]

A surface of a sample printed article after evaporation of the solvent was scratched with pencils of different hardnesses, and the presence or absence of scratches on the surface and the presence or absence of peeling of the surface layer (densified layer or porous film layer) were observed in accordance with the scratch hardness (pencil method) test specified in JIS K 5600-5-4. The adhesion of the sample was evaluated according to the following criteria. A sample is preferably evaluated as "Good" at least at a pencil hardness of 6B; more preferably evaluated as "Good" at a pencil hardness of 2B; and further preferably evaluated as "Good" even at a pencil hardness of 2H.

Good: Neither scratch on the surface nor peeling of the surface layer is observed;

Poor: A scratch on the surface or peeling of the surface layer is observed.

Measurement conditions are as follows:
Angle between the pencil and the sample film: 45 degrees
Load: 750 g
Measurement temperature: 23° C.

[Measurement of Tensile Strength]

The tensile strength was measured in accordance with JIS K 7127. In the actual measurement, a universal tensile tester [supplied by ORIENTEC Co., Ltd. under the trade name of "TENSIRON RTA-500"] was used. A single porous film sample before melting was used for the measurement of F1. Additionally, another single porous film sample was placed on a peelable (releasable) support such as a Teflon (registered trademark) film, melted by heating, peeled off from the support, and subjected to the measurement of F2.

Measurement conditions are as follows:
Pulling speed: 50 mm/min
Specimen: 10-mm wide strip Preparation Example F1

A polymer solution for film formation was prepared by dissolving 35 parts by weight of a polyvinylpyrrolidone (having a molecular weight of $5.5 \times 10^4$; water-soluble polymer) in 100 parts by weight of a polyamideimide (PAI) resin solution [supplied by Toyobo Co., Ltd. under the trade name of "VYLOMAX HR11N"]. This polymer solution was cast onto a polyimide (PI) film (solid base serving as a support; 25 µm thick) using a film applicator, in which the gap was adjusted so as to give a film having a thickness after drying of about 30 µm. After casting, the film was held in an atmosphere at a temperature of 25° C. and relative humidity of 100% for 3 minutes, immersed in water for coagulation, dried, and thereby yielded an assembly including a support and a porous film arranged on the support.

The prepared porous film was observed on its film structure and found to have an average pore diameter A1 in the air-side surface upon casting of 0.2 μm, an average pore diameter A2 in the base-side surface of 0.2 μm, and a ratio of A1 to A2 (A1/A2) of 1.0, demonstrating that the porous film had homogeneous pore diameters in both sides thereof. In addition, the surface and cross section of the film were observed under a scanning electron microscope (SEM) to find that the film contained dispersed micropores having homogeneous pore diameters both in its air-side surface and base-side surface, was substantially homogeneous inside thereof, and had entirely dispersed continuous micropores. The film had a porosity of 80% and a Gurley permeability of 10 seconds or less. The average pore diameter A2 and the Gurley permeability herein were measured after peeling the PAI porous film from the PI base film.

Contact angles between a surface of the porous film layer side and water were measured to find that $\Theta A_{100}$ was 25.4 degrees, $\Theta A_{1000}$ was 13.0 degrees, and the ratio $\Theta A_{1000}/\Theta A_{100}$ was calculated to be 0.51. Additionally, diethylene glycol monobutyl ether acetate was dropped onto a surface of the porous film layer side, and a contact angle was measured to find that the contact angle upon a lapse of 300 msec after dropping was 19.5 degrees and the droplet at this time point had a radius of 1290 μm. Instead of diethylene glycol monobutyl ether acetate, were dropped water, toluene, and decanol onto a surface of the porous film, and contact angles were measured to find to be 17.2 degrees, 13.7 degrees, and 25.2 degrees, respectively, upon a lapse of 300 msec after dropping.

Preparation Example F2

A polymer solution for film formation was prepared by dissolving a poly(ether imide) (PEI) [supplied by GE Plastics Japan Ltd. under the trade name of "ULTEM 1000"] and a polyvinylpyrrolidone (having a molecular weight of $5.5 \times 10^4$; water-soluble polymer) to 13.8 percent by weight and 25.1 percent by weight, respectively, in solvent N-methyl-2-pyrrolidone (NMP). This polymer solution was cast onto a poly(ethylene terephthalate) (PET) film (solid base; 100 μm thick) using a film applicator, in which the gap was adjusted so as to give a film having a thickness after drying of about 30 μm. After casting, the film was held in an atmosphere at a temperature of 25° C. and relative humidity of 100% for 10 seconds, immersed in water for coagulation, dried, and thereby yielded an assembly including a support and a porous film arranged on the support.

The prepared porous film was observed on its film structure and found to have an average pore diameter A1 in the air-side surface upon casting of 3.2 μm, an average pore diameter A2 in the base-side surface of 3.5 μm, and a ratio of A1 to A2 (A1/A2) of 0.91, demonstrating that the porous film had homogeneous pore diameters in both sides thereof. In addition, the surface and cross section of the film were observed under a scanning electron microscope (SEM) to find that the film contained dispersed micropores having homogeneous pore diameters both in its air-side surface and base-side surface, was substantially homogeneous inside thereof, and had entirely dispersed continuous micropores. The film had a porosity of 60% and a Gurley permeability of 10 seconds or less. The average pore diameter A2 and the Gurley permeability herein were measured after peeling the PEI porous film from the PET base film.

Contact angles between a surface of the porous film layer side and water were measured to find that $\Theta A_{100}$ was 27.1 degrees, $\Theta A_{1000}$ was 9.5 degrees, and the ratio $\Theta A_{1000}/\Theta A_{100}$ was calculated to be 0.35. Additionally, diethylene glycol monobutyl ether acetate was dropped onto a surface of the porous film layer side, and a contact angle was measured to find that the contact angle upon a lapse of 300 msec after dropping was 20.8 degrees and the droplet at this time point had a radius of 1340 μm. Instead of diethylene glycol monobutyl ether acetate, were dropped water, toluene, and decanol onto a surface of the porous film, and contact angles were measured to find to be 17 degrees, 12 degrees, and 29.5 degrees, respectively, upon a lapse of 300 msec after dropping.

Preparation Example F3

A polymer solution for film formation was prepared by dissolving a polycarbonate (PC) [supplied by Sumitomo Dow Limited under the trade name of "CALIBRE 200-3"] and polyvinylpyrrolidone (having a molecular weight of $5.5 \times 10^4$; water-soluble polymer) to 15 percent by weight and 23 percent by weight, respectively, in solvent N-methyl-2-pyrrolidone (NMP). This polymer solution was cast onto a polyimide (PI) film (solid (homogeneous) base; 50 μm thick) using a film applicator, in which the gap was adjusted so as to give a film having a thickness after drying of about 30 μm. After casting, the film was held in an atmosphere at a temperature of 25° C. and relative humidity of 100% for 60 seconds, immersed in water for coagulation, dried, and thereby yielded an assembly including a support and a porous film arranged on the support.

The prepared porous film was observed on its film structure and found to have an average pore diameter A1 in the air-side surface upon casting of 2.4 μm, an average pore diameter A2 in the base-side surface of 3.3 μm, and a ratio of A1 to A2 (A1/A2) of 0.72, demonstrating that the porous film had homogeneous pore diameters in both sides thereof. In addition, the surface and cross section of the film were observed under a scanning electron microscope (SEM) to find that the film contained dispersed micropores having homogeneous pore diameters both in its air-side surface and base-side surface, was substantially homogeneous inside thereof, and had entirely dispersed continuous micropores. The film had a porosity of 70% and a Gurley permeability of 10 seconds or less. The average pore diameter A2 and the Gurley permeability herein were measured after peeling the PC porous film from the PI base film.

Contact angles between a surface of the porous film layer side and water were measured to find that $\Theta A_{100}$ was 44.3 degrees, $\Theta A_{1000}$ was 8.8 degrees, and the ratio $\Theta A_{1000}/\Theta A_{100}$ was calculated to be 0.20. Additionally, diethylene glycol monobutyl ether acetate was dropped onto a surface of the porous film layer side, and a contact angle was measured to find that the contact angle upon a lapse of 300 msec after dropping was 14.5 degrees and the droplet at this time point had a radius of 1320 μm. Instead of diethylene glycol monobutyl ether acetate, were dropped water, toluene, and decanol onto a surface of the porous film, and contact angles were measured, to find to be 18 degrees, 13 degrees, and 33.2 degrees, respectively, upon a lapse of 300 msec after dropping.

Example F1

Screen printing was conducted on a surface of the PAI porous film layer in the assembly prepared in Preparation Example F1, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of N-methyl-2-pyrrolidone (NMP) (23° C.) were dropped onto a surface of the printed porous film layer of the assembly so as to impregnate the whole area (about 4 cm$^2$) of the porous film layer with NMP. After wiping off excess NMP by lightly touching with a nonwoven fabric, the article was dried at 250° C. for 30 minutes to remove NMP.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.5 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 90.0 degrees and $\Theta B_{1000}$ was 81.5 degrees, from which the ratio $\Theta B_{1000}/\Theta B_{100}$ was calculated to be 0.91, and the ratio $\Theta A_{1000}/\Theta B_{1000}$ was calculated to be 0.15. The obtained printed article was subjected to a scratch hardness test for evaluation of adhesion to show no abnormality at pencil hardnesses of 2B and 2H, and evaluated as "Good."

Example F2

Screen printing was conducted on a surface of the PAI porous film layer in the assembly prepared in Preparation Example F1, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of a 7:3 (by weight) mixture (23° C.) of water and N-methyl-2-pyrrolidone (NMP) were dropped onto a surface of the printed porous film layer of the assembly so as to impregnate the whole area (about 4 cm$^2$) of the porous film layer. After wiping off excess water and NMP by lightly touching with a nonwoven fabric, the article was dried at 150° C. for 10 minutes to remove water and NMP.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.5 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 89.3 degrees and $\Theta B_{1000}$ was 80.4 degrees, from which the ratio $\Theta B_{1000}/\Theta B_{100}$ was calculated to be 0.90, and the ratio $\Theta A_{1000}/\Theta B_{1000}$ was calculated to be 0.16. The obtained printed article was subjected to a scratch hardness test for evaluation of adhesion to show no abnormality at pencil hardnesses of 2B and 2H, and evaluated as "Good."

Example F3

Screen printing was conducted on a surface of the PAI porous film layer in the assembly prepared in Preparation Example F1, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of a 5:5 (by weight) mixture (23° C.) of water and γ-butyrolactone (GBL) were dropped onto a surface of the printed porous film layer of the assembly so as to impregnate the whole area (about 4 cm$^2$) of the porous film layer with the mixture. After wiping off excess water and GBL by lightly touching with a nonwoven fabric, the article was dried at 200° C. for 60 minutes to remove water and GBL.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.5 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 87.0 degrees and $\Theta B_{1000}$ was 81.0 degrees, from which the ratio $\Theta B_{1000}/\Theta B_{100}$ was calculated to be 0.93, and the ratio $\Theta A_{1000}/\Theta B_{1000}$ was calculated to be 0.15. The obtained printed article was subjected to a scratch hardness test for evaluation of adhesion to show no abnormality at pencil hardnesses of 2B and 2H, and evaluated as "Good."

Comparative Example F1

Screen printing was conducted on a surface of the PAI porous film layer in the assembly prepared in Preparation Example F1, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

An electron-microscopically enlarged photograph (200 times) of a straight-line portion in the print of the printed article was taken, from which the average line width (LAve), maximum line width (LMax), and minimum line width (LMin) in a length of 500 μm were measured to find to be 47.0 μm, 48.5 μm, and 46.5 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 25.4 degrees and $\Theta B_{1000}$ was 13.0 degrees, from which the ratio $\Theta B_{1000}/\Theta B_{100}$ was calculated to be 0.51, and the ratio $\Theta A_{1000}/\Theta B_{1000}$ was calculated to be 0.96. The obtained printed article was subjected to a scratch hardness test for evaluation of adhesion, to find that the printed article was scratched at a pencil hardness of 6B, and the surface layer delaminated at a pencil hardness of 2B. The printed article was evaluated as "Poor" in either case.

Example F4

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of N-methyl-2-pyrrolidone (NMP) (23° C.) were dropped onto a surface of the printed porous film layer of the assembly so as to impregnate the whole area (about 4 cm$^2$) of the porous film layer with NMP. After wiping off excess NMP by lightly touching with a nonwoven fabric, the article was dried at 250° C. for 30 minutes to remove NMP.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.0 μm, respectively. By substituting these values into Expression (1) and Expression (2), the fluctuation F and the standard deviation Σ were calculated to be 1.3% and 5, respectively.

Contact angles of the printed surface of the printed article were measured to find that $\Theta B_{100}$ was 21.3 degrees and $\Theta B_{1000}$ was 14.4 degrees, from which the ratio $\Theta B_{1000}/\Theta B_{100}$ was calculated to be 0.68, and the ratio $\Theta A_{1000}/\Theta B_{1000}$ was calculated to be 0.66. The obtained printed article was subjected to a scratch hardness test for evaluation of adhesion, to show no abnormality at pencil hardnesses of 2B and 2H, and evaluated as "Good."

Example F5

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of dioxolane (23° C.) were dropped onto a surface of the printed porous film layer of the assembly so as to impregnate the whole area (about 4 cm$^2$) of the porous film layer. After wiping off excess dioxolane by lightly touching with a nonwoven fabric, the article was dried at 150° C. for 10 minutes to remove dioxolane.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.0 μm, respectively. By substituting these values into Expression (1) and Expression (2), the fluctuation F and the standard deviation Σ were calculated to be 1.3% and 5, respectively.

Contact angles of the printed surface of the printed article were measured to find that $\Theta B_{100}$ was 20.2 degrees and $\Theta B_{1000}$ was 15.6 degrees, from which the ratio $\Theta B_{1000}/\Theta B_{100}$ was calculated to be 0.77, and the ratio $\Theta A_{1000}/\Theta B_{1000}$ was calculated to be 0.61. The obtained printed article was subjected to a scratch hardness test for evaluation of adhesion, to show no abnormality at pencil hardnesses of 2B and 2H, and evaluated as "Good."

Comparative Example F2

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

An electron-microscopically enlarged photograph (200 times) of a straight-line portion of the print in the printed article was taken, from which the average line width (LAve), maximum line width (LMax), and minimum line width (LMin) in a length of 500 μm were measured to find to be 47.0 μm, 48.5 μm, and 46.0 μm, respectively. By substituting these values into Expression (1) and Expression (2), the fluctuation F and the standard deviation Σ were calculated to be 1.3% and 5, respectively.

Contact angles of the printed surface of the printed article were measured to find that $\Theta B_{100}$ was 27.1 degrees and $\Theta B_{1000}$ was 9.5 degrees, from which the ratio $\Theta B_{1000}/\Theta B_{100}$ was calculated to be 0.35, and the ratio $\Theta A_{1000}/\Theta B_{1000}$ was calculated to be 1.00. The obtained printed article was subjected to a scratch hardness test for evaluation of adhesion, to find that the printed article was scratched at a pencil hardness of 6B, and the surface layer delaminated at a pencil hardness of 2B. The printed article was evaluated as "Poor" in either case.

Comparative Example F3

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, three drops (about 0.1 g) of isopropyl alcohol (IPA) (23° C.) were dropped onto a surface of the printed porous film layer of the assembly so as to impregnate the whole area (about 4 cm$^2$) of the porous film layer. After wiping off IPA by lightly touching with a nonwoven fabric, the article was dried at 150° C. for 10 minutes to remove IPA.

The printed surface of the printed article was electron-microscopically observed to find that a large number of pores remained as intact and no densified layer was formed. An electron-microscopically enlarged photograph (200 times) of a straight-line portion of the print was taken, from which the average line width (LAve), maximum line width (LMax), and minimum line width (LMin) in a length of 500 μm were measured to find to be 47.0 μm, 48.5 μm, and 46.0 μm, respectively. By substituting these values into Expression (1)

and Expression (2), the fluctuation F and the standard deviation Σ were calculated to be 1.3% and 5, respectively.

Contact angles of the printed surface of the printed article were measured to find that $\Theta B_{100}$ was 27.1 degrees and $\Theta B_{1000}$ was 9.5 degrees, from which the ratio $\Theta B_{1000}/\Theta B_{100}$ was calculated to be 0.35, and the ratio $\Theta A_{1000}/\Theta B_{1000}$ was calculated to be 1.00. The obtained printed article was subjected to a scratch hardness test for evaluation of adhesion, to find that the printed article was scratched at a pencil hardness of 6B, and the surface layer delaminated at a pencil hardness of 2B. The printed article was evaluated as "Poor" in either case.

Example G1

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, the printed assembly was placed in a heating oven, held at 300° C. for 30 minutes to melt the porous film layer, cooled to room temperature, and thereby solidified.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 48.0 μm, 49.5 μm, and 47.7 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 21.3 degrees and $\Theta B_{1000}$ was 14.4 degrees, from which the ratio $\Theta B_{1000}/\Theta B_{100}$ was calculated to be 0.68, and the ratio $\Theta A_{1000}/\Theta B_{1000}$ was calculated to be 0.66. The obtained printed article was subjected to a scratch hardness test for evaluation of adhesion, to show no abnormality at pencil hardnesses of 2B and 2H, and evaluated as "Good." Furthermore, the tensile strength was measured to find that F1 was 6.9 MPa and F2 was 66.1 MPa, from which the ratio F2/F1 was calculated to be 9.6.

Comparative Example G1

Screen printing was conducted on a surface of the PEI porous film in the assembly prepared in Preparation Example F2, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, the printed assembly was placed in a heating oven, held at 100° C. for 30 minutes, and cooled to room temperature.

An electron-microscopically enlarged photograph (200 times) of a straight-line portion in the print of the resulting printed article was taken, from which the average line width (LAve), maximum line width (LMax), and minimum line width (LMin) in a length of 500 μm were measured to find to be 48.3 μm, 49.1 μm, and 47.0 μm, respectively. By substituting these values into Expression (1) and Expression (2), the fluctuation F and the standard deviation Σ were calculated to be 1.1% and 4, respectively.

Contact angles of the printed surface of the printed article were measured to find that $\Theta B_{100}$ was 26.2 degrees and $\Theta B_{1000}$ was 9.2 degrees, from which the ratio $\Theta B_{1000}/\Theta B_{100}$ was calculated to be 0.35, and the ratio $\Theta A_{1000}/\Theta B_{1000}$ was calculated to be 1.03. The obtained printed article was subjected to a scratch hardness test for evaluation of adhesion, to find that the printed article was scratched at a pencil hardness of 6B, and the surface layer delaminated at a pencil hardness of 2B. In addition, the tensile strength was measured to find that F1 was 6.9 MPa and F2 was 6.9 MPa, from which the ratio F2/F1 was calculated to be 1.0.

Example G2

Screen printing was conducted on a surface of the PC porous film layer in the assembly prepared in Preparation Example F3, using a pattern diagram (straight line; with a set line width of 50 μm). The ink used in printing was a conductive coating material "CA-2503" supplied by Daiken Chemical Co., Ltd. (main solvent: diethylene glycol monobutyl ether acetate). After printing, the article was held at 100° C. for 30 minutes to dry the ink.

Next, the printed assembly was placed in a heating oven, held at 250° C. for 30 minutes to melt the porous film layer, cooled to room temperature, and thereby solidified.

The printed surface of the printed article was electron-microscopically observed to find that a large number of pores collapsed to form a densified layer. An electron-microscopically enlarged photograph (200 times) of a straight-line portion of the print was taken, from which the average line width (LAve), maximum line width (LMax), and minimum line width (LMin) in a length of 500 μm were measured to find to be 52.0 μm, 54.2 μm, and 49.8 μm, respectively. By substituting these values into Expression (1) and Expression (2), the fluctuation F and the standard deviation Σ were calculated to be 2.2% and 8, respectively.

Contact angles of the printed surface of the printed article were measured to find that $\Theta B_{100}$ was 23.3 degrees and $\Theta B_{1000}$ was 19.6 degrees, from which the ratio $\Theta B_{1000}/\Theta B_{100}$ was calculated to be 0.84, and the ratio $\Theta A_{1000}/\Theta B_{1000}$ was calculated to be 0.45. The obtained printed article was subjected to a scratch hardness test for evaluation of adhesion, to show no abnormality at pencil hardnesses of 2B and 2H, and evaluated as "Good." In addition, the tensile strength was measured to find that F1 was 9.2 MPa and F2 was 87.2 MPa, from which the ratio F2/F1 was calculated to be 9.5.

BRIEF DESCRIPTION OF DRAWINGS

In FIG. 1, (A) to (F) depict schematic cross-sectional views showing embodiments of circuit boards produced by carrying out printing with inks containing conductor particles on a surface of a porous layer (base) to form interconnections thereon; in which the inks containing conductor particles are: (A) an high-viscosity ink predominantly containing particles with particle diameters smaller than the average opening diameter in a surface layer of the porous layer; (B) a high-viscosity ink predominantly containing particles with particle diameters near to the average opening diameter in a surface layer of the porous layer; (C) a high-viscosity ink predominantly containing particles with particle diameters larger than the average opening diameter in a surface layer of the porous layer; (D) a low-viscosity ink predominantly containing particles with particle diameters smaller than the average opening diameter in a surface layer of the porous layer; (E) a low-viscosity ink predominantly containing particles with particle diameters near to the average opening diameter in a surface layer of the porous layer; and (F) a low-viscosity ink predominantly containing particles with particle diameters larger than the average opening diameter in a surface layer of the porous layer.

FIG. 2 is a schematic cross-sectional view illustrating a circuit board as an embodiment of the present invention.

FIG. 3 is a schematic cross-sectional view illustrating a circuit board as another embodiment of the present invention.

FIG. 4 is a schematic cross-sectional view illustrating a circuit board as yet another embodiment of the present invention.

FIG. 5 is a schematic cross-sectional view illustrating a circuit board as still another embodiment of the present invention.

FIG. 6 is a schematic cross-sectional view illustrating a circuit board as another embodiment of the present invention.

FIG. 7 is a diagram illustrating the shape of prints formed in Examples C1 to C6 and Comparative Examples C1 to C3.

In FIG. 8, (a) is an electron micrograph of a printed circuit board obtained in Example 7 using the pattern 2; and (b) is a cross sectional electron micrograph taken along line A-A' in (a).

FIG. 9 is a diagram to explain the contact angle and droplet radius.

FIG. 10 is a graph showing how the contact angle varies depending on the elapsed time after dropping different liquids onto a surface of the PAI porous film prepared in Preparation Example C1.

FIG. 11 is a graph showing how the contact angle varies depending on the elapsed time after dropping diethylene glycol monobutyl ether acetate onto surfaces of films, in which the films are the PAI porous film (air-side surface) prepared in Preparation Example D1, the PEI porous film (air-side surface) prepared in Preparation Example 2, the PET film used in Comparative Example D1, and the PI film used in Comparative Example 2.

FIG. 12 is a graph showing how the droplet radius varies depending on the elapsed time after dropping diethylene glycol monobutyl ether acetate onto surfaces of films, in which the films are the PAI porous film (air-side surface) prepared in Preparation Example D1, the PEI porous film (air-side surface) prepared in Preparation Example 2, the PET film used in Comparative Example D1, and the PI film used in Comparative Example D2.

FIG. 13 is an explanatory diagram illustrating how to determine the standard deviation of line width.

FIG. 14, the upper view is a diagram explaining the relation between L1 and L2 when a printing plate has a linear opening; and the lower view is a diagram explaining the relation between L1 and L2 when a printing plate has a circular opening.

FIG. 15 is an electron-microscopically enlarged photographic view of the printed article prepared in Example D1.

FIG. 16 is an electron-microscopically enlarged photographic view of the printed article prepared in Example D2.

FIG. 17 is an electron-microscopically enlarged photographic view of the printed article prepared in Example D3.

FIG. 18 is an electron-microscopically enlarged photographic view of the printed article prepared in Example D4.

FIG. 19 is an electron-microscopically enlarged photographic view of the printed article prepared in Comparative Example D1.

FIG. 20 is an electron-microscopically enlarged photographic view of the printed article prepared in Comparative Example D2.

FIG. 21 is an electron-microscopically enlarged photographic view of the printed article prepared in Example E1.

FIG. 22 is an electron-microscopically enlarged photographic view of the printed article prepared in Example E2.

FIG. 23 is an electron-microscopically enlarged photographic view of the printed article prepared in Example E3.

FIG. 24 is an electron-microscopically enlarged photographic view of the printed article prepared in Example E4.

FIG. 25 is an electron-microscopically enlarged photographic view of the printed article prepared in Comparative Example E1.

FIG. 26 is an electron-microscopically enlarged photographic view of the printed article prepared in Comparative Example E2.

FIG. 27 depicts explanatory drawings (as cross-sectional views) of respective steps of a method of producing a printed pattern, according to an embodiment of the present invention.

FIG. 28 depicts explanatory drawings (as cross-sectional views) of respective steps of a method of producing a printed pattern, according to another embodiment of the present invention.

| Reference Numerals | |
|---|---|
| 1 | porous film layer |
| 2 | conductive interconnection |
| 3 | dense layer |
| 4 | pad |
| 5 | interconnection (line) |
| 6 | support |
| 7 | print |
| 8 | solvent |
| 9 | porous layer impregnated with solvent |
| 10 | molten porous film layer |
| 11 | densified layer |

The invention claimed is:

1. A multilayer assembly having a base and a porous layer arranged on at least one surface of the base, the porous layer having a large number of continuous micropores with an average pore diameter of 0.01 to 10 μm,
wherein the multilayer assembly suffers from no interfacial delamination between the base and the porous layer when the multilayer assembly is examined in a tape peeling test wherein a 24-mm wide masking tape [Film Masking Tape No. 603 (#25)] supplied by Teraoka Seisakusho Co., Ltd. is applied to a surface of the porous layer and press-bonded to the porous layer with a roller having a diameter of 30 mm and a load of 200 gf to give a sample; and the sample is subjected to a T-peel test with a tensile tester at a peel rate of 50 mm/min,
wherein the base has a large number of through holes,
wherein the porous layer is arranged on the at least one surface of the base by casting a polymer solution onto the base, introducing the casted base into a coagulation bath, and drying,
wherein the polymer solution is a solution mixture comprising 8 to 25 percent by weight of a polymer component, 5 to 50 percent by weight of a water-soluble polymer, 0 to 10 percent by weight of water, and 30 to 82 percent by weight of a water-miscible polar solvent,
wherein the polymer component is at least one selected from the group consisting of polyimide resins, polyamideimide resins, poly(ether imide) resins, aromatic polyamide resins, and polyamide resins, and wherein the material of the base having a large number of through holes is at least one selected from the group consisting of polyimide resins, polyamideimide resins, poly(ether imide) resins, liquid crystalline polyester resins, aromatic polyamide resins, poly(ethylene terephthalate) resins, and poly(ethylene naphthalate) resins.

2. The multilayer assembly of claim 1, further comprising a coat of a chemical-resistant polymer covering the porous layer.

3. The multilayer assembly of claim 1, wherein the porous layer has a thickness of 0.1 to 100 µm.

4. The multilayer assembly of claim 1, wherein the porous layer has a porosity of 30% to 80%.

5. The multilayer assembly of claim 1, wherein the base has a thickness of 1 to 1000 µm.

6. The multilayer assembly of claim 1, wherein the base has a thickness of 1 to 300 µm.

7. The multilayer assembly of claim 1, for use as a filter, a battery separator, an electrolyte membrane for fuel cells, or a catalyst carrier.

8. The multilayer assembly of claim 1, for use as an electromagnetic regulator, a circuit board, or a radiator plate.

9. A composite material comprising the multilayer assembly of claim 1; and a metallic deposit and/or a magnetic deposit arranged on a surface of at least one porous layer constituting the multilayer assembly.

10. The composite material of claim 9, for use for use in or as a circuit board, a radiator plate, an electromagnetic regulator, a cell member, or a capacitor member.

* * * * *